(12) United States Patent
Sasaki et al.

(10) Patent No.: US 11,276,689 B2
(45) Date of Patent: Mar. 15, 2022

(54) SEMICONDUCTOR DEVICE AND AMPLIFIER MODULE

(71) Applicant: Murata Manufacturing Co., Ltd., Kyoto-fu (JP)

(72) Inventors: Kenji Sasaki, Nagaokakyo (JP); Masao Kondo, Nagaokakyo (JP); Shigeki Koya, Nagaokakyo (JP); Shinnosuke Takahashi, Nagaokakyo (JP); Yasunari Umemoto, Nagaokakyo (JP); Isao Obu, Nagaokakyo (JP); Takayuki Tsutsui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 180 days.

(21) Appl. No.: 16/820,441

(22) Filed: Mar. 16, 2020

(65) Prior Publication Data
US 2020/0303372 A1 Sep. 24, 2020

(30) Foreign Application Priority Data

Mar. 19, 2019 (JP) .............................. JP2019-051806
Sep. 18, 2019 (JP) .............................. JP2019-169766
Feb. 17, 2020 (JP) .............................. JP2020-024468

(51) Int. Cl.
*H03F 3/187* (2006.01)
*H01L 27/082* (2006.01)
(Continued)

(52) U.S. Cl.
CPC .......... *H01L 27/082* (2013.01); *H01L 29/737* (2013.01); *H03F 3/195* (2013.01); *H03F 3/213* (2013.01)

(58) Field of Classification Search
CPC ....................................................... H03F 3/187
(Continued)

(56) References Cited

U.S. PATENT DOCUMENTS 6,757,196 B1 * 6/2004 Tsao .................. G11C 16/0433
257/E27.103
9,825,156 B2 11/2017 Sasaki et al.
(Continued)

FOREIGN PATENT DOCUMENTS

CN      105655393 A    6/2016
JP      2016103540 A   6/2016
(Continued)

*Primary Examiner* — Henry Choe
(74) *Attorney, Agent, or Firm* — Studebaker & Brackett PC

(57) ABSTRACT

A semiconductor device includes two cell rows, each of which is formed of a plurality of transistor cells aligned in parallel to each other. Each of the plurality of transistor cells includes a collector region, a base region, and an emitter region that are disposed above a substrate. A plurality of collector extended wiring lines are each connected to the collector region of a corresponding one of the plurality of transistor cells and are extended in a direction intersecting an alignment direction of the plurality of transistor cells. A collector integrated wiring line connects the plurality of collector extended wiring lines to each other. A collector intermediate integrated wiring line that is disposed between the two cell rows in plan view connects the plurality of collector extended wring lines extended from the plurality of transistor cells that belong to one of the two cell rows to each other.

20 Claims, 47 Drawing Sheets

(51) Int. Cl.
*H01L 29/737* (2006.01)
*H03F 3/213* (2006.01)
*H03F 3/195* (2006.01)

(58) Field of Classification Search
USPC .................................................. 330/66, 307
See application file for complete search history.

(56) References Cited

U.S. PATENT DOCUMENTS

| | | | |
|---|---|---|---|
| 10,276,701 | B2 | 4/2019 | Sasaki et al. |
| 10,978,437 | B2* | 4/2021 | Holland .................. H03F 3/195 |
| 2016/0343837 | A1 | 11/2016 | Sasaki et al. |
| 2019/0214489 | A1 | 7/2019 | Sasaki et al. |
| 2020/0006536 | A1 | 1/2020 | Sasaki et al. |
| 2020/0303372 | A1* | 9/2020 | Sasaki ................. H01L 29/7304 |

FOREIGN PATENT DOCUMENTS

| | | |
|---|---|---|
| JP | 2018142688 A | 9/2018 |
| TW | 201622142 A | 6/2016 |

* cited by examiner

FIG. 22
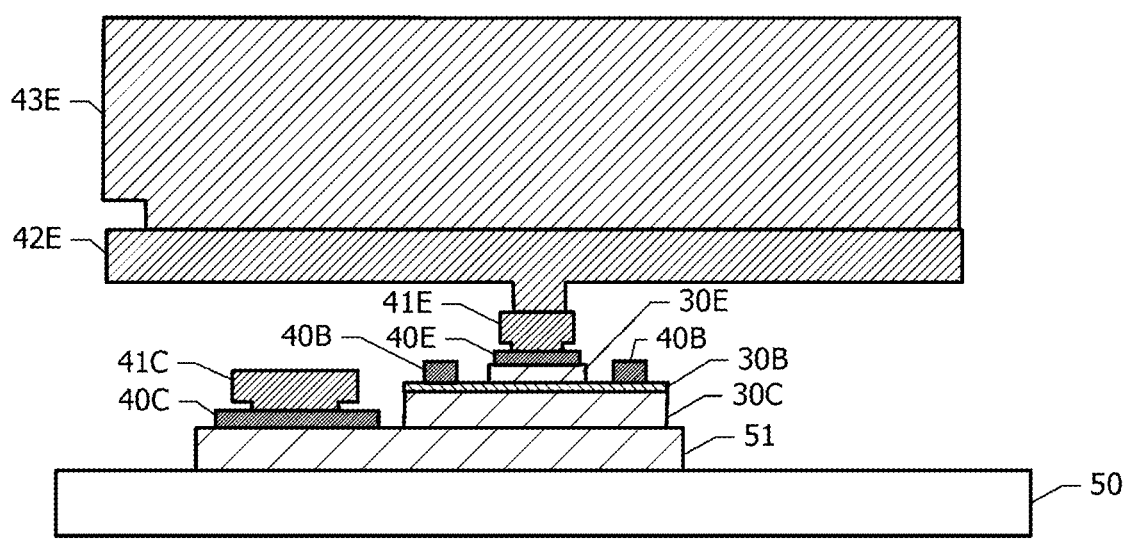
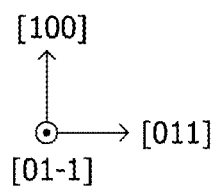

SEMICONDUCTOR DEVICE AND AMPLIFIER MODULE

CROSS-REFERENCE TO RELATED APPLICATIONS

This application claims benefit of priority to Japanese Patent Application No. 2019-051806, filed Mar. 19, 2019, to Japanese Patent Application No. 2019-169766, filed Sep. 18, 2019, and to Japanese Patent Application No. 2020-024468, filed Feb. 17, 2020, the entire content of each is incorporated herein by reference.

BACKGROUND

Technical Field

The present disclosure relates to a semiconductor device and an amplifier module.

Background Art

Heterojunction bipolar transistors (HBTs) are used for a radio-frequency (RF) power amplifying circuit. To obtain high output, a plurality of transistor cells connected in parallel to each other are used for a last-stage amplifying circuit as described, for example, in Japanese Unexamined Patent Application Publication No. 2018-142688. The plurality of transistor cells in the amplifying circuit disclosed in Japanese Unexamined Patent Application Publication No. 2018-142688 each include an emitter region that is long in one direction in plan view. The plurality of transistor cells are arranged in the width direction of the emitter regions to form cell columns. The amplifying circuit includes four cell columns disposed in parallel to each other.

A collector wiring line is disposed between two adjacent cell columns among the four cell columns and is connected to the collectors of the plurality of transistor cells in the cell columns on both sides. A pad for connecting the collectors to a module substrate or the like is disposed near one end portions of the four cell columns.

SUMMARY

To improve the performance of an amplifying circuit, it is preferable to suppress an increase in the parasitic inductance of a collector wiring line. When a plurality of transistor cells are disposed in four columns and a pad for collectors is disposed near one end portions of the four cell columns, parasitic inductance increases in the collector wiring line extending to the transistor cells disposed at the other end portions far from the pad.

Accordingly, the present disclosure provides a semiconductor device capable of suppressing an increase in the parasitic inductance of a collector wiring line connected to a plurality of transistor cells. The present disclosure also provides an amplifier module including the semiconductor device.

According to preferred embodiments of the present disclosure, there is provided a semiconductor device including a substrate; and two cell rows, each of which is formed of a plurality of transistor cells aligned in parallel to each other. Each of the plurality of transistor cells includes a collector region, a base region, and an emitter region that are disposed above the substrate. The semiconductor device further includes a plurality of collector extended wiring lines, each of which is connected to the collector region of a corresponding one of the plurality of transistor cells and that are extended in a direction intersecting an alignment direction of the plurality of transistor cells; a collector integrated wiring line that connects the plurality of collector extended wiring lines to each other; and a collector intermediate integrated wiring line that is disposed between the two cell rows in plan view and that connects the plurality of collector extended wring lines extended from the plurality of transistor cells that belong to one of the two cell rows to each other.

According to preferred embodiments of the present disclosure, there is provided an amplifier module including a semiconductor device; and a module substrate on which the semiconductor device is mounted. The semiconductor device includes a substrate; and two cell rows, each of which is formed of a plurality of transistor cells aligned in parallel to each other. Each of the plurality of transistor cells includes a collector region, a base region, and an emitter region that are disposed above the substrate. The semiconductor device further includes a plurality of collector extended wiring lines, each of which is connected to the collector region of a corresponding one of the plurality of transistor cells, and that are extended in a direction intersecting an alignment direction of the plurality of transistor cells; a collector integrated wiring line that connects the plurality of collector extended wiring lines to each other; a collector intermediate integrated wiring line that is disposed between the two cell rows in plan view and that connects the plurality of collector extended wiring lines extended from the plurality of transistor cells that belong to one of the two cell rows to each other; and at least one emitter bump disposed for one of the two cell rows and at least one emitter bump disposed for another one of the two cell rows. The module substrate includes a ground conductor connected to the emitter bumps of the semiconductor device; and a via conductor that extends from the ground conductor in a thickness direction and reaches a surface opposite to a surface provided with the ground conductor.

According to preferred embodiments of the present disclosure, there is provided a semiconductor device including a substrate; and two cell rows, each of which is formed of a plurality of transistor cells aligned in parallel to each other. Each of the plurality of transistor cells includes a collector region, a base region, and an emitter region that are disposed on the substrate. The semiconductor device further includes a plurality of collector extended wiring lines, each of which is connected to the collector region of a corresponding one of the plurality of transistor cells, and that are extended to an outside of one of the two cell rows in a direction orthogonal to an alignment direction of the plurality of transistor cells; a plurality of base extended wiring lines each of which is connected to the base region of a corresponding one of the plurality of transistor cells and that are extended to an outside of another one of the two cell rows in a direction that is orthogonal to the alignment direction of the plurality of transistor cells and that is opposite to the direction in which the plurality of collector extended wiring lines are extended; and an emitter wiring line that is disposed in a wiring layer above the plurality of base extended wiring lines and the plurality of collector extended wiring lines and that is connected to the emitter regions. The plurality of base extended wiring lines and the plurality of collector extended wiring lines that are adjacent to each other in the alignment direction of the plurality of transistor cells each have a portion, the portions being disposed at positions corresponding to each other in the direction orthogonal to the alignment direction of the plurality of transistor cells and being included in the emitter wiring line in plan view.

Use of a collector intermediate integrated wiring line enables the parasitic inductance of a collector wiring line to be reduced. In addition, as a result of disposing an emitter wiring line on a portion where collector extended wiring lines and base extended wiring lines are disposed in parallel to each other, the parasitic inductance can be reduced.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 22 is a cross-sectional view of one of the transistor cells of the semiconductor device according to the tenth embodiment;

DETAILED DESCRIPTION

First Embodiment

A semiconductor device according to a first embodiment will be described with reference to FIGS. 1 to 5.

Figure 1:
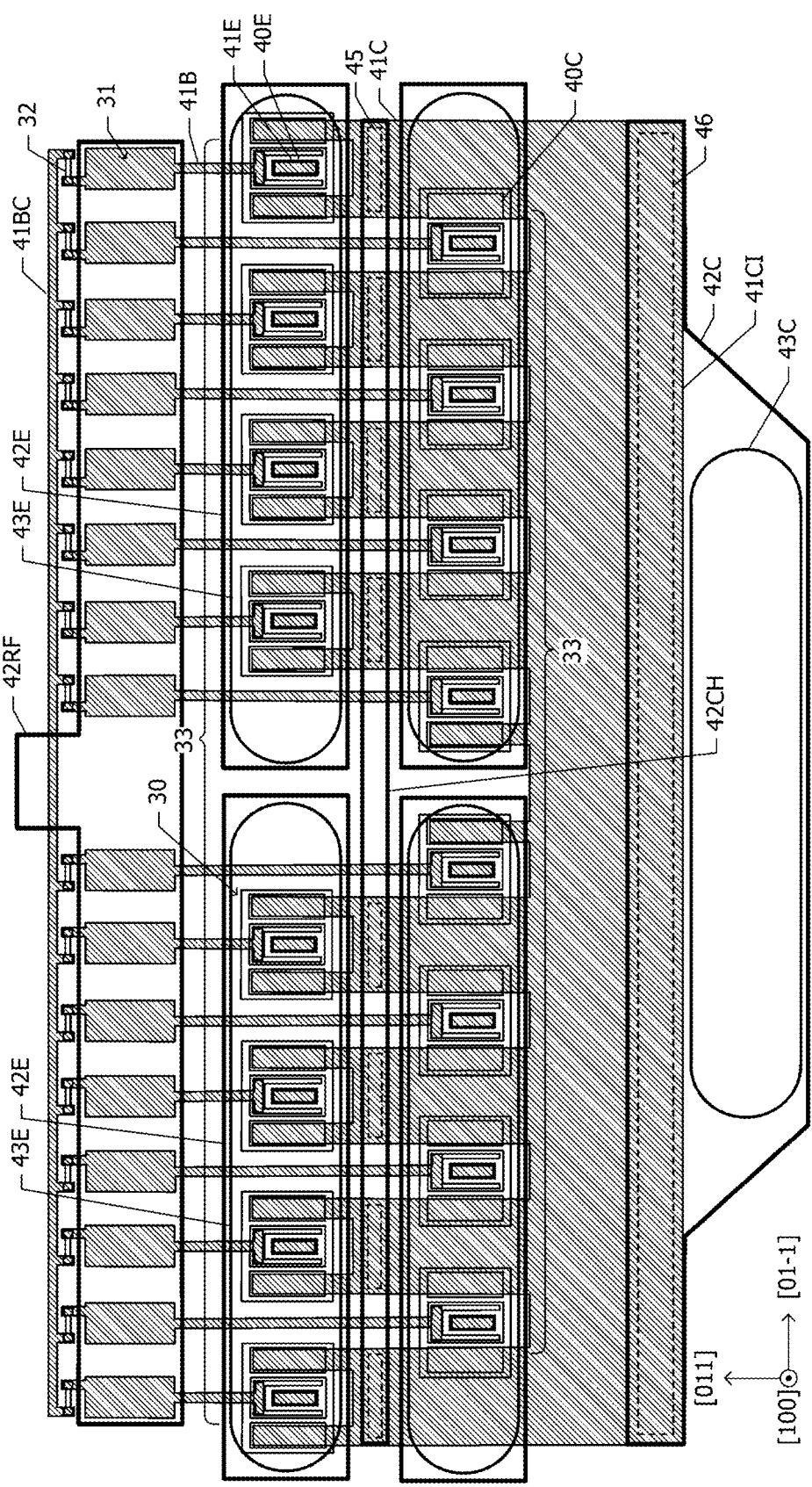
FIG. 1 is a diagram illustrating the disposition in plan view of a plurality of transistor cells, input capacitance elements, base ballast resistance elements, wiring lines, bumps, and so forth that constitute an amplifying circuit of a semiconductor device according to a first embodiment.

FIG. 1 is a diagram illustrating the disposition in plan view of a plurality of transistor cells 30, input capacitance elements 31, base ballast resistance elements 32, wiring lines, bumps, and so forth that constitute an amplifying circuit of the semiconductor device according to the first embodiment. The plurality of transistor cells 30 connected in parallel to each other are disposed on a semiconductor substrate.

Figure 2A:
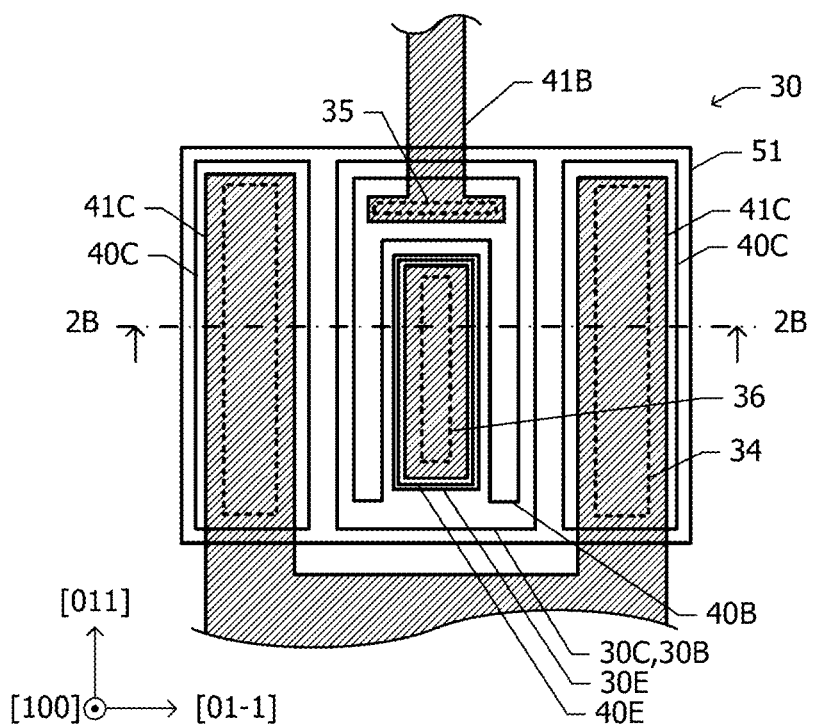
FIG. 2A is a plan view illustrating one of the transistor cells in an enlarged manner.
Figure 2B:
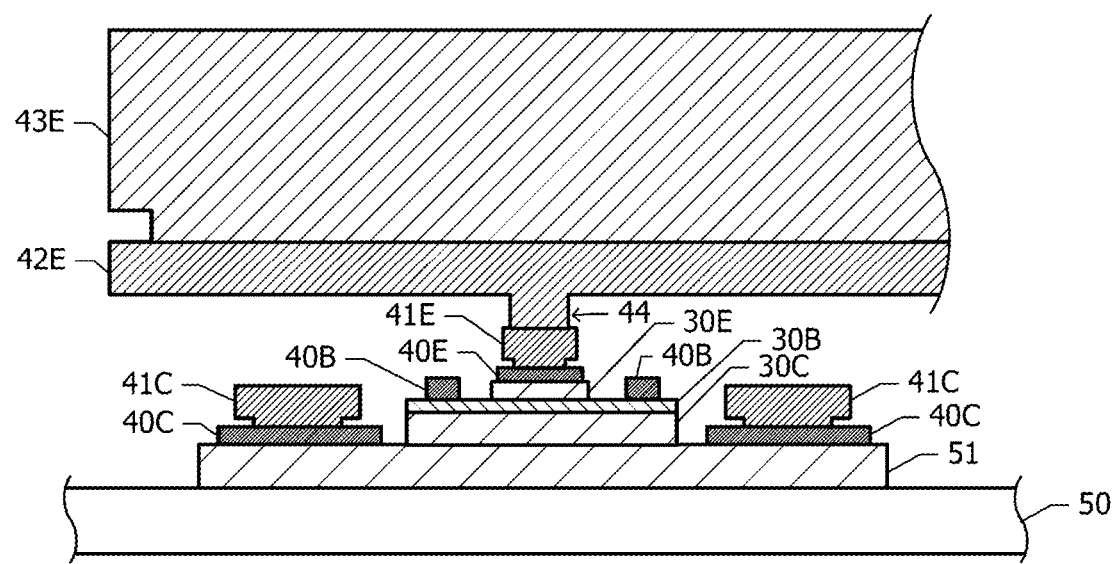
FIG. 2B is a cross-sectional view taken along a chain line 2B-2B in FIG. 2A.

FIG. 2A is a plan view illustrating one of the transistor cells 30 in an enlarged manner. FIG. 2B is a cross-sectional view taken along a chain line 2B-2B in FIG. 2A. A sub-collector layer 51 made of n-type GaAs is disposed on a substrate 50 made of semiconductor, such as semi-insulating GaAs. The substrate 50 has a surface which is a GaAs (100) plane. The sub-collector layer 51 is surrounded by an element isolation region (not illustrated) that is insulated by performing ion implantation on a part of an n-type GaAs layer grown on the entire surface of the substrate 50.

A collector region 30C formed of an n-type GaAs layer is disposed on a region of a part of the sub-collector layer 51, and a base region 30B formed of a p-type GaAs layer is disposed on the collector region 30C. An emitter region 30E made of n-type InGaP or the like is disposed on a region of a part of the base region 30B. The collector region 30C, the base region 30B, and the emitter region 30E constitute the transistor cell 30, which is a heterojunction bipolar transistor (HBT).

The emitter region 30E is long in the [011] direction (the vertical direction in FIG. 2A) of the substrate 50 in plan view. The plurality of transistor cells 30 (FIG. 1) are aligned in the [01-1] direction (the width direction of the emitter region 30E) of the substrate 50. The direction in which the plurality of transistor cells 30 are aligned will be simply referred to as an "alignment direction".

On the sub-collector layer 51, a pair of collector electrodes 40C are disposed so as to sandwich the collector region 30C in the alignment direction. The collector electrodes 40C are electrically connected to the collector region 30C via the sub-collector layer 51. In this specification, "connection" means an electrical connection unless otherwise noted. Furthermore, "connection" includes both a state of being in direct contact and a state of being electrically connected via a conductive member.

On the base region 30B, a base electrode 40B is disposed so as to sandwich the emitter region 30E in the alignment direction. The base electrode 40B is ohmically connected to the base region 30B. An emitter electrode 40E is disposed on the emitter region 30E. The emitter electrode 40E is ohmically connected to the emitter region 30E. The base electrode 40B is substantially U-shaped and surrounds the emitter region 30E and the emitter electrode 40E from three directions in plan view.

Alternatively, an n-type InGaP layer may be disposed on the entire upper surface of the base region 30B, and an emitter mesa layer may be disposed on a region of a part of the n-type InGaP layer. The emitter mesa layer includes, for example, an n-type GaAs layer and an n-type InGaAs layer disposed on the n-type GaAs layer. Of the n-type InGaP layer that covers the entire upper surface of the base region 30B, a region not covered by the emitter mesa layer is depleted and is called a ledge layer. In this configuration, the emitter mesa layer and the n-type InGaP layer immediately under the emitter mesa layer function as the emitter region 30E.

An insulating film (not illustrated) is disposed so as to cover the sub-collector layer 51, the transistor cell 30, the collector electrodes 40C, the base electrode 40B, and the emitter electrode 40E. On this insulating film, a collector extended wiring line 41C, a base extended wiring line 41B (FIG. 2A), and an emitter wiring line 41E are disposed. The collector extended wiring line 41C, the base extended wiring line 41B, and the emitter wiring line 41E are respectively connected to the collector electrodes 40C, the base electrode 40B, and the emitter electrode 40E through openings 34, 35, and 36 disposed in the insulating film. In FIGS. 1 and 2A, the collector extended wiring line 41C, the base extended wiring line 41B, and the emitter wiring line 41E, which are disposed in a wiring layer in a first layer, are hatched for easy understanding of the disposition in plan view.

The base extended wiring line 41B is extended from a portion connected to the base electrode 40B in a direction orthogonal to the alignment direction. The collector extended wiring line 41C is extended from portions connected to the collector electrodes 40C in a direction opposite to the direction in which the base extended wiring line 41B extends.

An insulating film (not illustrated) in a second layer is disposed so as to cover the collector extended wiring line 41C, the base extended wiring line 41B, and the emitter wiring line 41E. An emitter wiring line 42E in the second layer (FIGS. 1 and 2B) is disposed on the insulating film in the second layer. The emitter wiring line 42E in the second layer is connected to the emitter wiring line 41E in the first layer through an opening 44 disposed in the insulating film in the second layer. The emitter wiring line 42E in the second layer is covered by a protective film (not illustrated). The protective film has an opening that allows a part of the emitter wiring line 42E to be exposed. An emitter bump 43E is disposed on the emitter wiring line 42E exposed in the opening.

Referring back to FIG. 1, the disposition in plan view of the plurality of transistor cells 30 and so forth will be described. In FIG. 1, openings disposed in the insulating film between the wiring layer in the first layer and the wiring layer in the second layer are represented by broken lines, and openings disposed in the other insulating films or protective films are not illustrated to avoid complexity. The opening 44 (FIG. 2B) is disposed in the insulating film between the wiring layer in the first layer and the wiring layer in the second layer, but is not illustrated in FIG. 1.

The semiconductor device according to the first embodiment includes two cell rows 33 each formed of a plurality of transistor cells 30 aligned in parallel to each other. The plurality of transistor cells 30 in each cell row 33 are aligned in the width direction of the emitter electrodes 40E (the [01-1] direction). Each cell row 33 includes the same number of transistor cells 30. The plurality of transistor cells 30 in one of the cell rows 33 and the plurality of transistor cells 30 in the other cell row 33 are disposed in a staggered manner in the alignment direction. In the other cell row 33, no transistor cell 30 is disposed at a portion corresponding to a portion between two center transistor cells 30 in the one cell row 33, and the regularity of the staggered disposition is lost. However, the regularity of the staggered disposition is maintained at the other portion. About an axis (a virtual line) that is located at the portion where the regularity of the staggered disposition is lost and that is orthogonal to the alignment direction (hereinafter referred to as a symmetry axis), the disposition of the plurality of transistor cells 30 on one side and the plurality of transistor cells 30 on the other side have a mirror symmetry relationship.

On the side across the one cell row 33 (the lower cell row 33 in FIG. 1) from the other cell row 33, a collector integrated wiring line 41CI extending in the alignment direction is disposed. For example, the collector integrated wiring line 41CI is connected to all the collector extended wiring lines 41C extended from the plurality of transistor cells 30 connected in parallel to each other. The collector integrated wiring line 41CI is disposed in the wiring layer in the first layer where the collector extended wiring lines 41C are disposed. The plurality of collector extended wiring lines 41C extended from the plurality of transistor cells 30 in the cell row 33 farther from the collector integrated wiring line 41CI cross a region between the two cell rows 33 and pass through regions between the transistor cells 30 in the cell row 33 nearer to the collector integrated wiring line 41CI or regions outside the transistor cells 30 at both ends of the nearer cell row 33 to reach the collector integrated wiring line 41CI.

The collector extended wiring lines 41C overlap and are connected to the collector electrodes 40C at the portions where the collector extended wiring lines 41C pass through the regions between the transistor cells 30 in the cell row 33 nearer to the collector integrated wiring line 41CI. In this manner, the collector extended wiring lines 41C extended from the transistor cells 30 in the cell row 33 farther from the collector integrated wiring line 41CI are used in common with the collector extended wiring lines 41C of the transistor cells 30 in the cell row 33 nearer to the collector integrated wiring line 41CI.

The emitter wiring line 42E in the second layer is disposed for each cell row 33 and is disposed so as to overlap the transistor cells 30. The emitter wiring line 42E in the second layer is connected to the emitter wiring lines 41E in the first layer through the openings 44 (FIG. 2B) disposed in the insulating film covering the emitter wiring lines 41E in the first layer. The emitter wiring line 42E in the second layer is separated into two portions at the position of the symmetry axis in the alignment direction. That is, four emitter wiring lines 42E in total are disposed. In addition, four emitter bumps 43E are disposed so as to overlap the four respective emitter wiring lines 42E. That is, the emitter bump 43E corresponding to each of the two cell rows 33 is separated into two portions in the alignment direction. Each emitter bump 43E is connected to a corresponding one of the emitter wiring lines 42E through the opening disposed in the protective film covering the emitter wiring lines 42E.

A collector intermediate integrated wiring line 42CH extending in the alignment direction is disposed between the two cell rows 33. The collector intermediate integrated wiring line 42CH is disposed in the wiring layer in the second layer where the emitter wiring lines 42E are disposed. The collector intermediate integrated wiring line 42CH is connected to the plurality of collector extended wiring lines 41C through openings 45 disposed in the insulating film disposed between the wiring layer in the first layer and the wiring layer in the second layer. That is, the plurality of collector extended wiring lines 41C are connected to each other by the collector intermediate integrated wiring line 42CH. For example, the collector intermediate integrated wiring line 42CH connects the plurality of collector extended wiring lines 41C extended from respective parts of the plurality of transistor cells 30 connected in parallel to each other, between the transistor cells 30 and the collector integrated wiring line 41CI.

A collector wiring line 42C in the second layer is disposed so as to partially overlap the collector integrated wiring line 41CI. The collector wiring line 42C in the second layer is connected to the collector integrated wiring line 41CI through an opening 46 disposed in the insulating film covering the collector integrated wiring line 41CI. The collector wiring line 42C in the second layer has a portion protruding in a direction away from the cell rows 33. A collector bump 43C is disposed in the protruding portion. The collector bump 43C is connected to the collector wiring line 42C through an opening disposed in the protective film covering the collector wiring line 42C.

The plurality of input capacitance elements 31 are disposed across the two cell rows 33 from the collector integrated wiring line 41CI. The input capacitance elements 31 are disposed for the respective transistor cells 30. The plurality of input capacitance elements 31 are formed of the base extended wiring lines 41B extended from the plurality of transistor cells 30 and a radio-frequency (RF) input wiring line 42RF disposed thereon with an insulating film interposed therebetween. The RF input wiring line 42RF is long in the alignment direction in plan view and is shared among the plurality of input capacitance elements 31. The base extended wiring lines 41B each have an increased width in a region overlapping the RF input wiring line 42RF, so that an adequate capacitance is secured.

A base control wiring line 41BC extending in the alignment direction is disposed at a position across the input capacitance elements 31 from the cell rows 33. The base extended wiring lines 41B extended from the plurality of transistor cells 30 are connected to the base control wiring line 41BC via the base ballast resistance elements 32, at their ends beyond the portions intersecting the RF input wiring line 42RF. The base control wiring line 41BC and the base ballast resistance elements 32 are disposed in the wiring layer in the first layer where the base extended wiring lines 41B are disposed.

Figure 3:
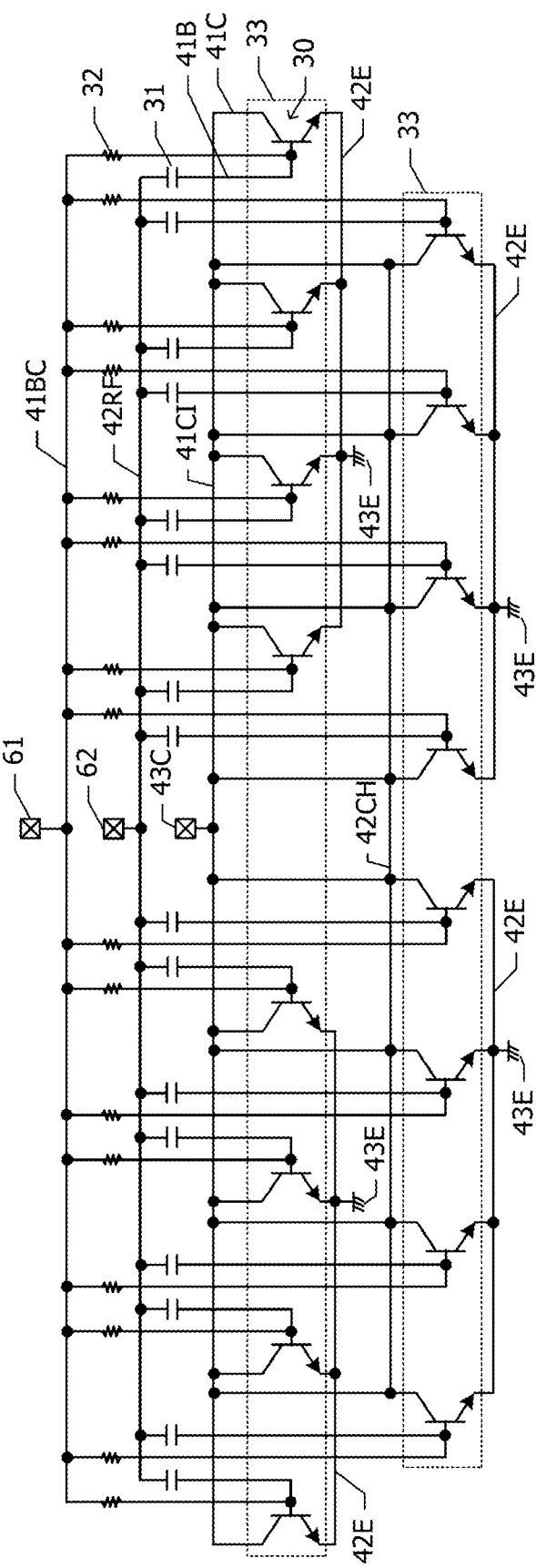
FIG. 3 is an equivalent circuit diagram of the semiconductor device according to the first embodiment.

FIG. 3 is an equivalent circuit diagram of the semiconductor device according to the first embodiment. Each of the two cell rows 33 includes eight transistor cells 30. The collector extended wiring lines 41C extended from the collectors of the plurality of transistor cells 30 are connected to the collector integrated wiring line 41CI, which is a single line. The plurality of collector extended wiring lines 41C extended from the collectors of the plurality of transistor cells 30 in the cell row 33 farther from the collector integrated wiring line 41CI are connected to each other by the collector intermediate integrated wiring line 42CH.

In units of four transistor cells 30, the emitters of the transistor cells 30 are connected to a corresponding one of the four emitter wiring lines 42E. Each of the four emitter wiring lines 42E is connected to a corresponding one of the emitter bumps 43E that are grounded.

The bases of the plurality of transistor cells 30 are connected to the RF input wiring line 42RF, which is a single line, via the base extended wiring lines 41B and the input capacitance elements 31. Furthermore, the bases of the plurality of transistor cells 30 are connected to the base control wiring line 41BC, which is a single line, via the base extended wiring lines 41B and the base ballast resistance elements 32.

A base bias voltage and a base bias current are supplied from a base control terminal 61 through the base control wiring line 41BC and the plurality of base ballast resistance elements 32 to the bases of the plurality of transistor cells 30. An RF signal is input from an RF input terminal 62 through the plurality of input capacitance elements 31 to the bases of the plurality of transistor cells 30. The collector bump 43C functions as a terminal for applying a direct-current (DC) voltage to the collectors of the plurality of transistor cells 30 and as a terminal for outputting an amplified RF signal. Here, the "terminal" includes not only a bump for connecting to an external circuit but also a connection point for connecting to another circuit in the substrate 50 (FIG. 2B).

Next, an excellent effect of the first embodiment will be described.

In the first embodiment, the collector extended wiring lines 41C are extended in the direction orthogonal to the alignment direction of the plurality of transistor cells 30, and the collector extended wiring lines 41C are connected to each other by the collector intermediate integrated wiring line 42CH between the two cell rows 33. This configuration enables the parasitic inductance between the collector bump 43C and the transistor cells 30 to be reduced. Hereinafter, a description will be given of an evaluation result in which it is confirmed that a parasitic inductance reduction effect can be obtained, with reference to FIGS. 4A to 5.

Figure 4A:
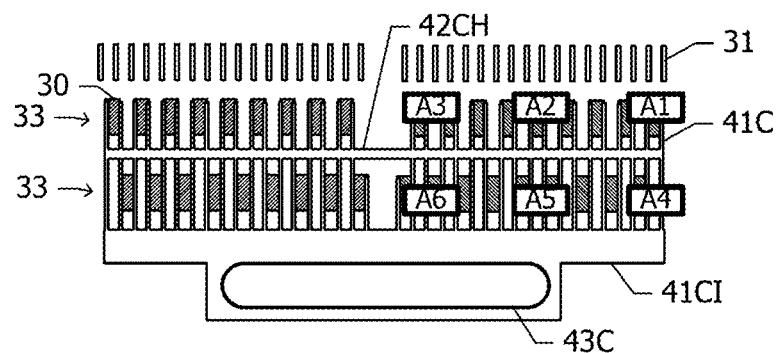
FIG. 4A is a diagram illustrating a positional relationship in plan view among transistor cells, collector extended wiring lines, a collector integrated wiring line, a collector intermediate integrated wiring line, a collector bump, and input capacitance elements of the semiconductor device according to the first embodiment.
Figure 4B:
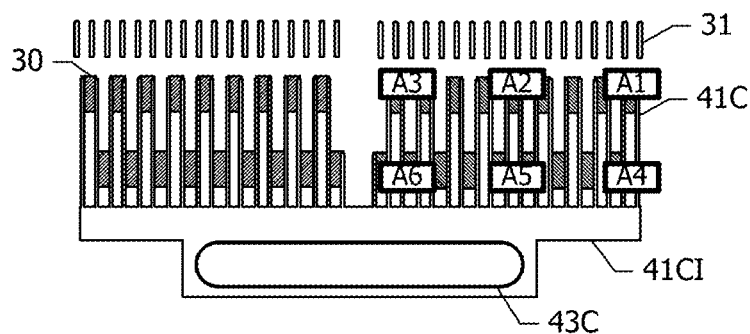
FIGS. 4B, 4C, and 4D are diagrams each illustrating a positional relationship in plan view among transistor cells, collector extended wiring lines, a collector integrated wiring line, a collector bump, and input capacitance elements of a semiconductor device according to a comparative example.
Figure 4C:
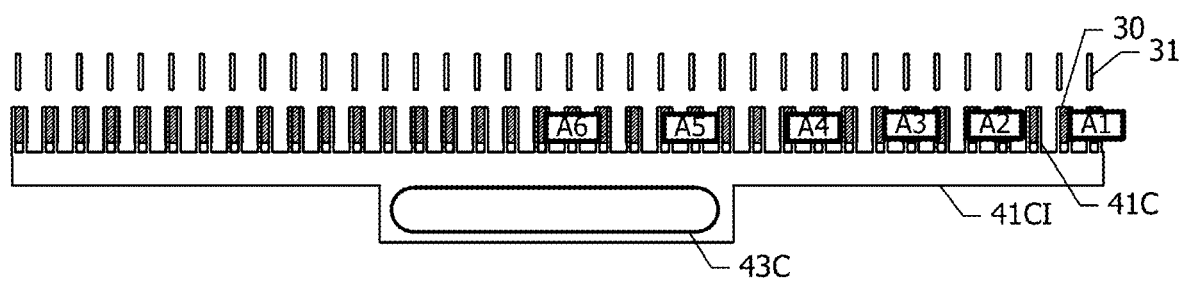
Figure 4D:
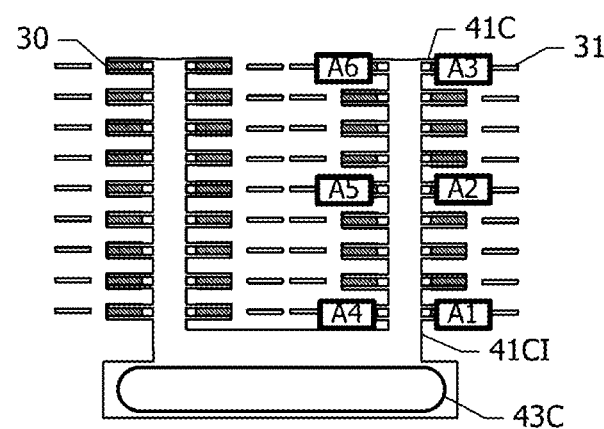

FIG. 4A is a diagram illustrating a positional relationship in plan view among the transistor cells 30, the collector extended wiring lines 41C, the collector integrated wiring line 41CI, the collector intermediate integrated wiring line 42CH, the collector bump 43C, and the input capacitance elements 31 of the semiconductor device according to the first embodiment. Each cell row 33 includes eighteen transistor cells 30. FIGS. 4B, 4C, and 4D are diagrams each illustrating a positional relationship in plan view among the transistor cells 30, the collector extended wiring lines 41C, the collector integrated wiring line 41CI, the collector bump 43C, and the input capacitance elements 31 of a semiconductor device according to a comparative example.

In the comparative example illustrated in FIG. 4B, the collector intermediate integrated wiring line 42CH (FIG. 4A) is not disposed. Other than this point, the configuration is the same as that in the first embodiment (FIG. 4A).

In the comparative example illustrated in FIG. 4C, thirty-six transistor cells 30 are disposed in one row. The collector integrated wiring line 41CI is disposed on one side of the one cell row, and the plurality of input capacitance elements 31 are disposed on the opposite side. In plan view, the collector integrated wiring line 41CI includes the collector bump 43C.

In the comparative example illustrated in FIG. 4D, four cell columns each including nine transistor cells 30 are disposed in the vertical direction. The collector integrated wiring line 41CI is disposed between the two cell columns on the right and between the two cell columns on the left, and one end portions of the two collector integrated wiring lines 41CI are coupled to each other. The collector bump 43C is disposed at this coupling portion.

In each of the first embodiment and the comparative examples illustrated in FIGS. 4A to 4D, the transistor cells 30 have the same pitch. Simulation was performed to obtain the parasitic inductances of the collector wiring lines from the collector bump 43C to evaluation points A1, A2, A3, A4, A5, and A6 in each of the semiconductor devices according to the first embodiment and the comparative examples illustrated in FIGS. 4A to 4D.

Figure 5:
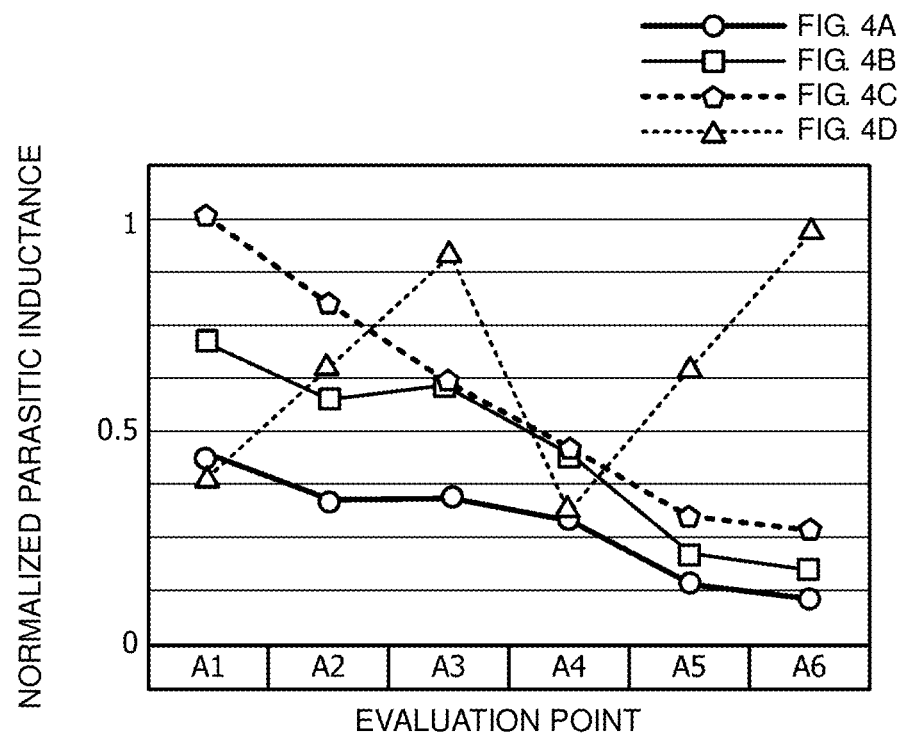
FIG. 5 is a graph illustrating calculation results of parasitic inductances at evaluation points of the semiconductor devices illustrated in FIGS. 4A to 4D.

FIG. 5 is a graph illustrating calculation results of parasitic inductances at the evaluation points A1 to A6. The horizontal axis represents the six evaluation points, and the vertical axis represents normalized parasitic inductance, with a maximum parasitic inductance being 1. In the graph in FIG. 5, circles, squares, pentagons, and triangles represent normalized parasitic inductances in the semiconductor devices illustrated in FIG. 4A, FIG. 4B, FIG. 4C, and FIG. 4D, respectively.

It is understood that the parasitic inductance decreases as the distance from the collector bump 43C to the evaluation point decreases in each case. In the semiconductor device with a single-row configuration illustrated in FIG. 4C, the parasitic inductance is large at the evaluation point A1 located at an end of the cell row. In the semiconductor device with a four-column configuration illustrated in FIG. 4D, the parasitic inductance is large at the two evaluation points A3 and A6 farthest from the collector bump 43C. As a whole, it is understood that the parasitic inductance is small in the semiconductor devices with a two-row configuration illustrated in FIGS. 4A and 4B.

Furthermore, it is understood that the parasitic inductance in the semiconductor device according to the first embodiment illustrated in FIG. 4A is smaller than the parasitic inductance in the semiconductor device according to the comparative example illustrated in FIG. 4B. This is an effect obtained by connecting the plurality of collector extended wiring lines 41C to each other by the collector intermediate integrated wiring line 42CH. In this way, as a result of connecting the plurality of collector extended wiring lines 41C to each other between the two cell rows 33, the parasitic inductance between the collector bump 43C and the transistor cells 30 can be reduced.

Next, an excellent effect about the area of a chip will be described.

A comparison between the semiconductor device according to the first embodiment illustrated in FIG. 4A and the semiconductor devices according to the comparative examples illustrated in FIGS. 4C and 4D shows that the alignment pitch of the input capacitance elements 31 of the semiconductor device according to the first embodiment is smaller than the alignment pitch of the input capacitance elements 31 of the semiconductor devices according to the comparative examples. This is because, in the first embodiment, the transistor cells 30 are disposed in two rows and the input capacitance elements 31 are disposed in one row. Thus, in a case where the plurality of transistor cells 30 are disposed at the same pitch, the area of a region occupied by an amplifying circuit on a substrate is smaller in the first embodiment than in the comparative examples.

In the first embodiment, the emitter bumps 43E (FIG. 1) are arranged in the direction orthogonal to the alignment direction. The same potential (ground potential) is applied to the two emitter bumps 43E arranged in the direction orthogonal to the alignment direction. In accordance with a design rule, the distance between the two emitter bumps 43E to which the same potential is applied may be shorter than the distance between the emitter bumps 43E and the collector bump 43C to which different potentials are applied. Thus, even when the emitter bumps 43E are arranged in the direction orthogonal to the alignment direction, an influence of an increase in dimension in the direction orthogonal to the alignment direction is reduced.

Next, an excellent effect about heat will be described with reference to FIGS. 6A to 7C. Simulation was performed to obtain an increase in temperature of the semiconductor devices according to the first embodiment and a comparative example when the semiconductor devices were operated under the same condition while being mounted on a module substrate.

Figure 6A:
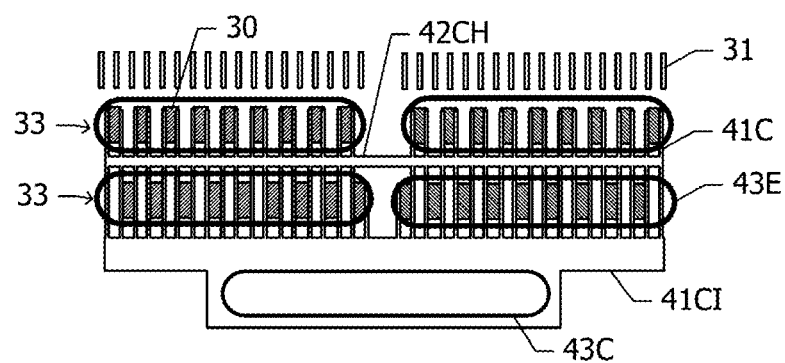
FIGS. 6A and 6B are diagrams illustrating positional relationships in plan view among transistor cells, collector extended wiring lines, a collector integrated wiring line, input capacitance elements, emitter bumps, a collector bump, and so forth of the semiconductor devices according to the first embodiment and the comparative example as a target of simulation of an increase in temperature in a state of being mounted on a module substrate.
Figure 6B:
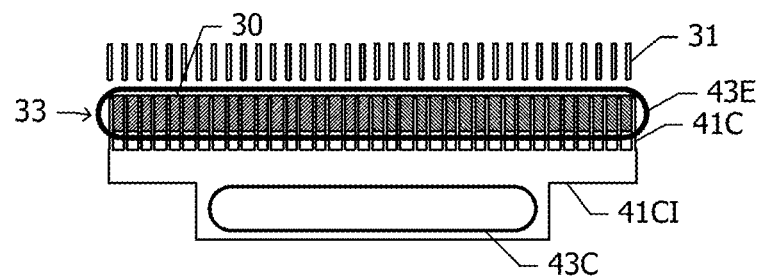

FIGS. 6A and 6B are diagrams illustrating positional relationships in plan view among the transistor cells 30, the collector extended wiring lines 41C, the collector integrated wiring line 41CI, the input capacitance elements 31, the emitter bumps 43E, the collector bump 43C, and so forth of the semiconductor devices according to the first embodiment and the comparative example as a target of the simulation. The semiconductor device according to the first embodiment illustrated in FIG. 6A is the same as the semiconductor device illustrated in FIG. 4A, and includes thirty-six transistor cells 30. The emitter bumps 43E are disposed for the respective cell rows 33 and are separated at the symmetry axis in the longitudinal direction.

The semiconductor device according to the comparative example illustrated in FIG. 6B includes one cell row 33 in which thirty-six transistor cells 30 are aligned. The pitch of the transistor cells 30 is half the pitch of the transistor cells 30 in one cell row 33 of the semiconductor device according to the first embodiment illustrated in FIG. 6A. One emitter bump 43E is disposed corresponding to the one cell row 33. The length of the one cell row 33 of the semiconductor device according to the comparative example is substantially equal to the length of each of the two cell rows 33 of the semiconductor device according to the first embodiment (FIG. 6A).

Figure 7C:
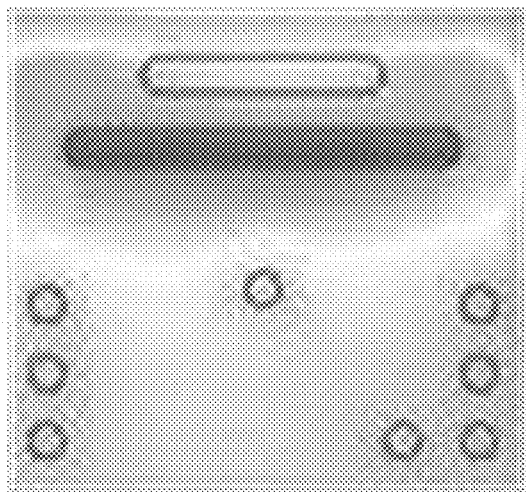
FIGS. 7B and 7C are diagrams illustrating a simulation result of an increase in temperature of the semiconductor device according to the first embodiment (FIG. 6A) and the semiconductor device according to the comparative example (FIG. 6B), respectively.
Figure 7B:
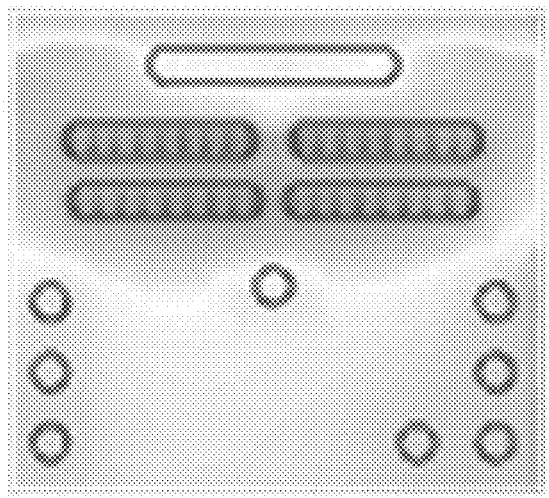
Figure 7A:
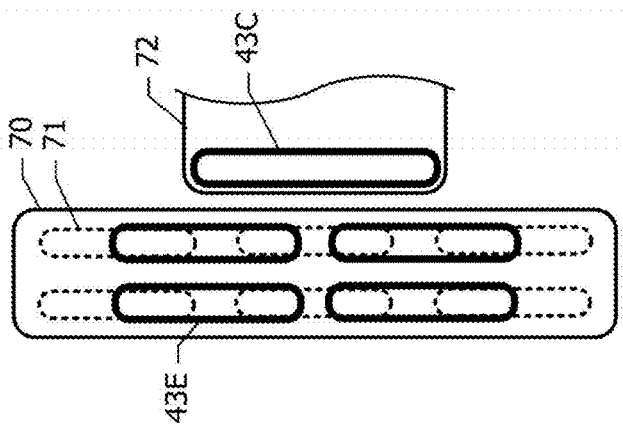
FIG. 7A is a diagram illustrating a positional relationship between a conductor pattern and via conductors of the module substrate for mounting the semiconductor device according to the first embodiment, and the emitter bumps of the semiconductor device.

FIG. 7A is a diagram illustrating a positional relationship between a conductor pattern and via conductors of the module substrate for mounting the semiconductor device according to the first embodiment, and the emitter bumps 43E of the semiconductor device. A conductor pattern 70 of the module substrate includes four emitter bumps 43E in plan view. In the module substrate, three via conductors 71 that are long in the longitudinal direction of the emitter bumps 43E are disposed for two emitter bumps 43E arranged in the alignment direction of the plurality of transistor cells 30. In plan view, the three via conductors 71 and the two emitter bumps 43E substantially overlap each other in the width direction orthogonal to the alignment direction. A conductor pattern 72 of the module substrate includes the collector bump 43C.

In the simulation of the semiconductor device according to the comparative example (FIG. 6B), the same module substrate as the module substrate for mounting the semiconductor device according to the first embodiment (FIG. 6A) was used. The pattern of the semiconductor device according to the comparative example (FIG. 6B) was designed such that the one emitter bump 43E overlaps the three via conductors 71 closer to the conductor pattern 72 of the module substrate in the width direction of the emitter bump 43E, and simulation was performed.

FIGS. 7B and 7C are diagrams illustrating a simulation result of an increase in temperature of the semiconductor device according to the first embodiment (FIG. 6A) and the semiconductor device according to the comparative example (FIG. 6B), respectively. Note that the number of transistor cells 30 of the semiconductor devices as a target of the simulation is different from the number of transistor cells 30 of the semiconductor devices illustrated in FIG. 1 and FIGS. 6A and 6B. The density of color illustrated in FIGS. 7B and 7C represents the level of temperature. A region with a relatively high temperature is represented by a relatively high density. It is understood that the temperature of the transistor cells 30 of the semiconductor device according to the comparative example (FIG. 7C) is higher than the temperature of the transistor cells 30 of the semiconductor device according to the first embodiment (FIG. 7B).

According to the simulation result, the maximum temperature of the semiconductor device according to the first embodiment is 53.47° C., whereas the maximum temperature of the semiconductor device according to the comparative example is 61.78° C. The semiconductor device and module substrate according to the first embodiment have a heat radiation path with a thermal resistance of about 14.2° C./W, whereas the semiconductor device and module substrate according to the comparative example have a heat radiation path with a thermal resistance of about 18.4° C./W. That is, the configuration of the first embodiment enables the thermal resistance of the heat radiation path from the transistor cells 30 to be reduced by about 23% compared with the comparative example. This is because, in the first embodiment, the number of cell rows is two and thus the alignment pitch of the transistor cells 30 is twice that in the comparative example.

In the first embodiment, the thermal resistance of the heat radiation path from the transistor cells 30 is reduced, and thus the maximum output of the amplifying circuit can be increased.

Next, an excellent effect about the flatness of the emitter bumps 43E will be described. In the first embodiment, the two cell rows 33 are disposed. Thus, the length of each cell row 33 is shorter than in a configuration in which the same number of transistor cells 30 are disposed in one row at the same pitch. Accordingly, the length of the emitter bump 43E disposed corresponding to the cell row 33 is also decreased. Furthermore, in the first embodiment, two separate emitter bumps 43E are disposed for each cell row 33, and thus the length of each emitter bump 43E is further decreased. As a result, the surface flatness of the emitter bumps 43E can be increased. Accordingly, it is possible to suppress a decrease in yield in the process of mounting the semiconductor device on the module substrate.

Next, a modification example of the first embodiment will be described.

In the first embodiment, eight transistor cells 30 constitute one cell row 33, but the number of transistor cells 30 constituting one cell row 33 may be other than eight. For example, as illustrated in FIG. 4A, eighteen transistor cells 30 may constitute one cell row 33. In the first embodiment, the plurality of transistor cells 30 constituting the two cell rows 33 are disposed in mirror symmetry with respect to the symmetry axis located at the center in the alignment direction. That is, the regularity of the staggered disposition of the plurality of transistor cells 30 is lost at the position of the symmetry axis. The plurality of transistor cells 30 constituting the two cell rows 33 need not necessarily be disposed in mirror symmetry. The regularity of the staggered disposition of the plurality of transistor cells 30 in one of the cell rows 33 and the plurality of transistor cells 30 in the other cell row 33 may be maintained from one end portion to the other end portion.

In the first embodiment, GaAs is used for the collectors and bases, and InGaP is used for the emitters. Alternatively, another compound semiconductor may be used. In addition, ordinary bipolar transistors may be used as the transistor cells 30.

In the first embodiment, the base extended wiring lines 41B and the collector extended wiring lines 41C are disposed in a conductive layer in the first layer. Alternatively, the base extended wiring lines 41B may be disposed in the conductive layer in the first layer, and the collector extended wiring lines 41C may be disposed in a conductive layer in the second layer. When the base extended wiring lines 41B and the collector extended wiring lines 41C are disposed in parallel to each other, the coupling therebetween causes mutual interference between an input signal and an output signal. When the conductive layer in which the base extended wiring lines 41B are disposed is different from the conductive layer in which the collector extended wiring lines 41C are disposed, the coupling therebetween can be weakened, and mutual interference between an input signal and an output signal can be suppressed.

Second Embodiment

Next, a semiconductor device according to a second embodiment will be described with reference to FIGS. 8 and 9. Hereinafter, the description of the same components as those of the semiconductor device according to the first embodiment (FIGS. 1, 2A, 2B, and 3) will be omitted.

Figure 8:
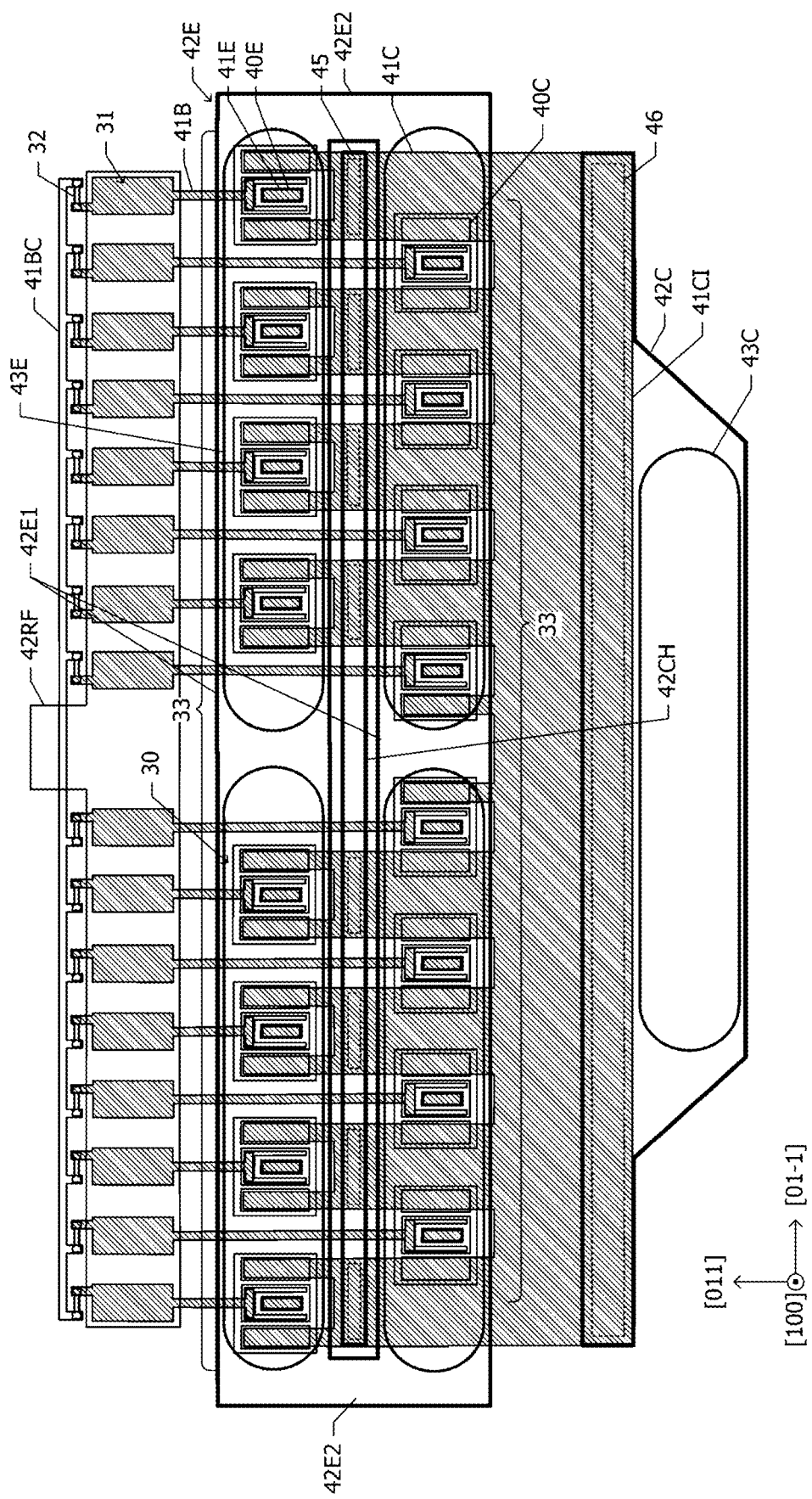
FIG. 8 is a diagram illustrating the disposition in plan view of a plurality of transistor cells, input capacitance elements, base ballast resistance elements, wiring lines, bumps, and so forth that constitute an amplifying circuit of a semiconductor device according to a second embodiment.

FIG. 8 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the second embodiment. In the first embodiment, the emitter wiring line 42E in the second layer is disposed corresponding to each of the two cell rows 33 and is separately disposed on one side and the other side of the symmetry axis. That is, the emitter wiring line 42E in the second layer is formed of four conductor patterns. In contrast to this, in the second embodiment, the emitter wiring line 42E in the second layer is formed of one conductor pattern.

Specifically, the emitter wiring line 42E includes two intra-cell-row connection portions 42E1 and two inter-cell-row connection portions 42E2. The two intra-cell-row connection portions 42E1 are long in the alignment direction in plan view, are disposed corresponding to the two cell rows 33, and are connected to the emitter regions 30E (FIG. 2B) of the plurality of transistor cells 30 in the corresponding cell rows 33. For example, each of the intra-cell-row connection portions 42E1 connects the emitter regions 30E of the plurality of transistor cells 30 included in a corresponding one of the cell rows 33 to each other. The two inter-cell-row connection portions 42E2 connect end portions of the two intra-cell-row connection portions 42E1 to each other. The emitter wiring line 42E in the second layer is substantially closed-loop-shaped in plan view. The collector intermediate integrated wiring line 42CH is disposed in the region enclosed by the substantially loop-shaped emitter wiring line 42E.

Figure 9:
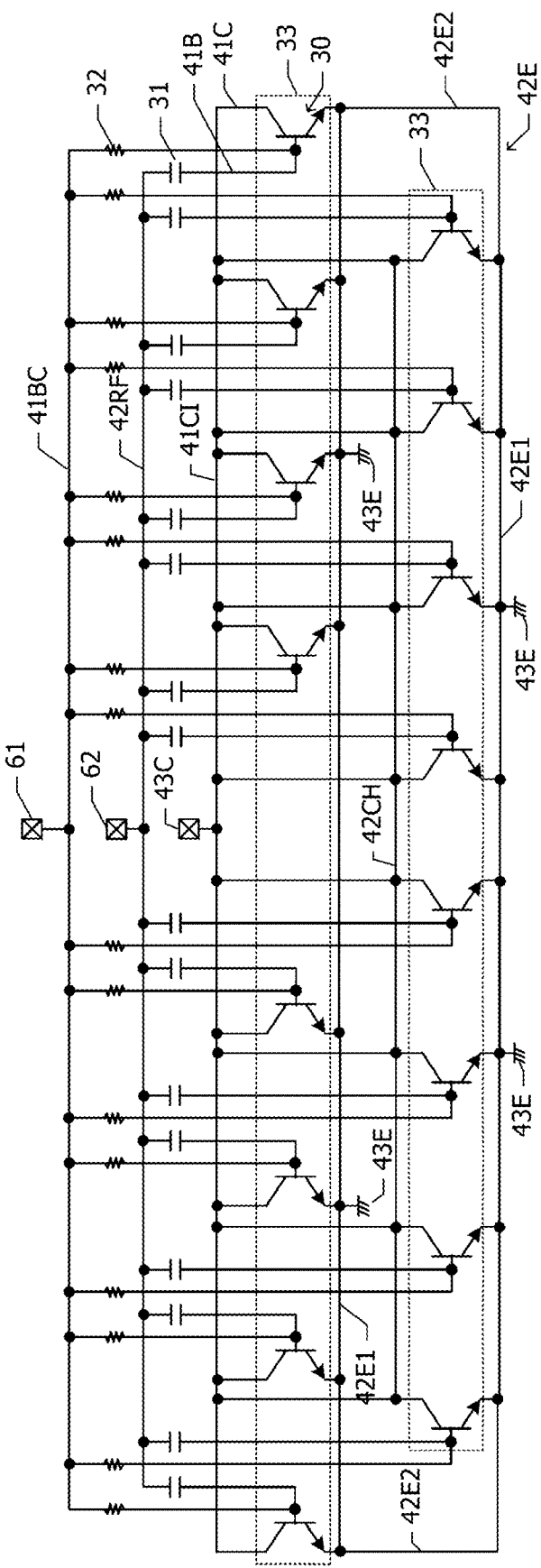
FIG. 9 is an equivalent circuit diagram of the semiconductor device according to the second embodiment.

FIG. 9 is an equivalent circuit diagram of the semiconductor device according to the second embodiment. The emitters of the eight transistor cells 30 in each cell row 33 are connected to each other by a corresponding one of the intra-cell-row connection portions 42E1. The two intra-cell-row connection portions 42E1 are connected to each other by the two inter-cell-row connection portions 42E2.

Next, an excellent effect of the second embodiment will be described.

In the second embodiment, the emitters of all the transistor cells 30 in the two cell rows 33 are connected to each other by the emitter wiring line 42E in the second layer, and thus the parasitic resistance, parasitic inductance, and the like of the wiring lines connected to the emitters of the transistor cells 30 are reduced. As a result, an excellent effect of increasing the performance of the amplifying circuit can be obtained.

Next, a modification example of the second embodiment will be described.

In the second embodiment, the emitter wiring line 42E in the second layer is substantially closed-loop-shaped in plan view. Alternatively, the loop may be open at one portion in plan view. For example, one end portions of the two intra-cell-row connection portions 42E1 may be connected by an inter-cell-row connection portion 42E2 such that the other end portions are not connected to each other. Alternatively, one of the intra-cell-row connection portions 42E1 may be separated into two portions at the center thereof (at the position of the symmetry axis). Also in this case, the emitter wiring line 42E in the second layer is formed of one conductor pattern, and thus an excellent effect similar to that in the second embodiment is obtained. Furthermore, when a lift-off method is used to form the emitter wiring line 42E in the second layer, an effect of forming the emitter wiring line 42E with high reproducibility is obtained.

Third Embodiment

Next, a semiconductor device according to a third embodiment will be described with reference to FIGS. 10 and 11. Hereinafter, the description of the same components as those of the semiconductor device according to the first embodiment (FIGS. 1, 2A, 2B, and 3) will be omitted.

Figure 10:
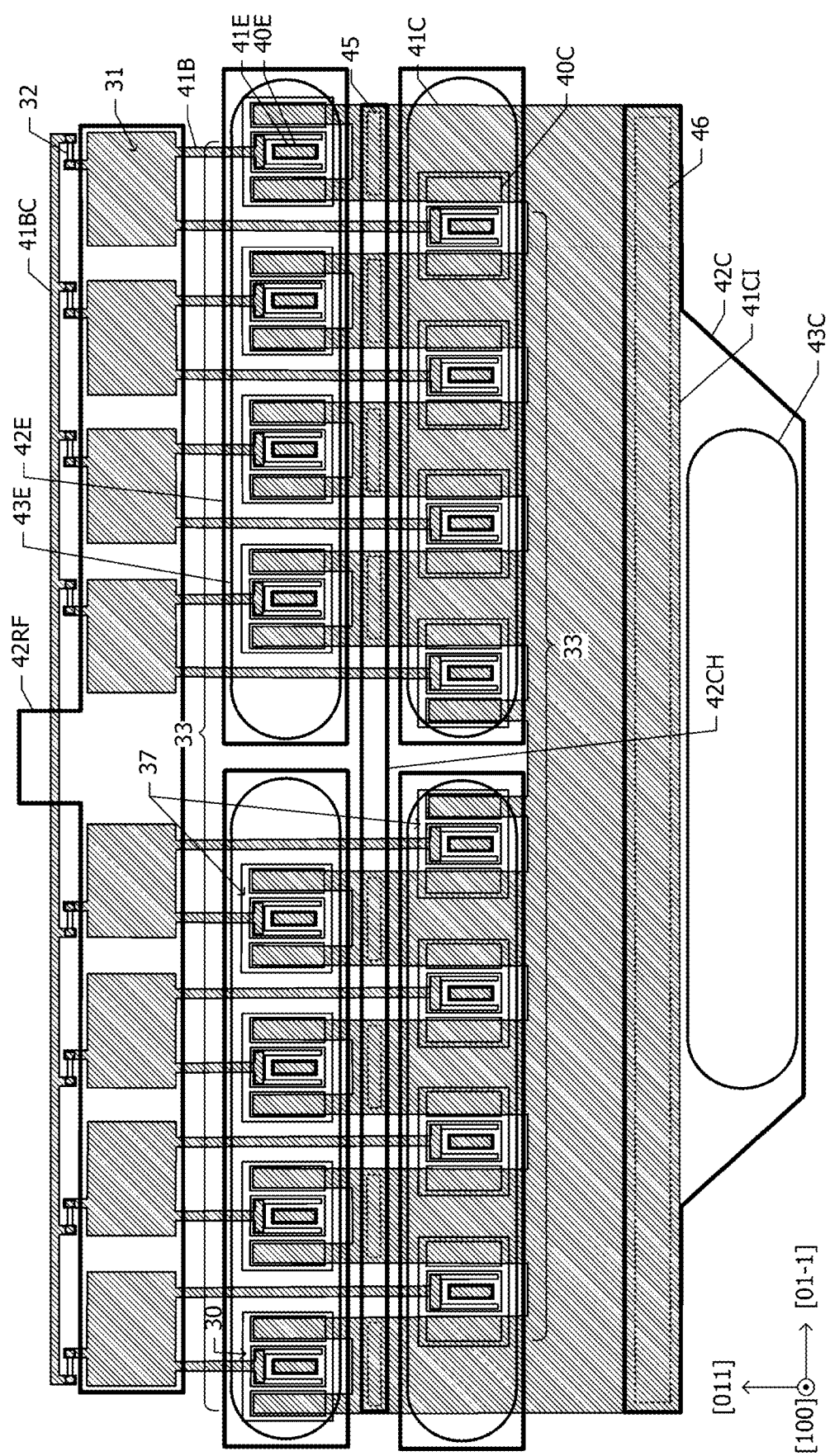
FIG. 10 is a diagram illustrating the disposition in plan view of a plurality of transistor cells, input capacitance elements, base ballast resistance elements, wiring lines, bumps, and so forth that constitute an amplifying circuit of a semiconductor device according to a third embodiment.

FIG. 10 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the third embodiment. In the first embodiment, each input capacitance element 31 is connected to a corresponding one of the transistor cells 30. In contrast to this, in the third embodiment, each input capacitance element 31 is disposed for one of inter-row pairs 37 each formed of one transistor cell 30 in one of the two cell rows 33 and one transistor cell 30 in the other cell row 33. Also, each base ballast resistance element 32 is disposed for one of the inter-row pairs 37. When serial numbers are assigned to the plurality of transistor cells 30 in one of the cell rows 33 from one end portion and serial numbers are assigned to the plurality of transistor cells 30 in the other cell row 33 from the one end portion, two transistor cells 30 having the same serial number constitute one inter-row pair 37.

The two base extended wiring lines 41B extended from the two transistor cells 30 constituting one inter-row pair 37 are increased in width, and portions with the increased width are integrated together. The portions integrated together overlap the RF input wiring line 42RF, thereby constituting the input capacitance element 31.

Figure 11:
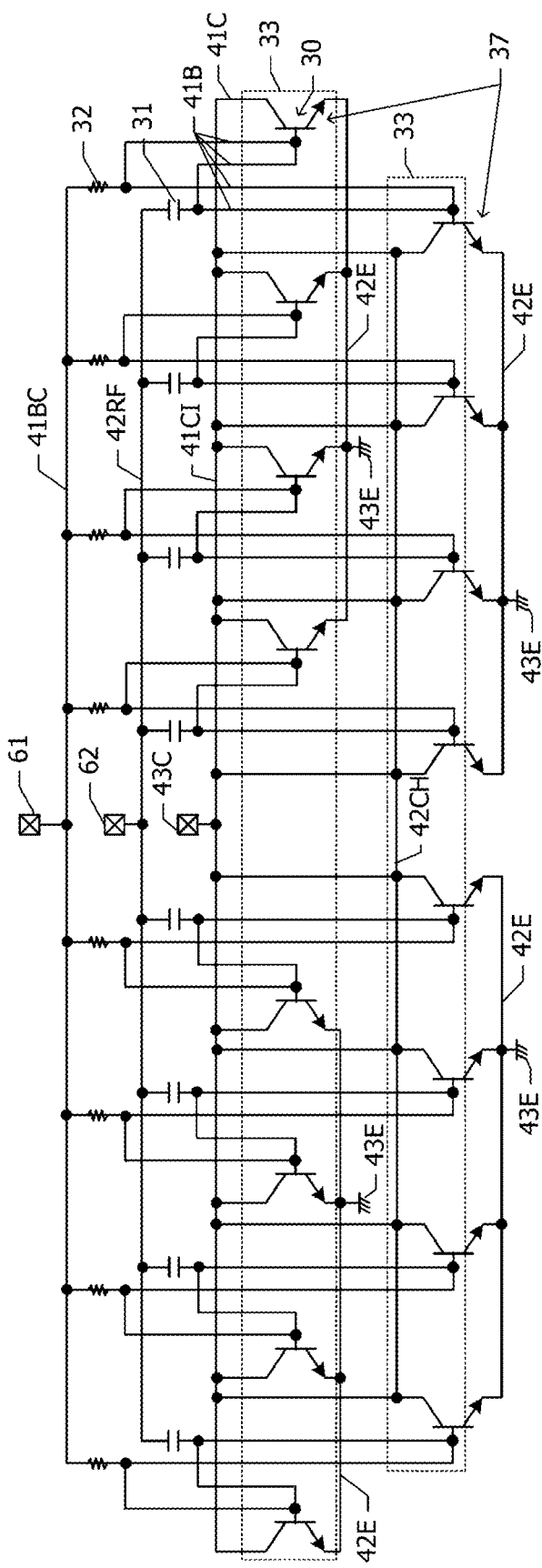
FIG. 11 is an equivalent circuit diagram of the semiconductor device according to the third embodiment.

FIG. 11 is an equivalent circuit diagram of the semiconductor device according to the third embodiment. One transistor cell 30 in one of the cell rows 33 and one transistor cell 30 in the other cell rows 33 constitute one inter-row pair 37. The bases of the two transistor cells 30 constituting the one inter-row pair 37 are connected to the same input capacitance element 31. Furthermore, the bases of the two transistor cells 30 constituting the one inter-row pair 37 are connected to the same base ballast resistance element 32.

Next, an excellent effect of the third embodiment will be described.

Preferably, a resistance value $R_{BL}$ of each base ballast resistance element 32 is set so as to satisfy the following inequality.

$$R_{BL} > \frac{(\beta+1)\left(I_{CMAX}\phi R_{th}V_{CE} - \frac{kT_0}{q}\right)}{I_{CMAX}(2I_{CMAX}\phi R_{th} + 1)} \quad (1)$$

Here, $\beta$ represents a current amplification factor of the transistor, $I_{CMAX}$ represents a maximum collector current in circuit design, $\phi$ represents a temperature coefficient of a base-emitter voltage $V_{BE}$, $R_{th}$ represents a thermal resistance, $V_{CE}$ represents a collector-emitter voltage, k represents a Boltzmann constant, $T_0$ represents an atmosphere temperature, and q represents an elementary charge. As the thermal resistance $R_{th}$ decreases, the right side of the inequality (1) decreases, and the resistance value $R_{BL}$ of the base ballast resistance element 32 can be decreased.

In the third embodiment, the two transistor cells 30 in the inter-row pair 37 connected to one base ballast resistance element 32 are disposed in the two cell rows 33. The distance between the two transistor cells 30 in the inter-row pair 37 is longer than the distance between two adjacent transistor cells 30 in the one-row alignment according to the comparative example illustrated in FIG. 6B. As described above with reference to FIGS. 7A, 7B, and 7C, the thermal resistance $R_{th}$ corresponding to the two transistor cells 30 constituting one inter-row pair 37 is smaller than the thermal resistance $R_{th}$ corresponding to the transistor cells 30 aligned in one row (FIG. 6B). Thus, in the third embodiment, the resistance value $R_{BL}$ of each base ballast resistance element 32 can be decreased. As a result, the performance of the amplifying circuit can be increased.

Fourth Embodiment

Next, a semiconductor device according to a fourth embodiment will be described with reference to FIGS. 12 and 13. Hereinafter, the description of the same components as those of the semiconductor device according to the third embodiment (FIGS. 10 and 11) will be omitted.

Figure 12:
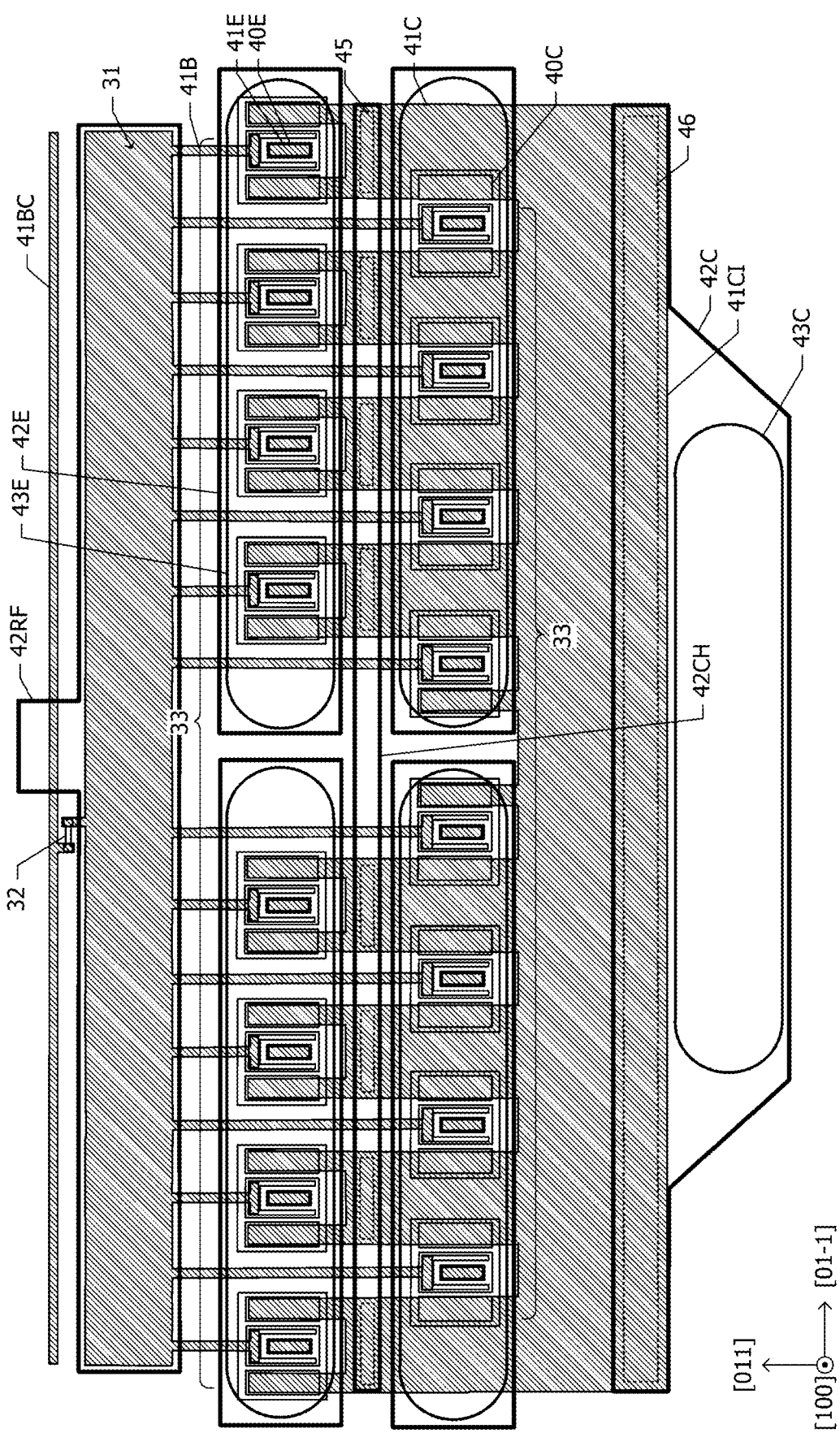
FIG. 12 is a diagram illustrating the disposition in plan view of a plurality of transistor cells, an input capacitance element, a base ballast resistance element, wiring lines, bumps, and so forth that constitute an amplifying circuit of a semiconductor device according to a fourth embodiment.

FIG. 12 is a diagram illustrating the disposition in plan view of the plurality of transistor cells 30, the input capacitance element 31, the base ballast resistance element 32, the wiring lines, the bumps, and so forth that constitute an amplifying circuit of the semiconductor device according to the fourth embodiment. In the third embodiment, one input capacitance element 31 is disposed for two transistor cells 30 constituting one inter-row pair 37 (FIGS. 10 and 11). In contrast to this, in the fourth embodiment, one input capacitance element 31 is disposed for all the transistor cells 30 in the two cell rows 33. Also, one base ballast resistance element 32 is disposed for all the transistor cells 30 in the two cell rows 33.

Figure 13:
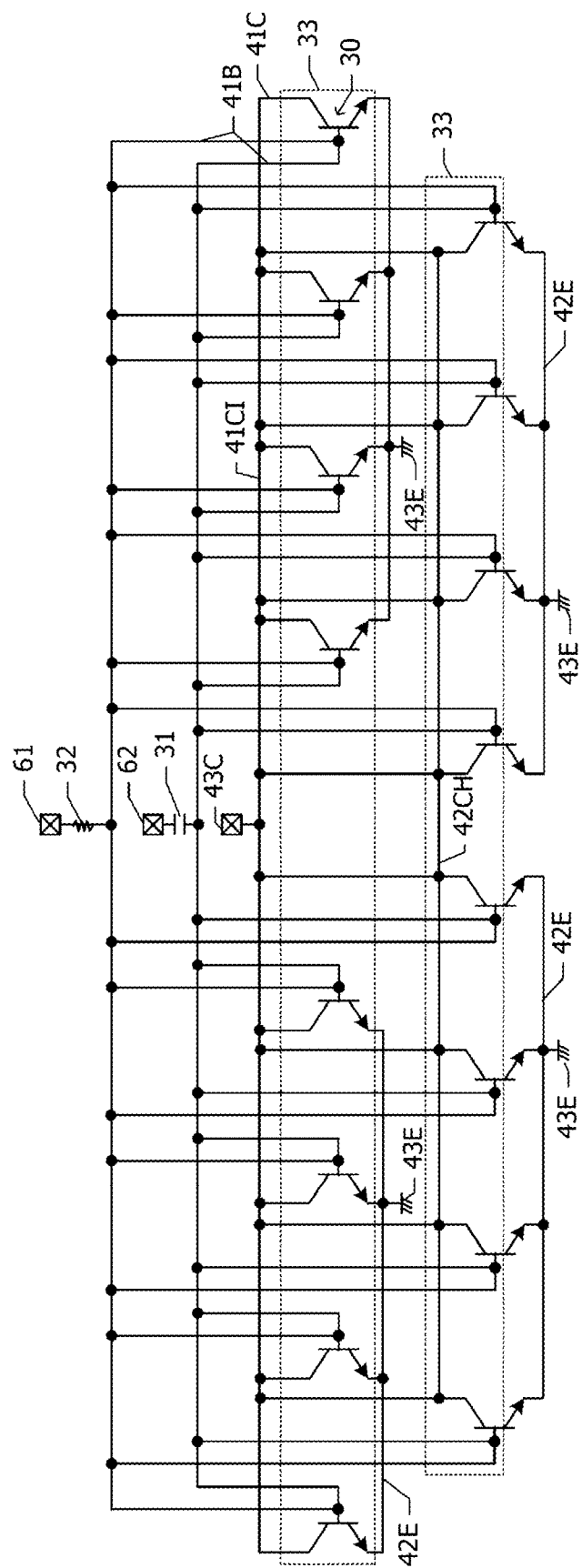
FIG. 13 is an equivalent circuit diagram of the semiconductor device according to the fourth embodiment.

FIG. 13 is an equivalent circuit diagram of the semiconductor device according to the fourth embodiment. The bases of all the transistor cells 30 in the two cell rows 33 are connected to the one input capacitance element 31. Furthermore, the bases of all the transistor cells 30 in the two cell rows 33 are connected to the one base ballast resistance element 32.

Next, an excellent effect of the fourth embodiment will be described. In the fourth embodiment, one input capacitance element 31 is disposed for all the transistor cells 30, and thus the layout efficiency of the input capacitance element 31 is improved. As a result, the chip size can be reduced and the cost can be reduced.

Fifth Embodiment

Next, a semiconductor device according to a fifth embodiment will be described with reference to FIGS. 14 and 15. Hereinafter, the description of the same components as those of the semiconductor device according to the first embodiment (FIGS. 1, 2A, 2B, and 3) will be omitted.

Figure 14:
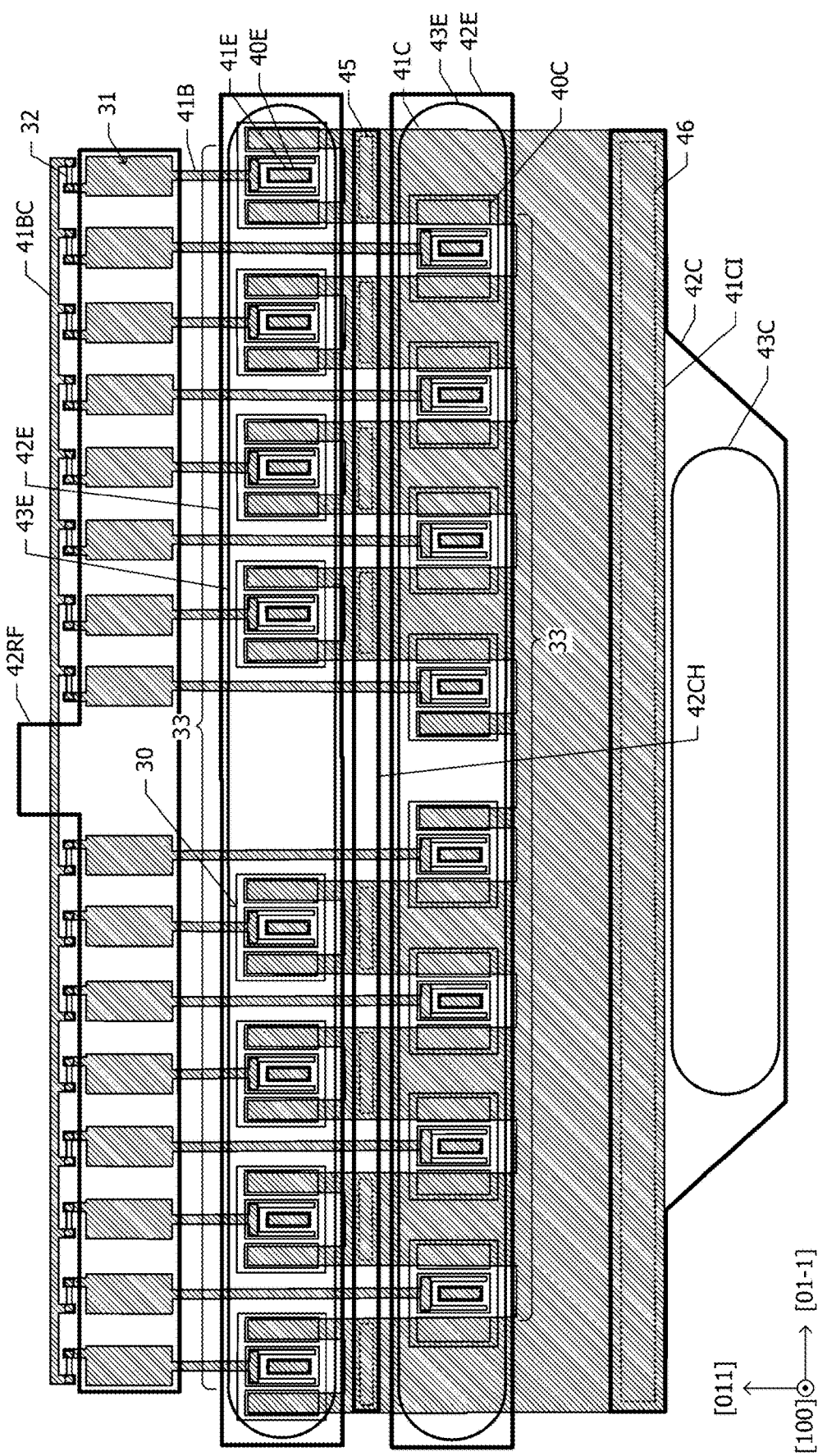
FIG. 14 is a diagram illustrating the disposition in plan view of a plurality of transistor cells, input capacitance elements, base ballast resistance elements, wiring lines, bumps, and so forth that constitute an amplifying circuit of a semiconductor device according to a fifth embodiment.

FIG. 14 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the fifth embodiment. In the first embodiment, the emitter wiring line 42E in the second layer and the emitter bump 43E disposed corresponding to each of the cell rows 33 are separated into two portions at the position of the symmetry axis. In contrast to this, in the fifth embodiment, one emitter wiring line 42E and one emitter bump 43E are disposed corresponding to each of the cell rows 33.

Figure 15:
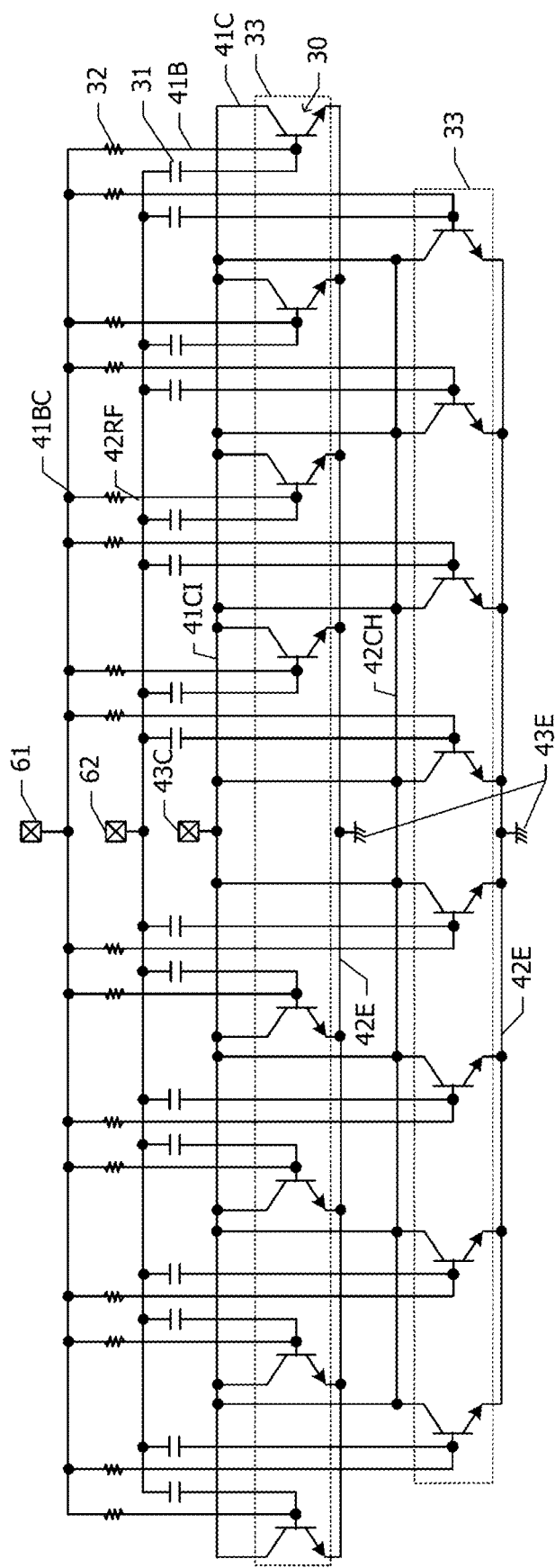
FIG. 15 is an equivalent circuit diagram of the semiconductor device according to the fifth embodiment.

FIG. 15 is an equivalent circuit diagram of the semiconductor device according to the fifth embodiment. The emitters of the plurality of transistor cells 30 in each cell row 33 are connected to a corresponding one of the emitter wiring lines 42E. One emitter bump 43E is connected to one emitter wiring line 42E.

Next, an excellent effect of the fifth embodiment will be described. In the fifth embodiment, as in the first embodiment, the collector intermediate integrated wiring line 42CH is disposed and thus the parasitic inductance of the collector wiring lines can be reduced. In addition, in the fifth embodiment, the emitter bumps 43E serving as heat radiation paths have a larger cross section than in the first embodiment. Thus, heat resistance can be further decreased.

When FIGS. 4A and 4C are compared with each other, it is understood that the length of each cell row 33 is shorter in FIG. 4A than in FIG. 4C illustrating the semiconductor device having a one-row disposition with the same number of transistor cells 30 and the same pitch. Also, the emitter bump 43E disposed corresponding to the cell row 33 is shorter, and thus the surface flatness of the emitter bumps 43E can be increased compared with the configuration with a one-row disposition.

Sixth Embodiment

Next, a semiconductor device according to a sixth embodiment will be described with reference to FIGS. 16 and 17. Hereinafter, the description of the same components as those of the semiconductor device according to the first embodiment (FIGS. 1, 2A, 2B, and 3) will be omitted.

Figure 16:
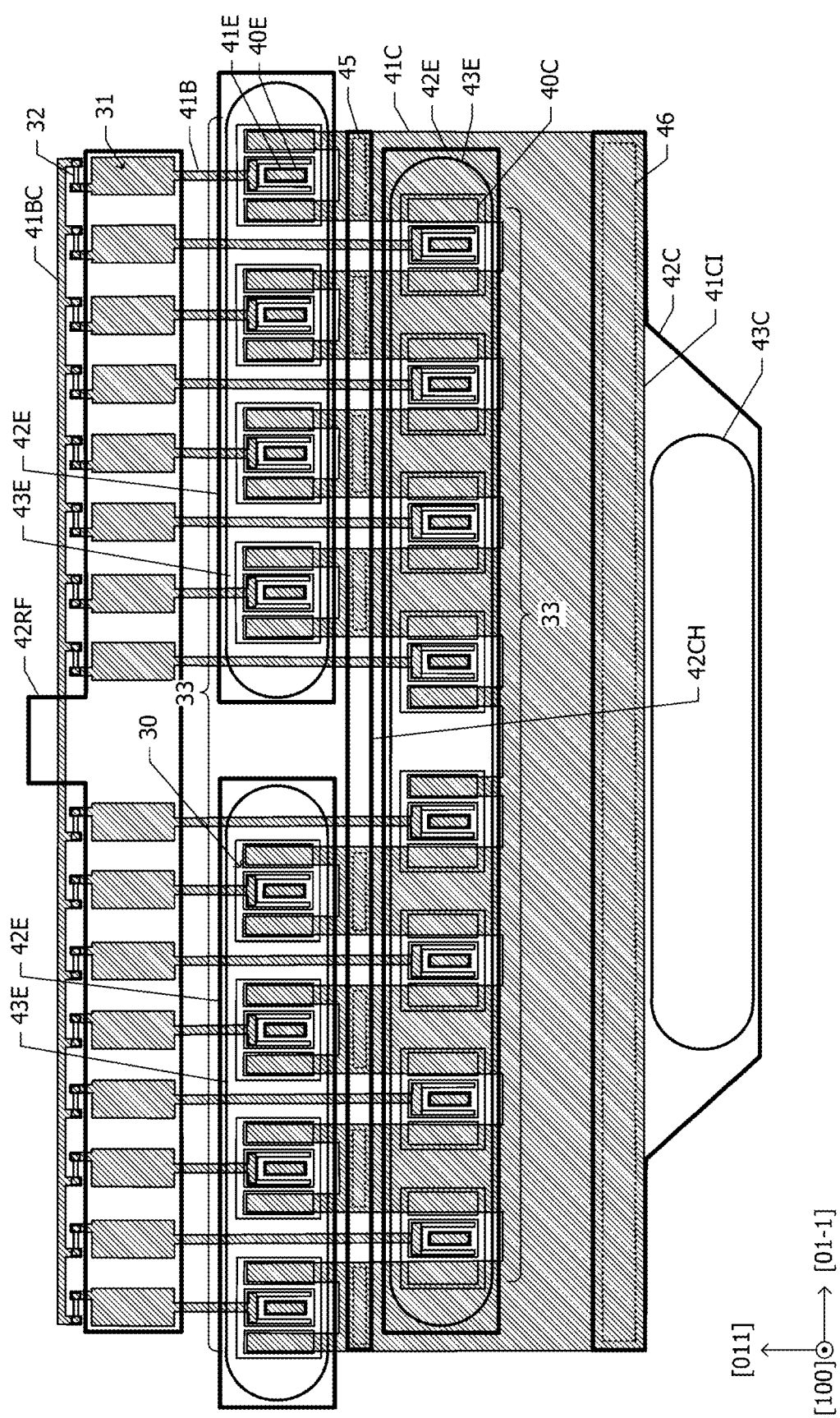
FIG. 16 is a diagram illustrating the disposition in plan view of a plurality of transistor cells, input capacitance elements, base ballast resistance elements, wiring lines, bumps, and so forth that constitute an amplifying circuit of a semiconductor device according to a sixth embodiment.

FIG. 16 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the sixth embodiment. In the sixth embodiment, as in the first embodiment, the plurality of transistor cells 30 in the two cell rows 33 are disposed in mirror symmetry with respect to the symmetry axis. However, the two cell rows 33 have different lengths.

In the first embodiment, the emitter wiring line 42E in the second layer disposed for each of the two cell rows 33 is formed of two conductor patterns separated from each other at the position of the symmetry axis. In contrast to this, in the sixth embodiment, the emitter wiring line 42E in the second layer disposed corresponding to the longer one of the cell rows 33 is formed of two conductor patterns separated from each other at the position of the symmetry axis, whereas the emitter wiring line 42E in the second layer disposed corresponding to the shorter one of the cell rows 33 is formed of one conductor pattern that is continuous from one end to the other end of the cell row 33. Also, the emitter bumps 43E are disposed for the respective conductor patterns of the emitter wiring line 42E in the second layer. In this manner, a plurality of emitter bumps 43E separated from each other in the alignment direction correspond to the longer cell row 33, whereas one emitter bump 43E that is not separated corresponds to the shorter cell row 33.

Figure 17:
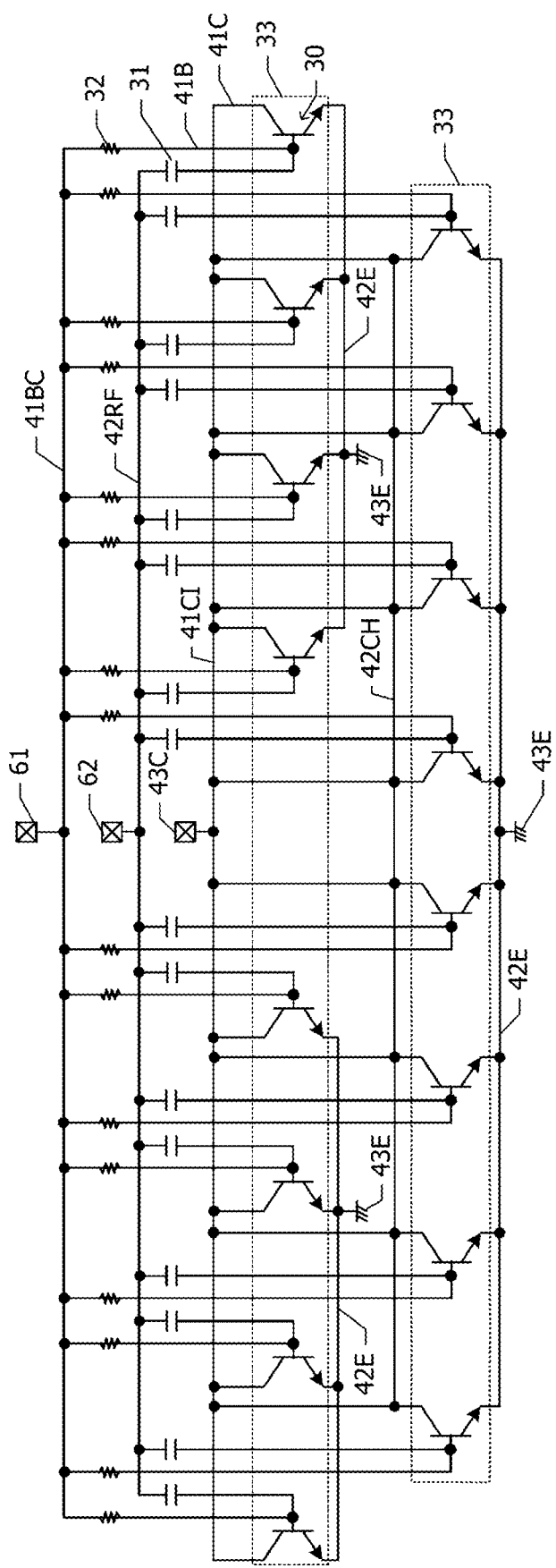
FIG. 17 is an equivalent circuit diagram of the semiconductor device according to the sixth embodiment.

FIG. 17 is an equivalent circuit diagram of the semiconductor device according to the sixth embodiment. The eight transistor cells 30 in the longer cell row 33 is divided at the position of the symmetry axis into groups, each formed of four transistor cells 30, and the emitters of the four transistor cells 30 belonging to one group are connected to one emitter wiring line 42E. In the shorter cell row 33, the emitters of the eight transistor cells 30 are connected to one emitter wiring line 42E.

Next, an excellent effect of the sixth embodiment will be described. In the sixth embodiment, as in the first embodiment, the collector intermediate integrated wiring line 42CH is disposed and thus the parasitic inductance of the collector wiring lines can be reduced.

In the foregoing fifth embodiment, the emitter wiring line 42E in the second layer and the emitter bump 43E that correspond to the shorter cell row 33 have the same lengths as those of the emitter wiring line 42E in the second layer and the emitter bump 43E that correspond to the longer cell row 33. That is, the emitter wiring line 42E in the second layer and the emitter bump 43E that correspond to the shorter cell row 33 are extended outward from the positions of the transistor cells 30 at both ends. In contrast to this, in the sixth embodiment, the emitter wiring line 42E in the second layer and the emitter bump 43E that correspond to the shorter cell row 33 are not influenced by the length of the longer cell row 33 and have lengths corresponding to the length of the cell row 33. Thus, the surface flatness of the emitter bump 43E corresponding to the shorter cell row 33 can be increased.

In addition, the emitter bump 43E corresponding to the longer cell row 33 is separated into two portions at the position of the symmetry axis, and thus each of the two portions of the emitter bump 43E is shorter than the cell row 33. Thus, also for the emitter bump 43E corresponding to the longer cell row 33, the surface flatness can be increased.

Seventh Embodiment

Next, a semiconductor device according to a seventh embodiment will be described with reference to FIG. 18. Hereinafter, the description of the same components as those of the semiconductor device according to the first embodiment (FIGS. 1, 2A, 2B, and 3) will be omitted.

Figure 18:
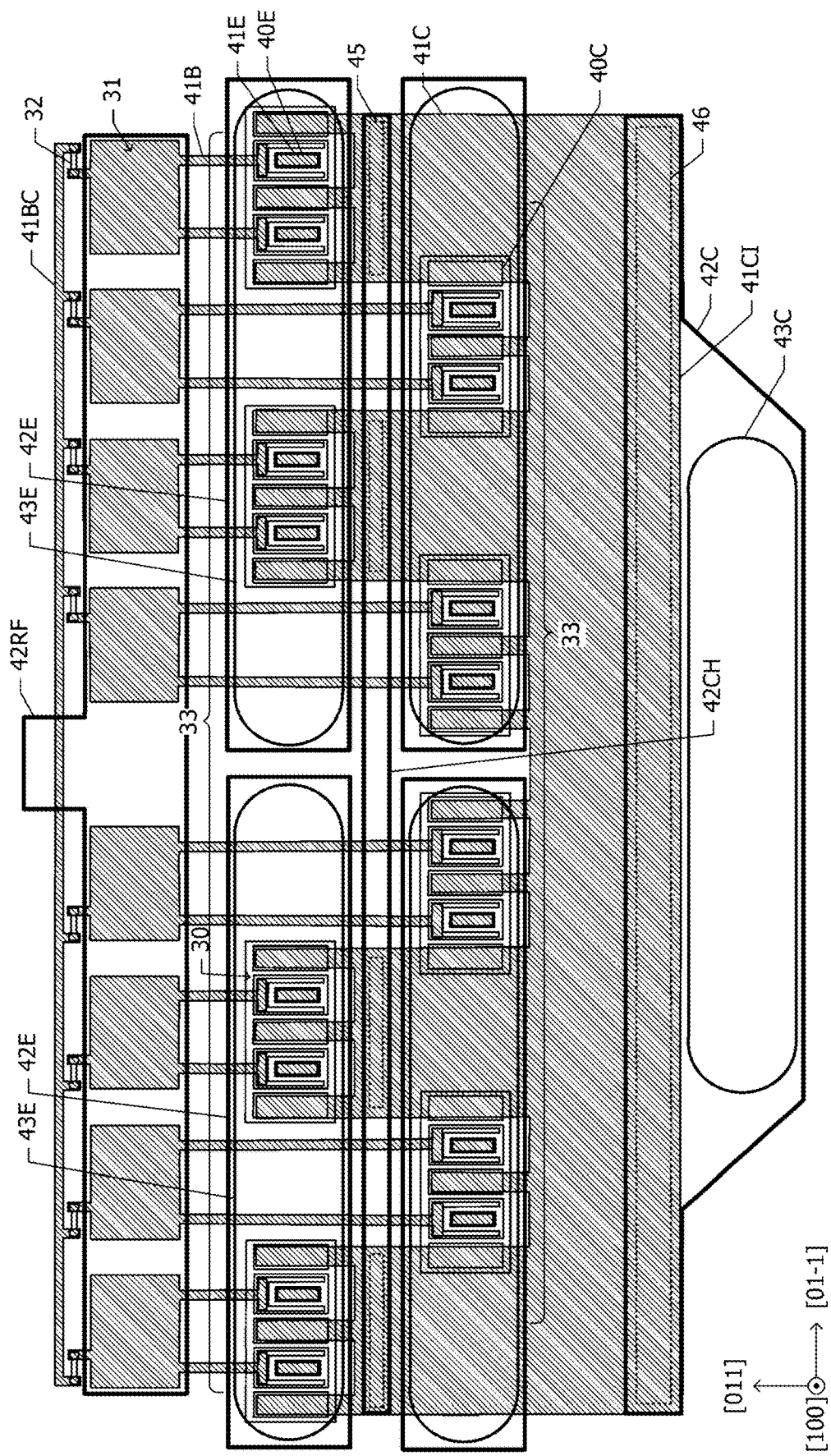
FIG. 18 is a diagram illustrating the disposition in plan view of a plurality of transistor cells, input capacitance elements, base ballast resistance elements, wiring lines, bumps, and so forth that constitute an amplifying circuit of a semiconductor device according to a seventh embodiment.

FIG. 18 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the seventh embodiment. In the first embodiment, the plurality of transistor cells 30 in one cell row 33 and the plurality of transistor cells 30 in the other cell row 33 are disposed in a staggered manner in the alignment direction. In contrast to this, in the seventh embodiment, two adjacent transistor cells 30 in the same cell row 33 form a basic unit, and a plurality of basic units in one cell row 33 and a plurality of basic units in the other cell row 33 are disposed in a staggered manner in the alignment direction. In the seventh embodiment, the plurality of basic units in the two cell rows 33 are disposed in mirror symmetry with respect to the symmetry axis, and the regularity of the staggered disposition is lost at the position of the symmetry axis.

Each input capacitance element 31 is disposed for one of the basic units each including two transistor cells 30. The disposition of the emitter wiring lines 42E in the second layer and the emitter bumps 43E is similar to that in the first embodiment.

Next, an excellent effect of the seventh embodiment will be described. In the seventh embodiment, as in the first embodiment, the collector intermediate integrated wiring line 42CH is disposed and thus the parasitic inductance of the collector wiring lines can be reduced.

Next, a modification example of the seventh embodiment will be described. In the seventh embodiment, two adjacent transistor cells 30 in the same cell row 33 form a basic unit of a staggered disposition. Alternatively, three or more adjacent transistor cells 30 in the same cell row 33 may form a basic unit of a staggered disposition.

Eighth Embodiment

Next, a semiconductor device according to an eighth embodiment will be described with reference to FIG. 19. Hereinafter, the description of the same components as those of the semiconductor device according to the seventh embodiment (FIG. 18) will be omitted.

Figure 19:
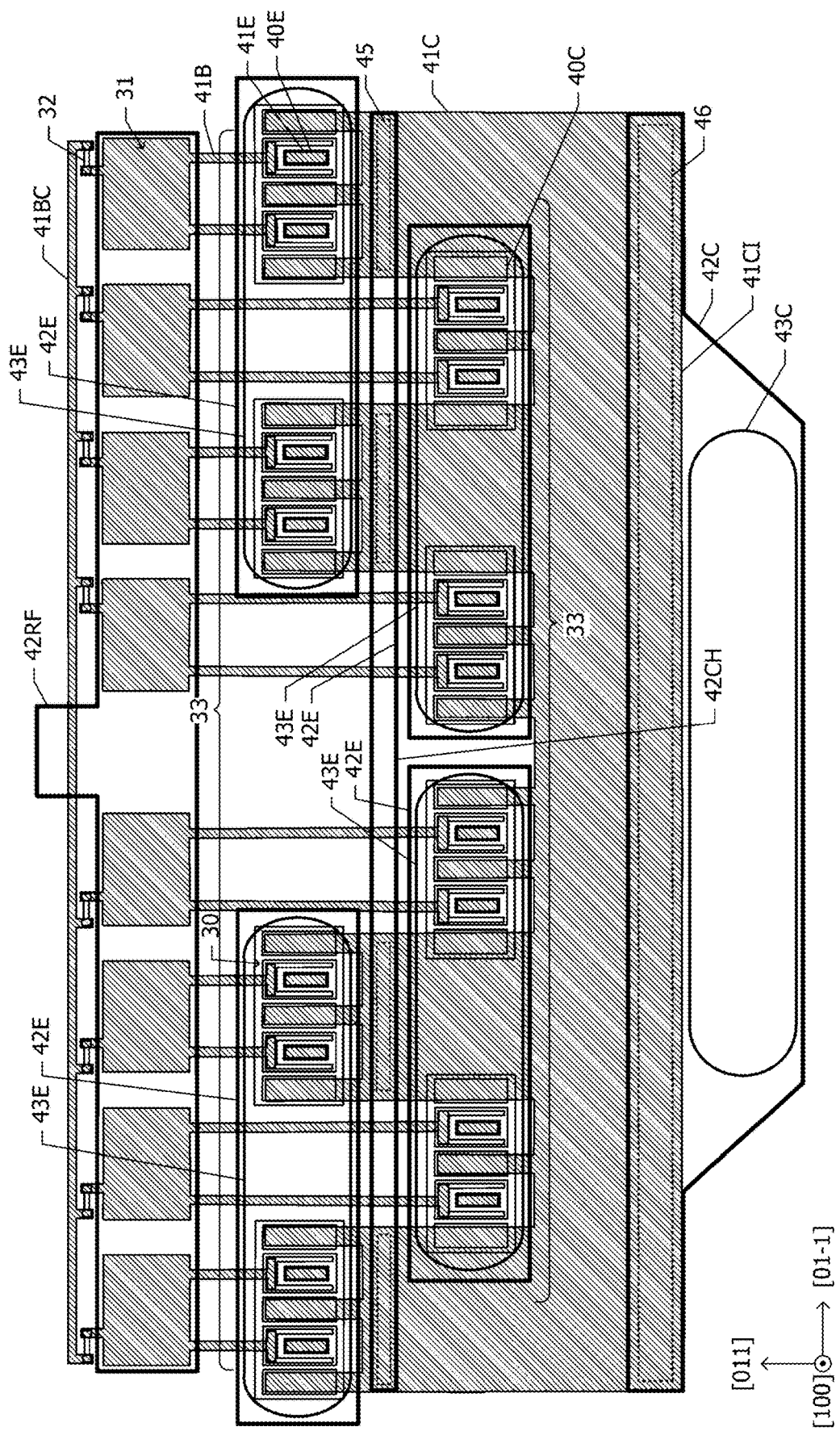
FIG. 19 is a diagram illustrating the disposition in plan view of a plurality of transistor cells, input capacitance elements, base ballast resistance elements, wiring lines, bumps, and so forth that constitute an amplifying circuit of a semiconductor device according to an eighth embodiment.

FIG. 19 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the eighth embodiment. In the seventh embodiment, the emitter wiring lines 42E in the second layer and the emitter bumps 43E that correspond to the longer cell row 33, and the emitter wiring lines 42E in the second layer and the emitter bumps 43E that correspond to the shorter cell row 33, are disposed at positions corresponding to each other in the alignment direction. In contrast to this, in the eighth embodiment, the emitter wiring lines 43E in the second layer and the emitter bumps 43E that correspond to the longer cell row 33, and the emitter wiring lines 43E in the second layer and the emitter bumps 43E that correspond to the shorter cell row 33, are disposed at different positions in the alignment direction.

Specifically, each emitter bump 43E is disposed so as to include, in plan view, a plurality of basic units that belong to the same cell row 33 and that are consecutive in the alignment direction. The number of basic units included in each emitter bump 43E is the same in the longer cell row 33 and the shorter cell row 33. Both ends of each emitter bump 43E correspond to the positions of the basic units at both ends included in the emitter bump 43E. Because the plurality of basic units in the longer cell row 33 and the plurality of basic units in the shorter cell row 33 are disposed in a staggered manner in the alignment direction, the emitter bumps 43E corresponding to the longer cell row 33 and the emitter bumps 43E corresponding to the shorter cell row 33 are disposed at different positions in the alignment direction. The amount of difference is substantially equal to the alignment pitch of the basic units that are disposed in a staggered manner in the alignment direction.

For example, the number of transistor cells 30 connected to one emitter bump 43E corresponding to one of the two cell rows 33 is equal to the number of transistor cells 30 connected to one emitter bump 43E corresponding to the other cell row 33. The emitter bump 43E corresponding to the one cell row 33 and the emitter bump 43E corresponding to the other cell row 33 include an overlapping portion at which both the emitter bumps 43E overlap each other in the alignment direction, and extend in directions opposite to each other from the overlapping portion.

Next, an excellent effect of the eighth embodiment will be described.

In the eighth embodiment, both ends of each emitter bump 43E correspond to the positions of the basic units at both ends included in the emitter bump 43E, and thus the emitter bump 43E is shorter than in the seventh embodiment. Thus, the surface flatness of the emitter bump 43E can be increased.

Ninth Embodiment

Next, a semiconductor device according to a ninth embodiment will be described with reference to FIG. 20. Hereinafter, the description of the same components as those of the semiconductor device according to the seventh embodiment (FIG. 18) will be omitted.

Figure 20:
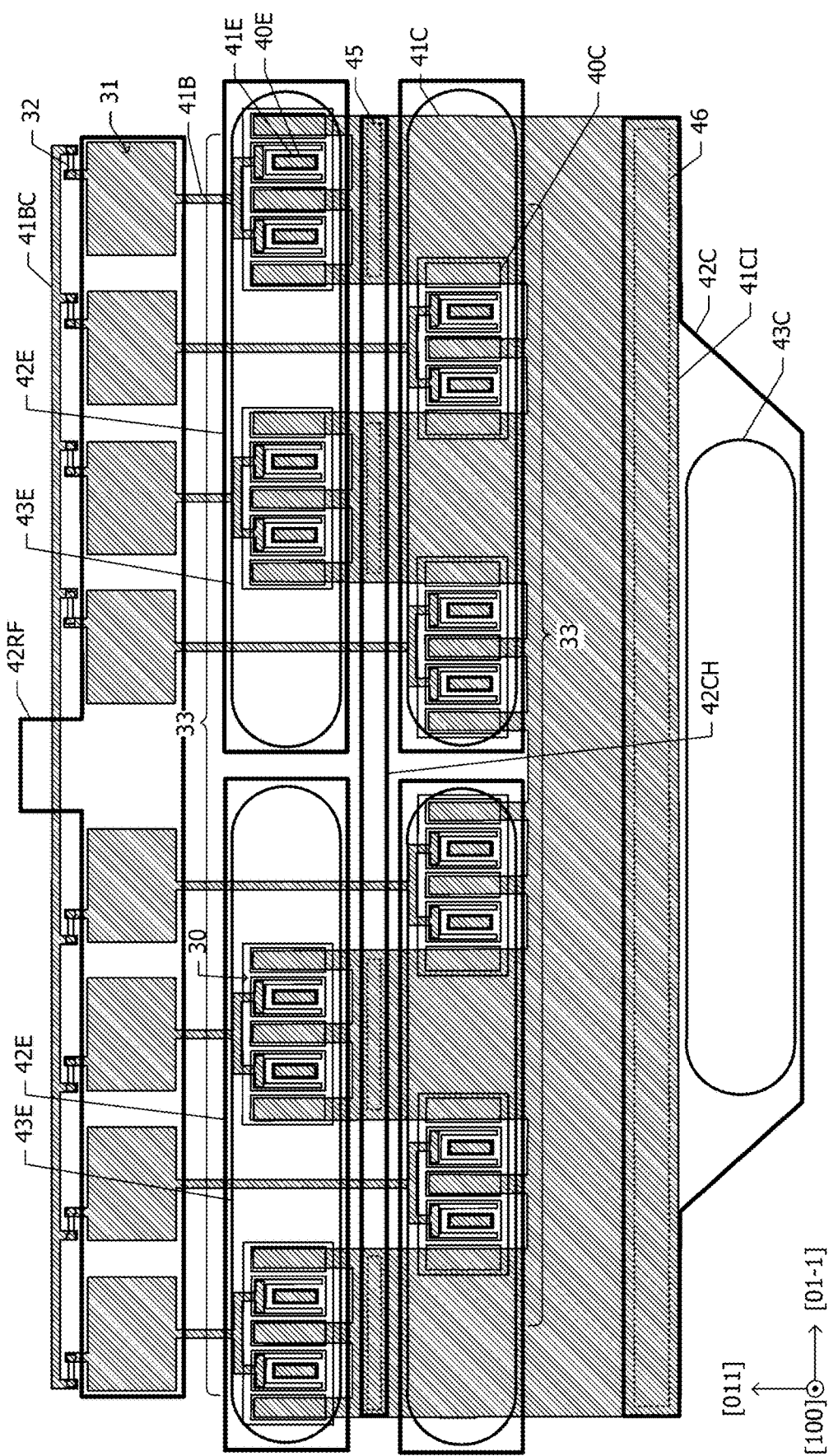
FIG. 20 is a diagram illustrating the disposition in plan view of a plurality of transistor cells, input capacitance elements, base ballast resistance elements, wiring lines, bumps, and so forth that constitute an amplifying circuit of a semiconductor device according to a ninth embodiment.

FIG. 20 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the ninth embodiment. In the seventh embodiment (FIG. 18), the base extended wiring lines 41B are extended from the two transistor cells 30 belonging to one basic unit in the direction orthogonal to the alignment direction and reach one input capacitance element 31. In contrast to this, in the ninth embodiment, the base extended wiring lines 41B extended from the two transistor cells 30 belonging to one basic unit are connected to each other near the transistor cells 30 so as to be integrated into one base extended wiring line 41B, which extends to a corresponding one of the input capacitance elements 31.

Next, an excellent effect of the ninth embodiment will be described. In the seventh embodiment (FIG. 18), the base extended wiring lines 41B extended upward from the lower transistor cells 30 are close to the collector extended wiring lines 41C extended downward from the upper transistor cells 30, and thus both wiring lines are likely to be coupled to each other. In contrast to this, in the ninth embodiment, the base extended wiring lines 41B extended from two transistor cells 30 are integrated into one base extended wiring line 41B, and thus the distance between the base extended wiring line 41B and the collector extended wiring line 41C is increased. As a result, the coupling between both the wiring lines is weakened. Therefore, it is possible to suppress mutual interference between an input signal transmitted through the base extended wiring line 41B and an output signal transmitted through the collector extended wiring line 41C.

Tenth Embodiment

Next, a semiconductor device according to a tenth embodiment will be described with reference to FIGS. 21 and 22. Hereinafter, the description of the same components as those of the semiconductor device according to the first embodiment (FIGS. 1, 2A, 2B, and 3) will be omitted.

Figure 21:
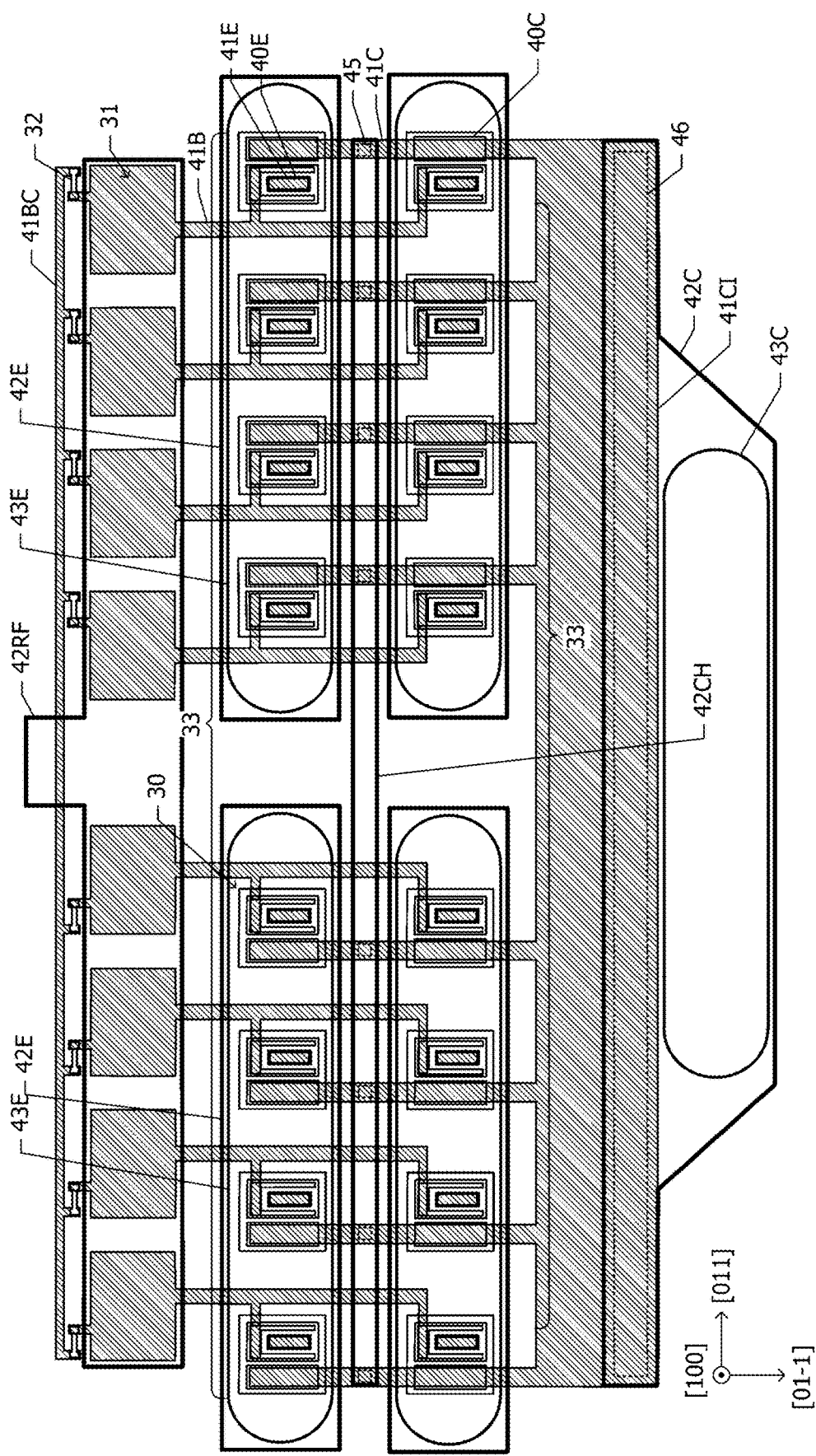
FIG. 21 is a diagram illustrating the disposition in plan view of a plurality of transistor cells, input capacitance elements, base ballast resistance elements, wiring lines, bumps, and so forth that constitute an amplifying circuit of a semiconductor device according to a tenth embodiment.

FIG. 21 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the tenth embodiment. FIG. 22 is a cross-sectional view of one of the transistor cells 30 of the semiconductor device according to the tenth embodiment.

In the first embodiment, the plurality of transistor cells 30 in one of the cell rows 33 and the plurality of transistor cells 30 in the other cell row 33 are disposed in a staggered manner in the alignment direction. In contrast to this, in the tenth embodiment, the plurality of transistor cells 30 in one of the cell rows 33 and the plurality of transistor cells 30 in the other cell row 33 are disposed at corresponding positions in the alignment direction. In addition, in the first embodiment, one pair of collector electrodes 40C (FIGS. 2A and 2B) are disposed so as to sandwich the emitter electrode 40E and the base electrode 40B (FIGS. 2A and 2B) in the alignment direction. In contrast to this, in the tenth embodiment, the collector electrode 40C is disposed on only one side in the alignment direction viewed from the emitter electrode 40E and the base electrode 40B. In the first embodiment, the alignment direction is parallel to the [01-1] direction of the substrate 50 made of GaAs. In the tenth embodiment, the alignment direction is parallel to the [011] direction of the substrate 50 made of GaAs. The longitudinal directions of the emitter regions 30E and the emitter electrodes 40E are parallel to the [01-1] direction.

The collector extended wiring lines 41C in the first layer are extended from the collector electrodes 40C of the plurality of transistor cells 30 in the direction orthogonal to the alignment direction. Each collector extended wiring line 41C is shared between two transistor cells 30 that are disposed at corresponding positions in the alignment direction.

The base extended wiring lines 41B are extended in the alignment direction from the base electrodes 40B of the plurality of transistor cells 30 so as to be away from the collector extended wiring lines 41C. Each base extended wiring line 41B is extended in the alignment direction from the base electrode 40B and is extended in the direction orthogonal to the alignment direction so as to be away from the collector integrated wiring line 41CI. The portion extending in the direction orthogonal to the alignment direction of the base extended wiring line 41B is shared between two transistor cells 30 disposed at corresponding positions in the alignment direction. One input capacitance element 31 is disposed for the two transistor cells 30 sharing the base extended wiring line 41B.

Each base extended wiring line 41B is extended from the base electrode 40B and crosses the step corresponding to the edges of the collector region 30C and the base region 30B (FIG. 22). The edges of the collector region 30C and the base region 30B (FIG. 22) that the base extended wiring line 41B crosses are parallel to the [01-1] direction of the substrate 50 made of GaAs. The step extending in this direction is formed of a slope whose angle of inclination to the surface of the substrate 50 is less than about 90 degrees. Thus, a break of the base extended wiring line 41B is less likely to occur.

The plurality of transistor cells 30 disposed on one side from the symmetry axis at the center in the alignment direction have the same positional relationship among the transistor cell 30, the collector extended wiring line 41C, and the base extended wiring line 41B in the alignment direction. The positional relationship among the transistor cells 30, the collector extended wiring lines 41C, and the base extended wiring lines 41B in the alignment direction is mirror symmetrical with respect to the symmetry axis.

Next, an excellent effect of the tenth embodiment will be described.

Also in the tenth embodiment, the collector intermediate integrated wiring line 42CH is disposed, and thus the parasitic inductance of the collector wiring lines can be reduced as in the first embodiment.

Eleventh Embodiment

Next, a semiconductor device according to an eleventh embodiment will be described with reference to FIG. 23. Hereinafter, the description of the same components as those of the semiconductor device according to the tenth embodiment (FIGS. 21 and 22) will be omitted.

Figure 23:
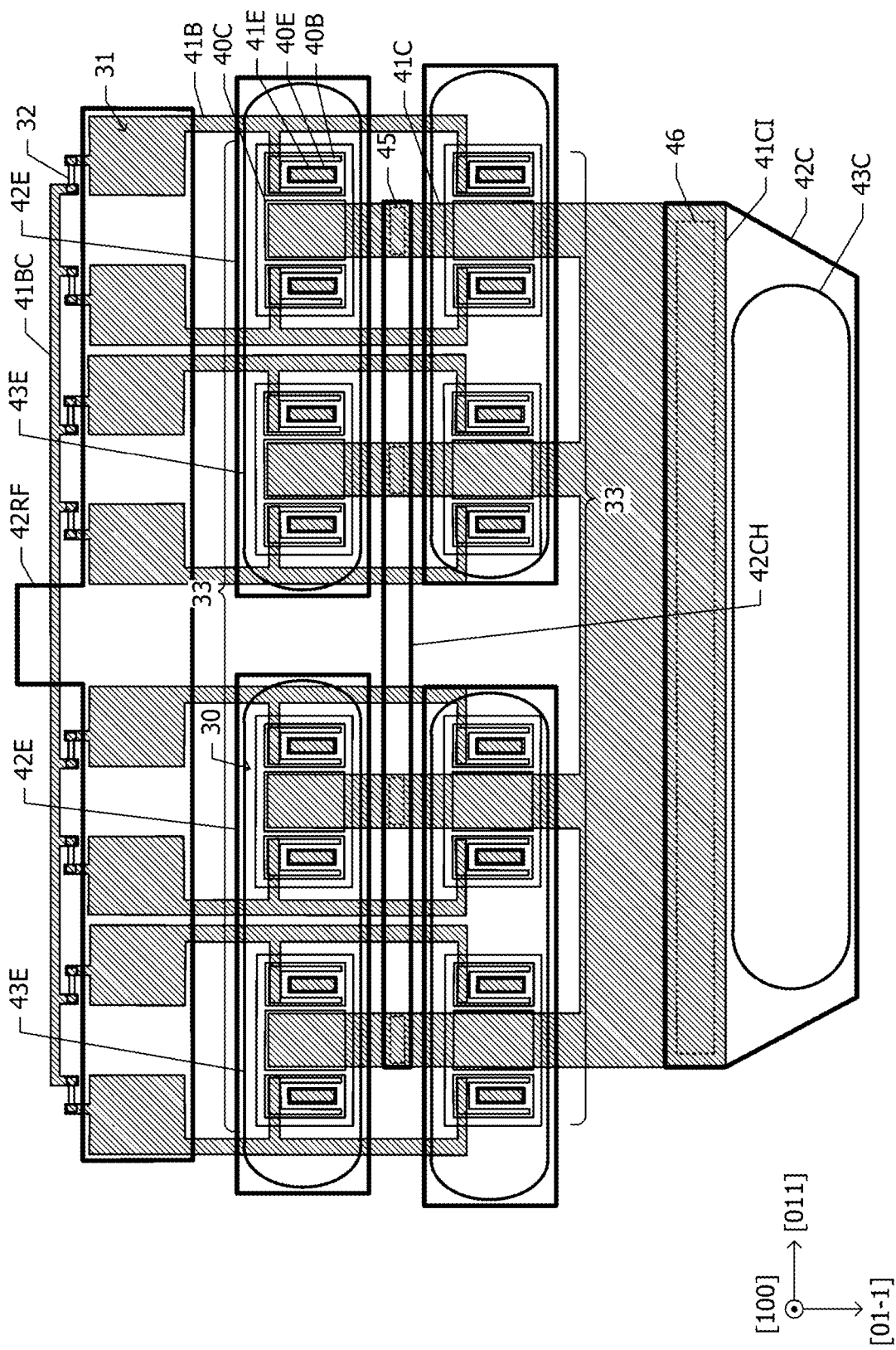
FIG. 23 is a diagram illustrating the disposition in plan view of a plurality of transistor cells, input capacitance elements, base ballast resistance elements, wiring lines, bumps, and so forth that constitute an amplifying circuit of a semiconductor device according to an eleventh embodiment.

FIG. 23 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the eleventh embodiment. In the tenth embodiment, the plurality of transistor cells 30 disposed on one side from the center in the alignment direction have the same positional relationship among the transistor cell 30, the collector extended wiring line 41C, and the base extended wiring line 41B in the alignment direction. In contrast to this, in the eleventh embodiment, two transistor cells 30 adjacent to each other in the alignment direction have a mirror-symmetry positional relationship among the transistor cells 30, the collector extended wiring lines 41C, and the base extended wiring lines 41B in the alignment direction. Each collector extended wiring line 41C is shared between the transistor cells 30 on both sides thereof. In addition, as in the tenth embodiment, each collector extended wiring line 41C is shared between two transistor cells 30 disposed at corresponding positions in the alignment direction. That is, each collector extended wiring line 41C is shared among four transistor cells 30.

Next, an excellent effect of the eleventh embodiment will be described.

In the eleventh embodiment, each collector extended wiring line 41C is shared between two transistor cells 30 on both sides thereof, and thus the lengths of the cell rows 33 can be decreased.

Twelfth Embodiment

Next, a semiconductor device according to a twelfth embodiment will be described with reference to FIG. 24. Hereinafter, the description of the same components as those of the semiconductor device according to the eleventh embodiment (FIG. 23) will be omitted.

Figure 24:
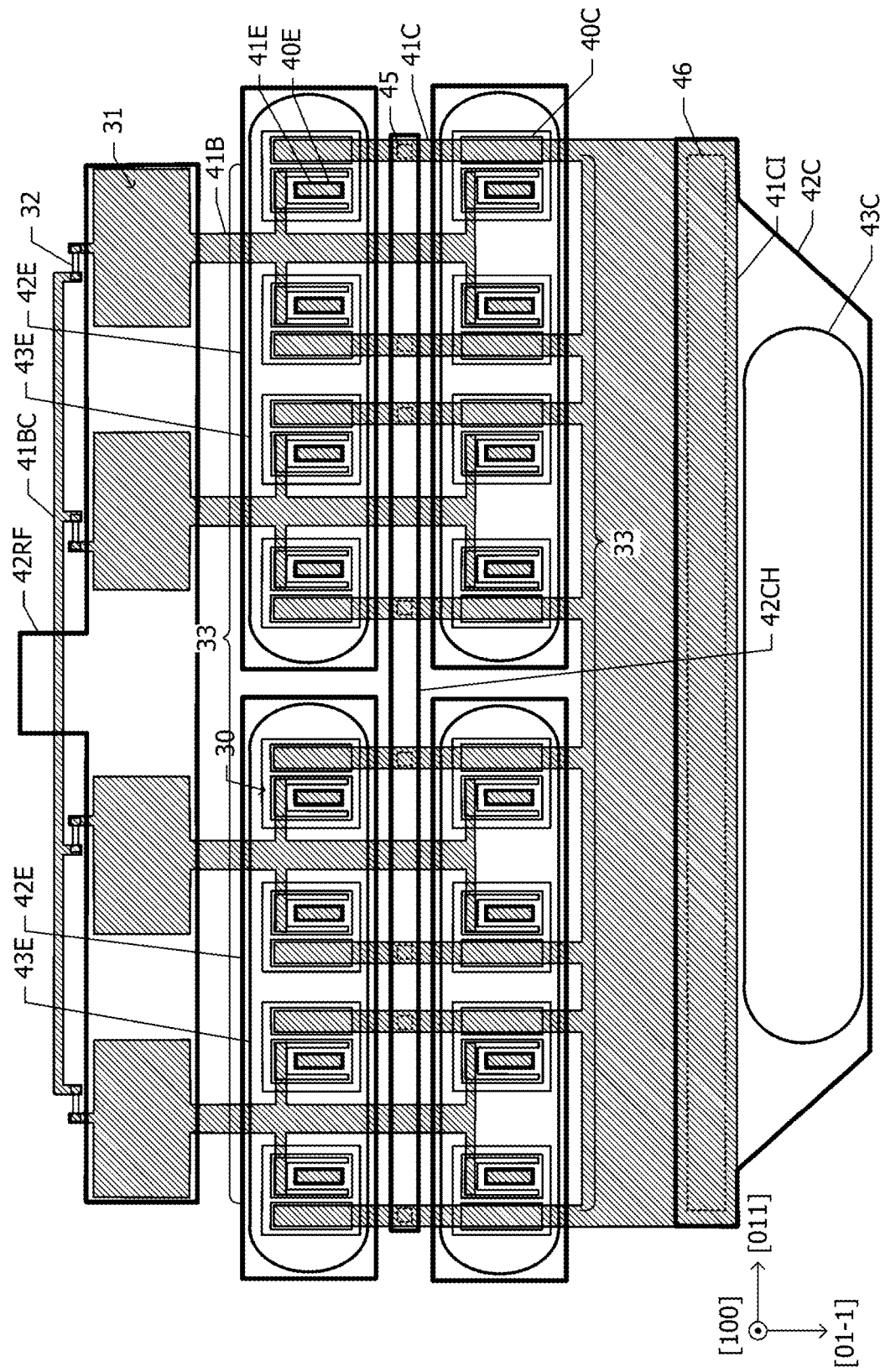
FIG. 24 is a diagram illustrating the disposition in plan view of a plurality of transistor cells, input capacitance elements, base ballast resistance elements, wiring lines, bumps, and so forth that constitute an amplifying circuit of a semiconductor device according to a twelfth embodiment.

FIG. 24 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the twelfth embodiment. In the eleventh embodiment, each collector extended wiring line 41C is shared between two transistor cells 30 on both sides thereof. In contrast to this, in the twelfth embodiment, the portion orthogonal to the alignment direction of each base extended wiring line 41B is shared between two transistor cells 30 on both sides thereof. Furthermore, as in the eleventh embodiment, the portion orthogonal to the alignment direction of each base extended wiring line 41B is shared between two transistor cells 30 disposed at corresponding positions in the alignment direction. Thus, the portion orthogonal to the alignment direction of each base extended wiring line 41B is shared among four transistor cells 30.

As a result, one input capacitance element 31 is disposed for four transistor cells 30 sharing one base extended wiring line 41B.

Next, an excellent effect of the twelfth embodiment will be described.

In the twelfth embodiment, the portion orthogonal to the alignment direction of each base extended wiring line 41B is shared between two transistor cells 30 on both sides thereof, and thus the lengths of the cell rows 33 can be decreased.

Next, a modification example of the twelfth embodiment will be described.

In the twelfth embodiment, each collector extended wiring line 41C is shared between two transistor cells 30 disposed at corresponding positions in the alignment direction. Furthermore, the collector extended wiring line 41C may be shared between two transistor cells 30 adjacent to each other in the alignment direction. In this case, each collector extended wiring line 41C is shared among four transistor cells 30.

Thirteenth Embodiment

Next, an amplifier module according to a thirteenth embodiment will be described with reference to FIGS. 25A, 25B, and 26.

Figure 25A:
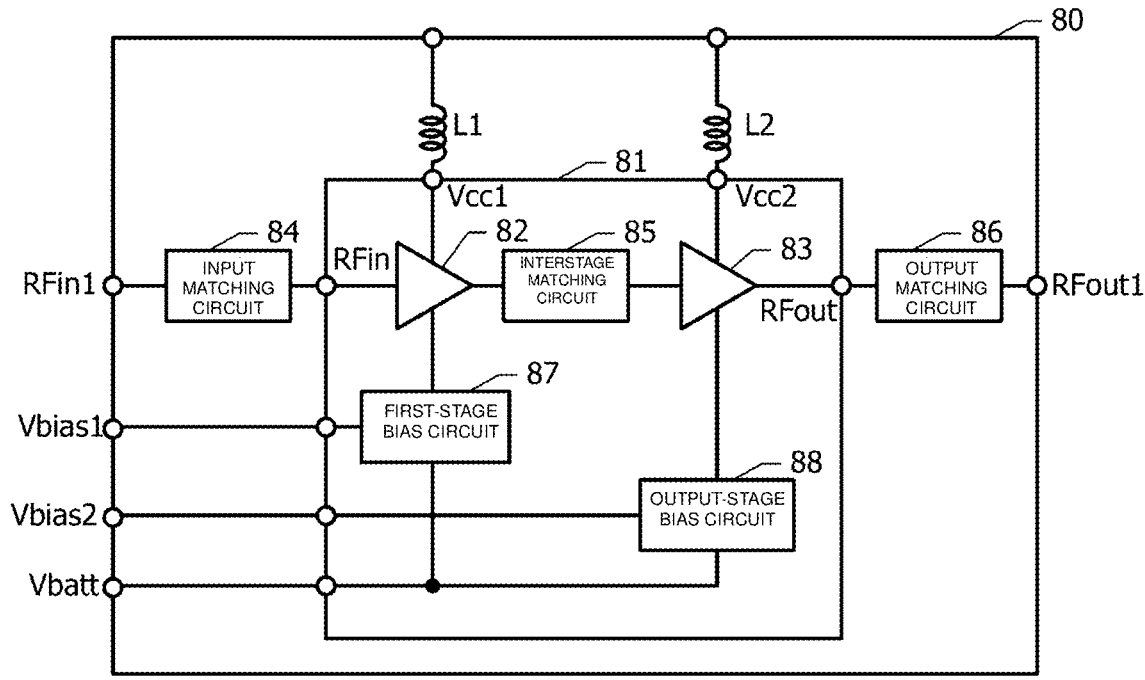
FIG. 25A is a bock diagram of an amplifier module according to a thirteenth embodiment.

FIG. 25A is a bock diagram of the amplifier module according to the thirteenth embodiment. The amplifier module according to the thirteenth embodiment includes a module substrate 80 and a semiconductor device 81 mounted on the module substrate 80.

The semiconductor device 81 includes a first-stage amplifying circuit 82, an interstage matching circuit 85, an output-stage amplifying circuit 83, a first-stage bias circuit 87, and an output-stage bias circuit 88. An input matching circuit 84, an output matching circuit 86, and inductors L1 and L2 are mounted on or in the module substrate 80. As the output-stage amplifying circuit 83, the amplifying circuit of the semiconductor device according to any one of the first to twelfth embodiments is used.

An RF signal input from an RF signal input terminal RFin1 of the module substrate 80 is input to an RF signal input terminal RFin of the semiconductor device 81 via the input matching circuit 84. The RF signal input to the RF signal input terminal RFin is amplified by the first-stage amplifying circuit 82 and is input to the RF input terminal 62 (FIG. 3) of the output-stage amplifying circuit 83 via the interstage matching circuit 85. The RF signal is then amplified by the output-stage amplifying circuit 83 and is output from an RF signal output terminal RFout (corresponding to the collector bump 43C (FIG. 3)). The RF signal output from the RF signal output terminal RFout is output from an RF signal output terminal RFout1 of the module substrate 80 via the output matching circuit 86 mounted on or in the module substrate 80.

A bias voltage is applied from a bias voltage terminal Vbatt to the first-stage bias circuit 87 and the output-stage bias circuit 88. On the basis of a control signal input from a bias control terminal Vbias1, the first-stage bias circuit 87 supplies a bias voltage and a bias current to the first-stage amplifying circuit 82. On the basis of a control signal input from a bias control terminal Vbias2, the output-stage bias circuit 88 supplies a bias voltage and a bias current to the base control terminal 61 (FIG. 3) of the output-stage amplifying circuit 83.

A DC power supply voltage is applied to a power supply terminal Vcc1 of the first-stage amplifying circuit 82 via the inductor L1. A DC power supply voltage is applied to a power supply terminal Vcc2 (corresponding to the collector bump 43C (FIG. 3)) of the output-stage amplifying circuit 83 via the inductor L2.

Figure 25B:
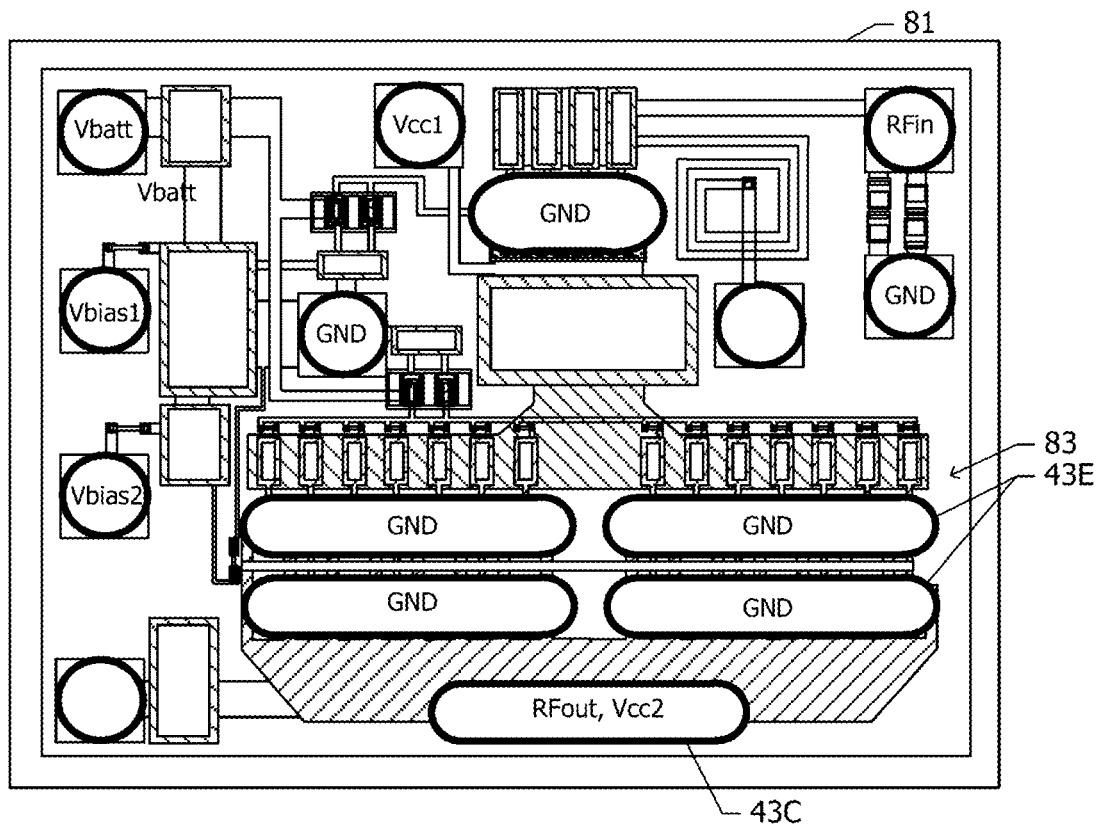
FIG. 25B is a diagram illustrating the circuit layout of a semiconductor device mounted on a module substrate of the amplifier module according to the thirteenth embodiment.

FIG. 25B is a diagram illustrating the circuit layout of the semiconductor device 81 mounted on or in the module substrate 80 (FIG. 25A) of the amplifier module according to the thirteenth embodiment. A plurality of bumps are disposed on a surface of the semiconductor device 81 facing the module substrate 80. The emitter bumps 43E (FIGS. 1 and 3) of the output-stage amplifying circuit 83 are connected to ground of the module substrate 80. The collector bump 43C (FIG. 1) of the output-stage amplifying circuit 83 corresponds to the power supply terminal Vcc2 and the RF signal output terminal RFout illustrated in FIG. 25A. In addition, bumps such as the bias voltage terminal Vbatt, the bias control terminals Vbias1 and Vbias2, the power supply terminal Vcc1, the RF signal input terminal RFin, and ground GND are disposed.

Figure 26:
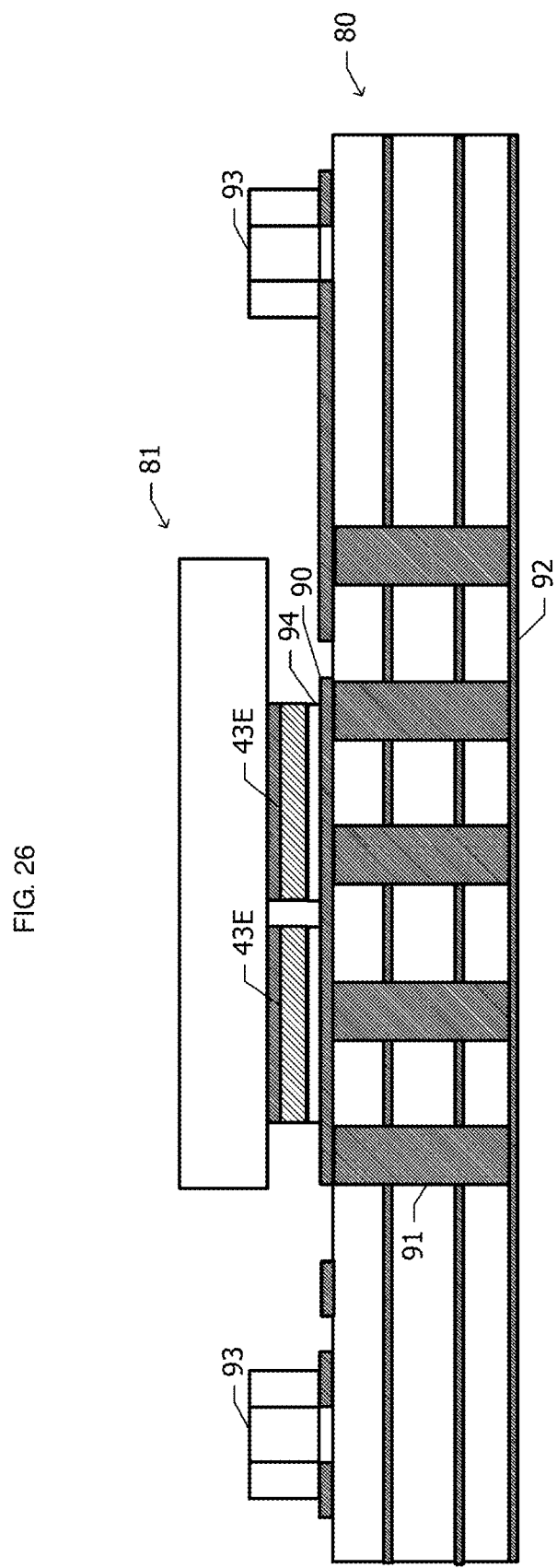
FIG. 26 is a cross-sectional view of the module substrate and the semiconductor device of the amplifier module according to the thirteenth embodiment.

FIG. 26 is a cross-sectional view of the module substrate 80 and the semiconductor device 81. The emitter bumps 43E disposed on the semiconductor device 81 are connected to a ground conductor 90 on or in a first surface of the module substrate 80 by using solder 94. A plurality of surface-mounted elements 93, in addition to the semiconductor device 81, are mounted on or in the first surface of the module substrate 80. A plurality of via conductors 91 extend from the ground conductor 90 on the first surface in the thickness direction, and reach a ground conductor 92 disposed on a second surface opposite to the first surface. The emitter bumps 43E and the plurality of via conductors 91 partially overlap each other in plan view. The ground conductor 92 on the second surface is connected to ground, such as a motherboard. The ground such as a motherboard also functions as a heat sink.

Next, an excellent effect of the thirteenth embodiment will be described.

The emitter bumps 43E, the solder 94, the ground conductor 90, the plurality of via conductors 91, and the ground conductor 92 serve as a heat radiation path for conducting heat generated by the plurality of transistor cells 30 of the output-stage amplifying circuit 83 to ground such as a motherboard. Because the emitter bumps 43E and the plurality of via conductors 91 are disposed so as to overlap each other in plan view, the heat resistance of the heat radiation path decreases. As a result, it is possible to suppress an increase in the temperature of the transistor cells 30.

In addition, because the amplifying circuit of the semiconductor device according to any one of the first to twelfth embodiments is used as the output-stage amplifying circuit 83, the same effect as the excellent effect of any one of the first to twelfth embodiments can be obtained.

Fourteenth Embodiment

Next, an amplifier module according to a fourteenth embodiment will be described with reference to FIG. 27. Hereinafter, the description of the same components as those of the amplifier module according to the thirteenth embodiment (FIGS. 25A, 25B, and 26) will be omitted.

Figure 27:
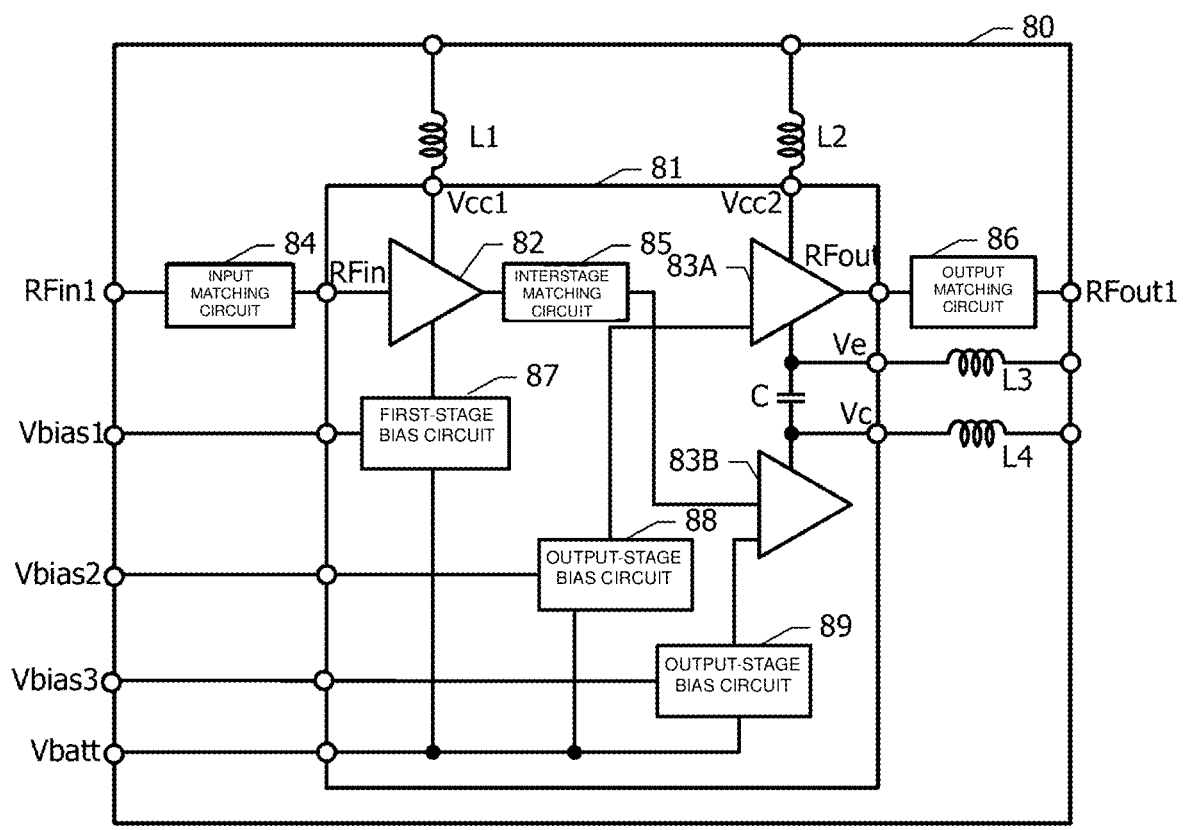
FIG. 27 is a bock diagram of an amplifier module according to a fourteenth embodiment.

FIG. 27 is a block diagram of an amplifier module according to the fourteenth embodiment. The amplifier module according to the thirteenth embodiment includes the module substrate 80 and the semiconductor device 81 mounted on the module substrate 80. In the thirteenth embodiment, the output-stage amplifying circuit 83 is formed of the plurality of transistor cells 30 connected in parallel to each other. In the fourteenth embodiment, the output-stage amplifying circuit 83 is formed of a first amplifying circuit 83A and a second amplifying circuit 83B that are stacked. As each of the first amplifying circuit 83A and the second amplifying circuit 83B, the amplifying circuit of the semiconductor device according to any one of the first to twelfth embodiments is used.

A transistor of the first amplifying circuit 83A and a transistor of the second amplifying circuit 83B are cascade-connected to each other via a capacitor C. The capacitor C connects in an AC manner and disconnects in a DC manner the emitter of the transistor of the first amplifying circuit 83A and the collector of the transistor of the second amplifying circuit 83B.

An RF signal amplified by the first-stage amplifying circuit 82 is input to the second amplifying circuit 83B via the interstage matching circuit 85. An output-stage bias circuit 89 supplies a bias voltage and a bias current to the transistor of the second amplifying circuit 83B on the basis of a control signal input from a bias control terminal Vbias3. A DC power supply voltage is applied to a power supply terminal Vc of the second amplifying circuit 83B (corresponding to the collector of the transistor) via an inductor L4.

A DC power supply voltage is applied to the power supply terminal Vcc2 of the first amplifying circuit 83A (corresponding to the collector of the transistor) via the inductor L2. A ground terminal Ve of the first amplifying circuit 83A (corresponding to the emitter bump 43E (FIG. 3)) is connected to ground via an inductor L3. On the basis of a control signal input from the bias control terminal Vbias2, the output-stage bias circuit 88 supplies a bias voltage and a bias current to the transistor of the first amplifying circuit 83A.

An RF signal amplified by the first amplifying circuit 83A and the second amplifying circuit 83B is output from the RF signal output terminal RFout (the collector terminal of the transistor of the first amplifying circuit 83A). The RF signal output from the RF signal output terminal RFout is output from the RF signal output terminal RFout1 of the module substrate 80 via the output matching circuit 86 mounted on or in the module substrate 80.

Next, an excellent effect of the fourteenth embodiment will be described.

In the fourteenth embodiment, the transistors are cascade-connected and thus maximum output power can be increased. Furthermore, because the amplifying circuit of the semiconductor device according to any one of the first to twelfth embodiments is used for each of the first amplifying circuit 83A and the second amplifying circuit 83B, the same excellent effect as the effect obtained in any one of the first to twelfth embodiments can be obtained.

Fifteenth Embodiment

Next, a semiconductor device according to a fifteenth embodiment will be described with reference to FIGS. 28A and 28B. Hereinafter, the description of the same components as those of the semiconductor device according to the first embodiment will be omitted.

Figure 28A:
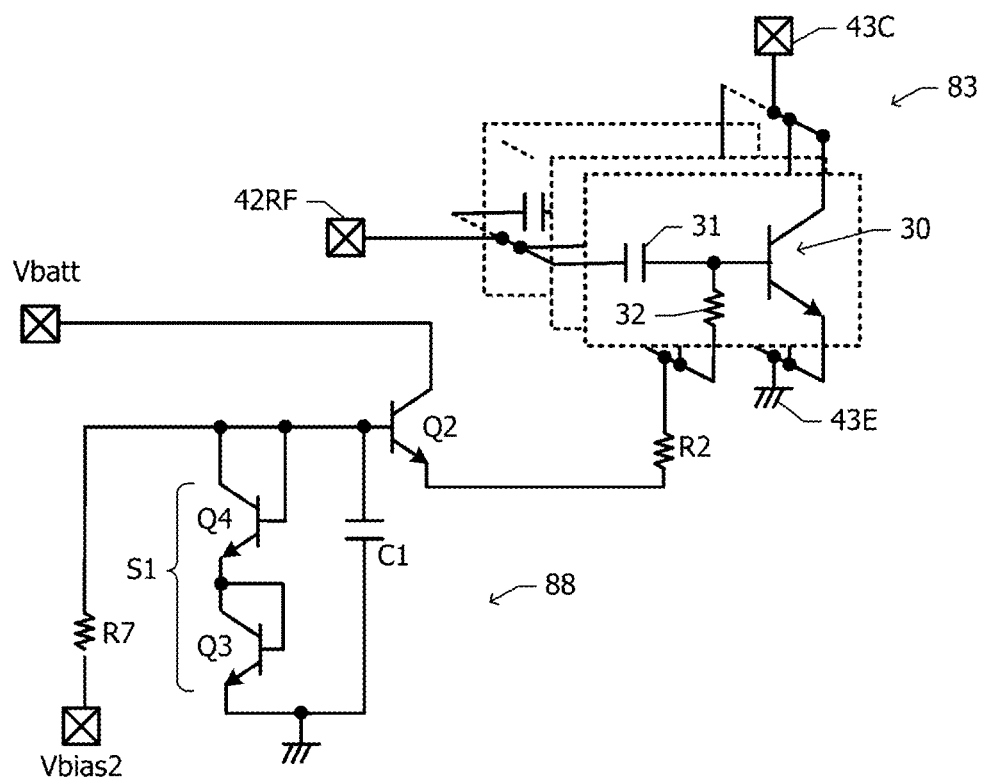
FIG. 28A is an equivalent circuit diagram of a semiconductor device according to a fifteenth embodiment.

FIG. 28A is an equivalent circuit diagram of the semiconductor device according to the fifteenth embodiment. The plurality of transistor cells 30 are connected in parallel to each other. The collectors and emitters of the plurality of transistor cells 30 are connected to the collector bump 43C and the emitter bump 43E, respectively. The bases of the plurality of transistor cells 30 are connected to the RF input wiring line 42RF via the respective input capacitance elements 31. Furthermore, the bases of the plurality of transistor cells 30 are connected to the output-stage bias circuit 88 via the respective base ballast resistance elements 32.

The output-stage bias circuit 88 includes a transistor Q2 operating as an emitter follower transistor that applies a base bias voltage and a base bias current to the transistor cells 30. The transistor Q2 may be, for example, an HBT. The transistor Q2 includes an emitter that is connected to the base ballast resistance elements 32 via a resistance element R2. The transistor Q2 includes a collector that is connected to the bias voltage terminal Vbatt.

Transistors Q3 and Q4 are connected in series to each other, thereby forming a temperature-characteristic compensation circuit S1. Each of the transistors Q3 and Q4 may be, for example, an HBT. Each of the transistors Q3 and Q4 is diode-connected and functions as a diode. Specifically, in each of the transistors Q3 and Q4, the collector and base are short-circuited. The base of the transistor Q4 and the base of the transistor Q2 are connected to each other so as to form a current mirror.

The bias control terminal Vbias2 is connected to ground via a resistance element R7 and the temperature-characteristic compensation circuit S1. A voltage applied to the bias control terminal Vbias2 is divided by the resistance element R7 and the temperature-characteristic compensation circuit S1 and is applied to the base of the transistor Q2. The base of the transistor Q2 is connected to ground via a bypass capacitance element C1.

Figure 28B:
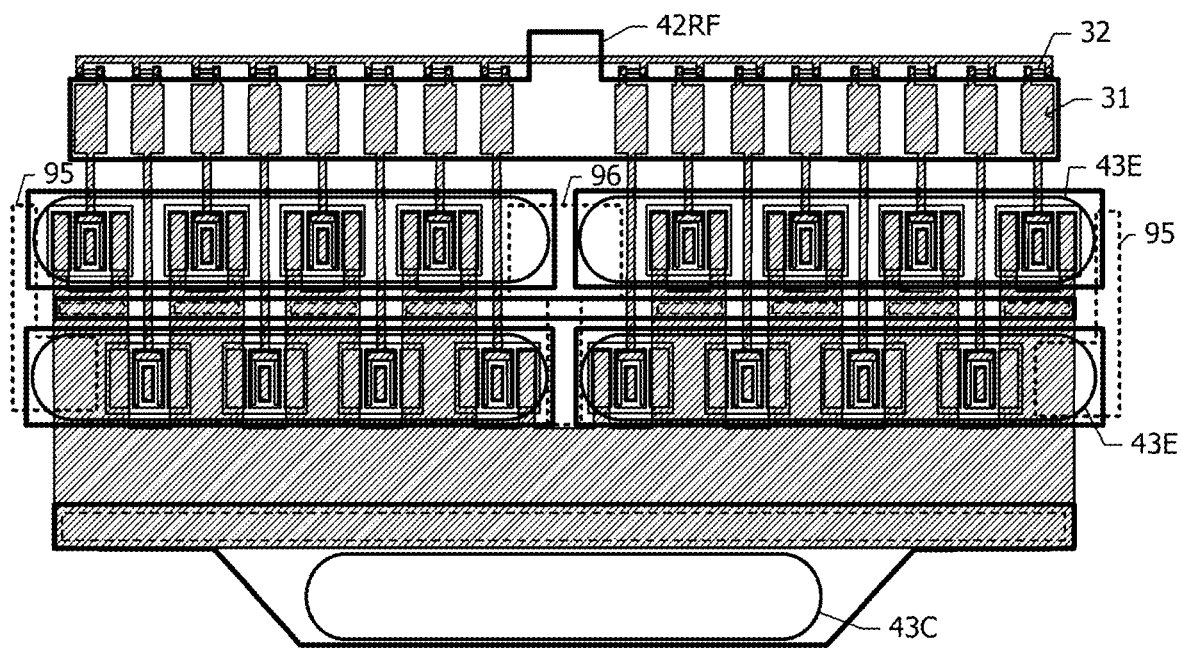
FIG. 28B is a diagram illustrating a positional relationship in plan view among a plurality of transistor cells, input capacitance elements, base ballast resistance elements, emitter bumps, a collector bump, and a transistor of an output-stage bias circuit (FIG. 28A)

FIG. 28B is a diagram illustrating a positional relationship in plan view among the plurality of transistor cells 30, the input capacitance elements 31, the base ballast resistance elements 32, the emitter bumps 43E, the collector bump 43C, and the transistor Q3 of the output-stage bias circuit 88.

The transistor Q3 is disposed in a near-end-portion region 95 on the extension of the cell rows 33 formed of the plurality of transistor cells 30 in the alignment direction or in an inner region 96 of the cell rows 33.

Next, an operation of the output-stage bias circuit 88 will be described. Because the transistor Q3 is disposed in the near-end-portion region 95 or the inner region 96 of the cell rows 33, the transistor Q3 is influenced by the heat generated by the transistor cells 30. An increase in the temperature of the transistor cells 30 causes an increase in the temperature of the transistor Q3. As a result, the bias voltage to be applied to the base of the transistor Q2 decreases. The decrease in the bias voltage to be applied to the base of the transistor Q2 causes a decrease in the bias voltage and bias current to be supplied to the bases of the transistor cells 30.

Such an increase in the temperature of the transistor cells 30 causes the temperature-characteristic compensation circuit 51 to decrease the bias voltage and bias current to be supplied to the bases of the transistor cells 30. As a result, the collector currents of the transistor cells 30 decrease. Thus, when an increase in the temperature of the transistor cells 30 causes an increase in collector current, the temperature-characteristic compensation circuit 51 suppresses the increase in collector current.

Next, an excellent effect of the fifteenth embodiment will be described.

In the fifteenth embodiment, the transistor Q3 of the temperature-characteristic compensation circuit 51 is disposed in the near-end-portion region 95 or the inner region 96 of the cell rows 33 of the plurality of transistor cells 30, and thus the transistor Q3 is susceptible to an increase in the temperature of the transistor cells 30. As a result, when the temperature of the transistor cells 30 rises, it is possible to sufficiently compensate for variation in transistor characteristics.

In a case where the transistor Q3 is disposed in the near-end-portion region 95 on the extension of the cell rows 33 or in the inner region 96 of the cell rows 33, the dimension in the direction orthogonal to the alignment direction of the output-stage amplifying circuit 83 hardly increases. In a case where the transistor Q3 is disposed in the near-end-portion region 95, the transistor Q3 may be disposed on the extension of a shorter one of the cell rows 33. With this disposition, it is possible to suppress an increase in the dimension in the alignment direction of a region including the output-stage amplifying circuit 83 and the transistor Q3.

To enhance a temperature compensation effect, the center-to-center distance between the transistor Q3 and the nearest transistor cell 30 may preferably be shorter than or equal to the pitch of the plurality of transistor cells 30.

Next, a modification example of the fifteenth embodiment will be described.

In the fifteenth embodiment, the transistor Q3 is disposed in the near-end-portion region 95 or the inner region 96 of the cell rows 33. Alternatively, the transistor Q4, instead of the transistor Q3, may be disposed in the near-end-portion region 95 or the inner region 96. Alternatively, both the transistors Q3 and Q4 may be disposed in the near-end-portion region 95 or the inner region 96.

Next, other modification examples of the fifteenth embodiment will be described with reference to FIGS. 29A and 29B.

Figure 29A:
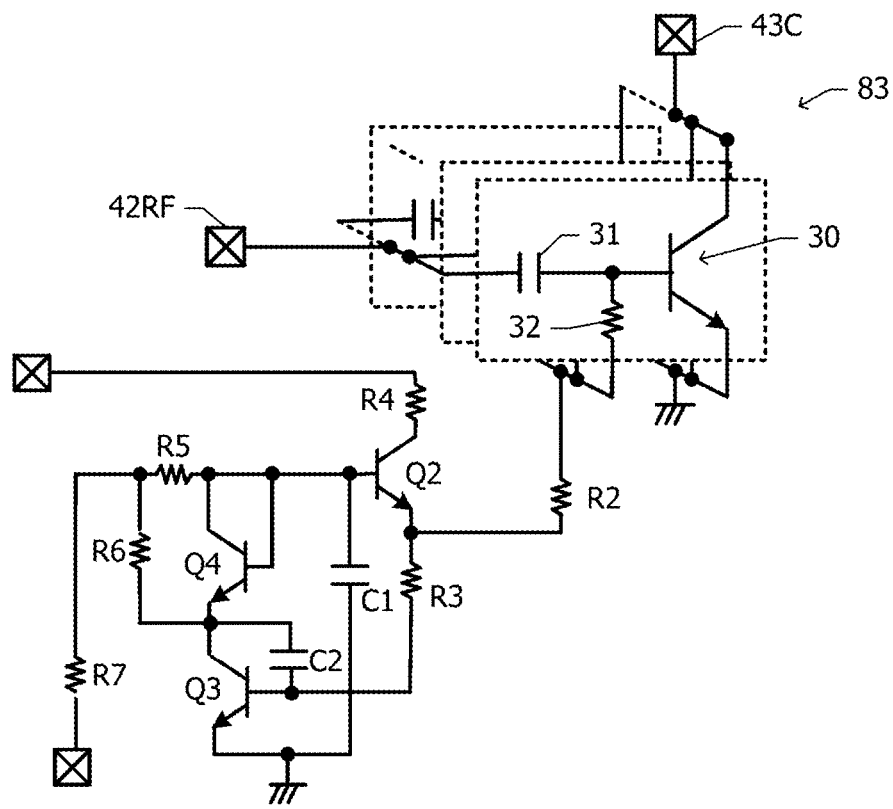
FIGS. 29A and 29B are equivalent circuit diagrams of semiconductor devices according to modification examples of the fifteenth embodiment.
Figure 29B:
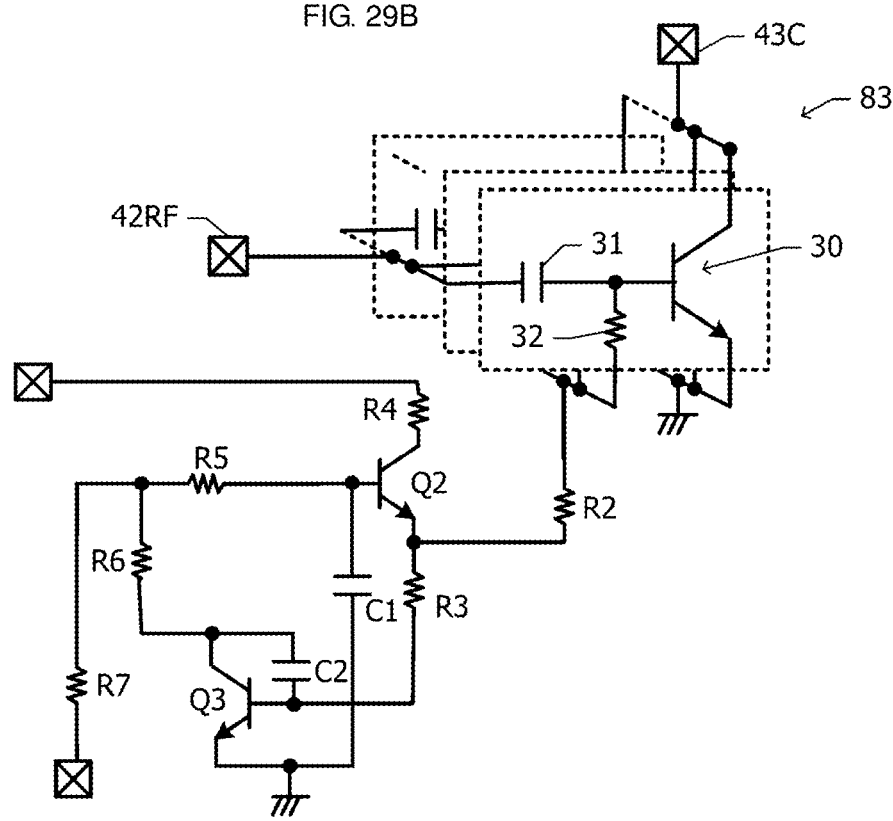

FIGS. 29A and 29B are equivalent circuit diagrams of semiconductor devices according to modification examples of the fifteenth embodiment. In these modification examples, the configuration of the output-stage bias circuit 88 is different from the configuration of the output-stage bias circuit 88 of the semiconductor device according to the fifteenth embodiment. Also in the modification example illustrated in FIG. 29A, the series-connection circuit formed of the transistors Q3 and Q4 functions as the temperature-characteristic compensation circuit S1. In the modification example illustrated in FIG. 29B, the transistor Q3 functions as the temperature-characteristic compensation circuit S1.

In the modification example illustrated in FIG. 29A, at least one of the transistors Q3 and Q4 is disposed in the near-end-portion region 95 or the inner region 96 of the cell rows 33 (FIG. 28B). In the modification example illustrated in FIG. 29B, the transistor Q3 is disposed in the near-end-portion region 95 or the inner region 96 of the cell rows 33 (FIG. 28B). Also in these modification examples, an excellent effect similar to that of the fifteenth embodiment can be obtained.

Sixteenth Embodiment

Next, a semiconductor device according to a sixteenth embodiment will be described with reference to FIGS. 30 to 32. Hereinafter, the description of the same components as those of the semiconductor device according to the eleventh embodiment (FIG. 23) will be omitted.

Figure 30:
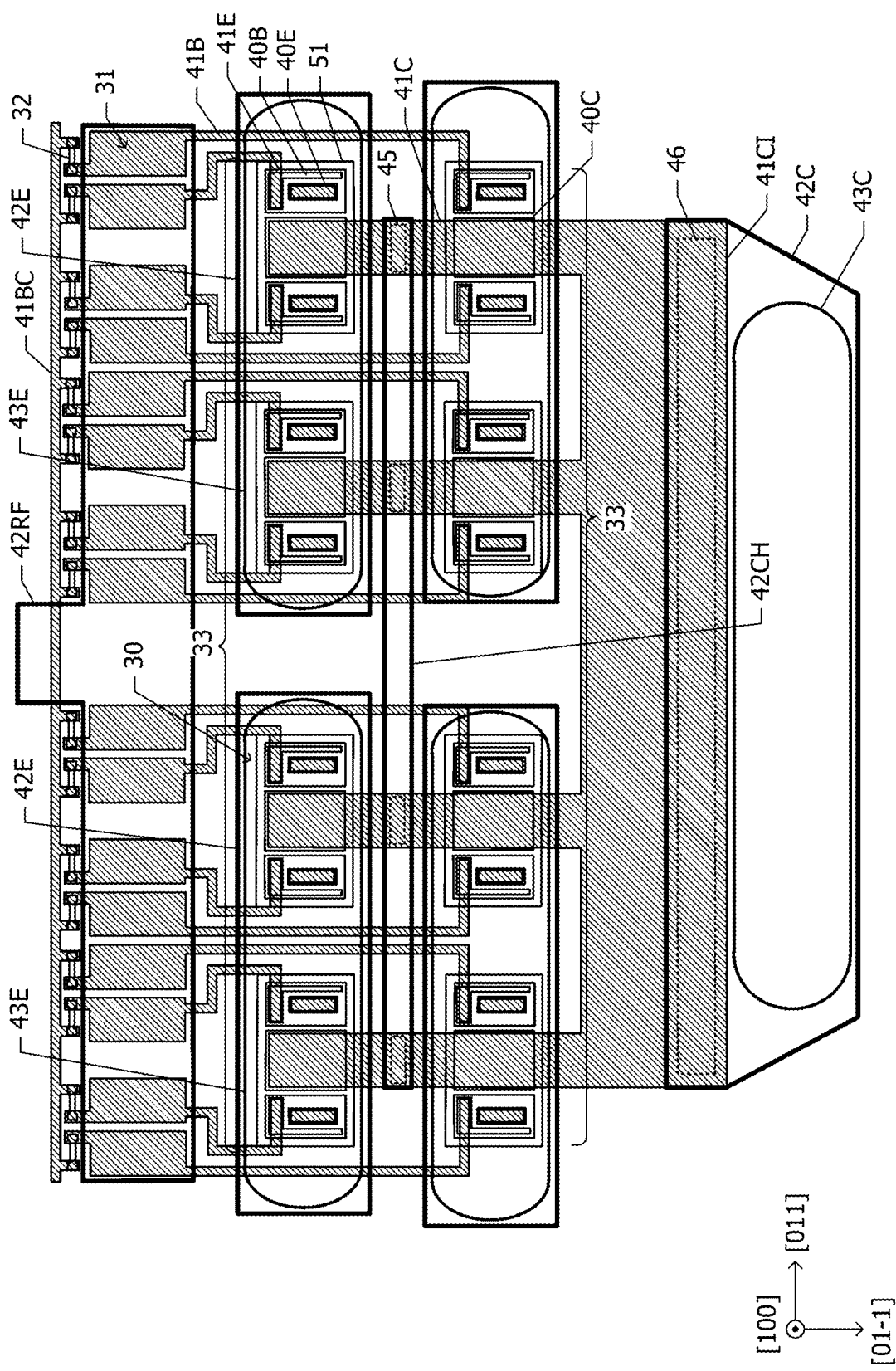
FIG. 30 is a diagram illustrating the disposition in plan view of a plurality of transistor cells, input capacitance elements, base ballast resistance elements, wiring lines, bumps, and so forth that constitute an amplifying circuit of a semiconductor device according to a sixteenth embodiment.

FIG. 30 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the sixteenth embodiment. When attention is focused on one transistor cell 30, in the eleventh embodiment, the base electrode 40B is disposed on both sides of the emitter electrode 40E in the alignment direction of the transistor cells 30 (FIG. 23). In contrast to this, in the sixteenth embodiment, the base electrode 40B is disposed on only one side of the emitter electrode 40E in the alignment direction.

In one transistor cell 30, the collector electrode 40C, the emitter electrode 40E, and the base electrode 40B are arranged in this order or reversed order in the alignment direction. In one sub-collector layer 51, two transistor cells 30 are disposed.

In one of the two transistor cells 30 adjacent to each other in the alignment direction and the other transistor cell 30, the arrangement orders of the collector electrode 40C, the emitter electrode 40E, and the base electrode 40B are reverse to each other. In the two transistor cells 30 disposed in one sub-collector layer 51, a pair of base electrodes 40B are disposed on the outmost side in the alignment direction, a pair of emitter electrodes 40E are disposed on the inner side thereof, and one collector electrode 40C is disposed on the inner side thereof. The collector electrode 40C is shared between the two transistor cells 30.

In the eleventh embodiment, the base electrodes 40B of the two transistor cells 30 arranged in the direction orthogonal to the alignment direction (FIG. 23) are connected to one input capacitance element 31 and one base ballast resistance element 32. In contrast to this, in the sixteenth embodiment, each transistor cell 30 is connected to a corresponding one of the input capacitance elements 31 and a corresponding one of the base ballast resistance elements 32.

Next, an excellent effect of the sixteenth embodiment will be described with reference to FIGS. 31A to 32. Three types of samples of the collector electrode 40C, the base electrode 40B, and the emitter electrode 40E with different relative positional relationships were prepared, and a transition voltage at a safe operating area (SOA) boundary and a voltage at a breakdown boundary of each sample were measured. Here, the SOA means a range of a collector voltage and collector current at which the transistor is able to stably operate without self-damage. The transition voltage is defined as a collector voltage at the time an SOA line as an SOA boundary suddenly decreases when the collector voltage is increased in a graph illustrating the relationship between the collector voltage and collector current. The breakdown boundary means a boundary of a range of a collector voltage and collector current that do not cause breakdown (short-circuit state or open-circuit state) of the transistor.

Figure 31A:
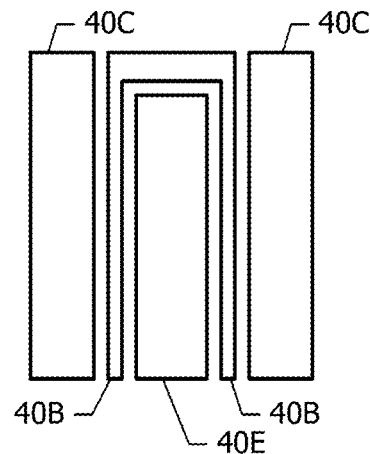
FIGS. 31A, 31B, and 31C are diagrams each illustrate a relative positional relationship among a collector electrode, a base electrode, and an emitter electrode of one transistor cell of one of three prepared samples.
Figure 31B:
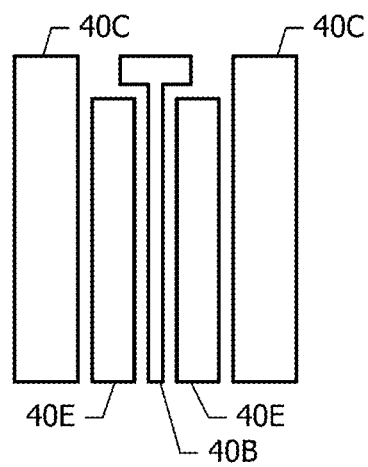
Figure 31C:
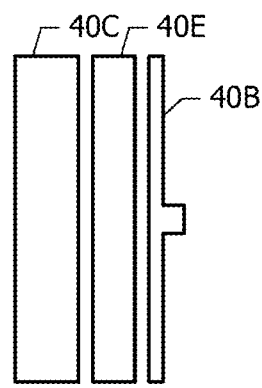

FIGS. 31A, 31B, and 31C each illustrate a relative positional relationship among the collector electrode 40C, the base electrode 40B, and the emitter electrode 40E of one transistor cell 30 of one of the three prepared samples.

In the sample illustrated in FIG. 31A (hereinafter referred to as sample A), the base electrode 40B is disposed on both sides of the emitter electrode 40E in the alignment direction, and the collector electrodes 40C are disposed on both sides thereof. This disposition is similar to, for example, the disposition in the semiconductor device according to the first embodiment (FIG. 1). In the sample illustrated in FIG. 31B (hereinafter referred to as sample B), the emitter electrodes 40E are disposed on both sides of the base electrode 40B in the alignment direction, and the collector electrodes 40C are disposed on both sides thereof. In the sample illustrated in FIG. 31C (hereinafter referred to as sample C), the collector electrode 40C, the emitter electrode 40E, and the base electrode 40B are arranged in this order in the alignment direction.

Figure 32:
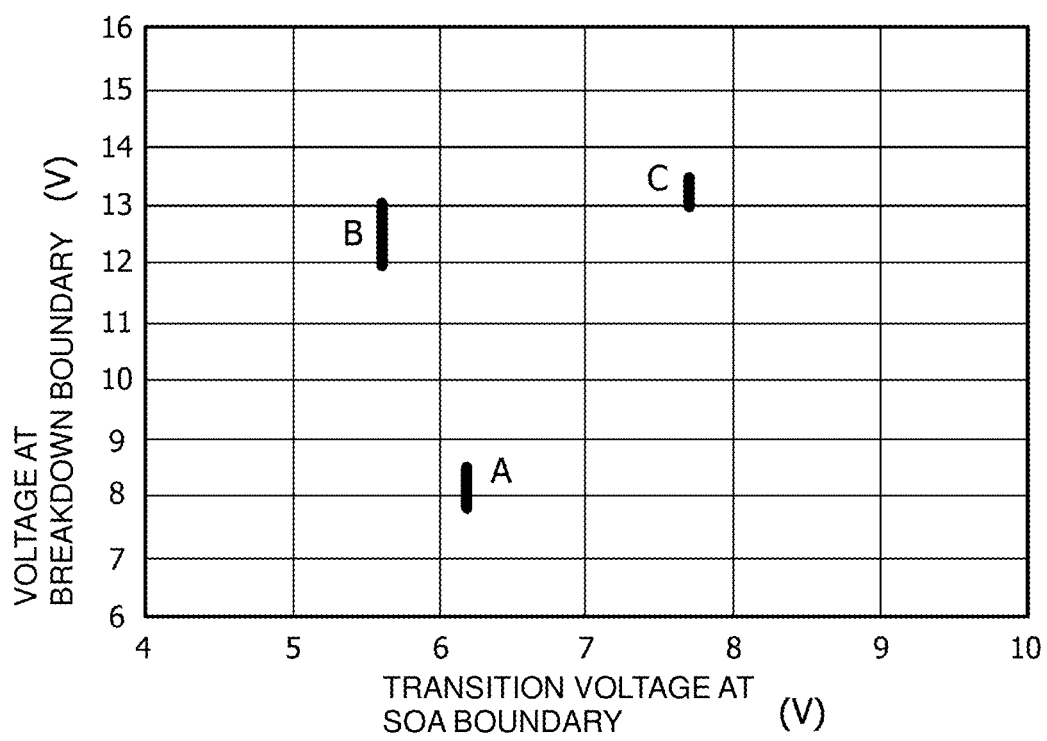
FIG. 32 is a graph illustrating measurement results of a transition voltage at an SOA boundary and a voltage at a breakdown boundary of each of sample A (FIG. 31A), sample B (FIG. 31B), and sample C (FIG. 31C)

FIG. 32 is a graph illustrating measurement results of the transition voltage at the SOA boundary and the voltage at the breakdown boundary of each of samples A, B, and C. The horizontal axis represents the transition voltage at the SOA boundary in the unit "V", and the vertical axis represents the voltage at the breakdown boundary in the unit "V".

Both the transition voltage at the SOA boundary and the voltage at the breakdown boundary are higher in sample C than in samples A and B. The reason for this is as follows. In samples A and B, an operating current flowing from the collector electrode 40C toward the emitter electrode 40E flows in both the rightward and leftward directions in the figure. Particularly in sample B, a current flowing from the collector electrode 40C on the left toward the emitter electrode 40E on the right and a current flowing from the collector electrode 40C on the right toward the emitter electrode 40E on the left are superimposed on each other between the two emitter electrodes 40E. When the balance between a rightward operating current and a leftward operating current is lost, the balance in the amount of heat generation between the right and left is lost. Such an imbalance in the amount of heat generation causes a difference in temperature, and accordingly more operating current concentrates in a region with relatively high temperature.

In sample C, only a rightward operating current in FIG. 31C flows. Thus, it is not necessary to keep the balance between operating currents flowing in two directions, and an imbalance between operating currents does not occur. Thus, an imbalance in the amount of heat generation between the right and left sides does not occur. As a result, it is considered that the SOA is larger and the withstand voltage is higher in sample C than in samples A and B.

In sample A, the base electrode 40B is disposed on both sides of the emitter electrode 40E. On the other hand, in samples B and C, the base electrode 40B is disposed on only one side of the emitter electrode 40E. It is understood from the results illustrated in FIG. 32 that the voltage at the breakdown boundary is higher in samples B and C than in sample A. Thus, to increase the voltage at the breakdown boundary, it is preferable to adopt a configuration in which the base electrode 40B is disposed on only one side of the emitter electrode 40E.

In the sixteenth embodiment, the base electrode 40B is disposed on only one side of the emitter electrode 40E. Thus, as in sample C, an excellent effect is obtained in which the SOA is larger and the withstand voltage is higher than in the configurations of samples A and B.

Furthermore, in the sixteenth embodiment, one collector electrode 40C is shared between two transistor cells 30. Thus, the chip size can be reduced compared with a configuration in which the collector electrode 40C is disposed for each of the transistor cells 30.

Next, a modification example of the sixteenth embodiment will be described.

In the sixteenth embodiment, the collector electrode 40C, the emitter electrode 40E, and the base electrode 40B are disposed in this order or reversed order in the alignment direction. That is, the emitter electrode 40E is disposed between the collector electrode 40C and the base electrode 40B. Alternatively, the collector electrode 40C, the base electrode 40B, and the emitter electrode 40E may be disposed in this order or reversed order in the alignment direction. That is, the base electrode 40B may be disposed between the collector electrode 40C and the emitter electrode 40E.

In the sixteenth embodiment, one input capacitance element 31 and one base ballast resistance element 32 are connected to one transistor cell 30. Alternatively, as in the eleventh embodiment (FIG. 23), one input capacitance element 31 and one base ballast resistance element 32 may be connected to two transistor cells 30 arranged in the direction orthogonal to the alignment direction.

Seventeenth Embodiment

Next, a semiconductor device according to a seventeenth embodiment will be described with reference to FIG. 33. Hereinafter, the description of the same components as those of the semiconductor device according to the sixteenth embodiment (FIG. 30) will be omitted.

Figure 33:
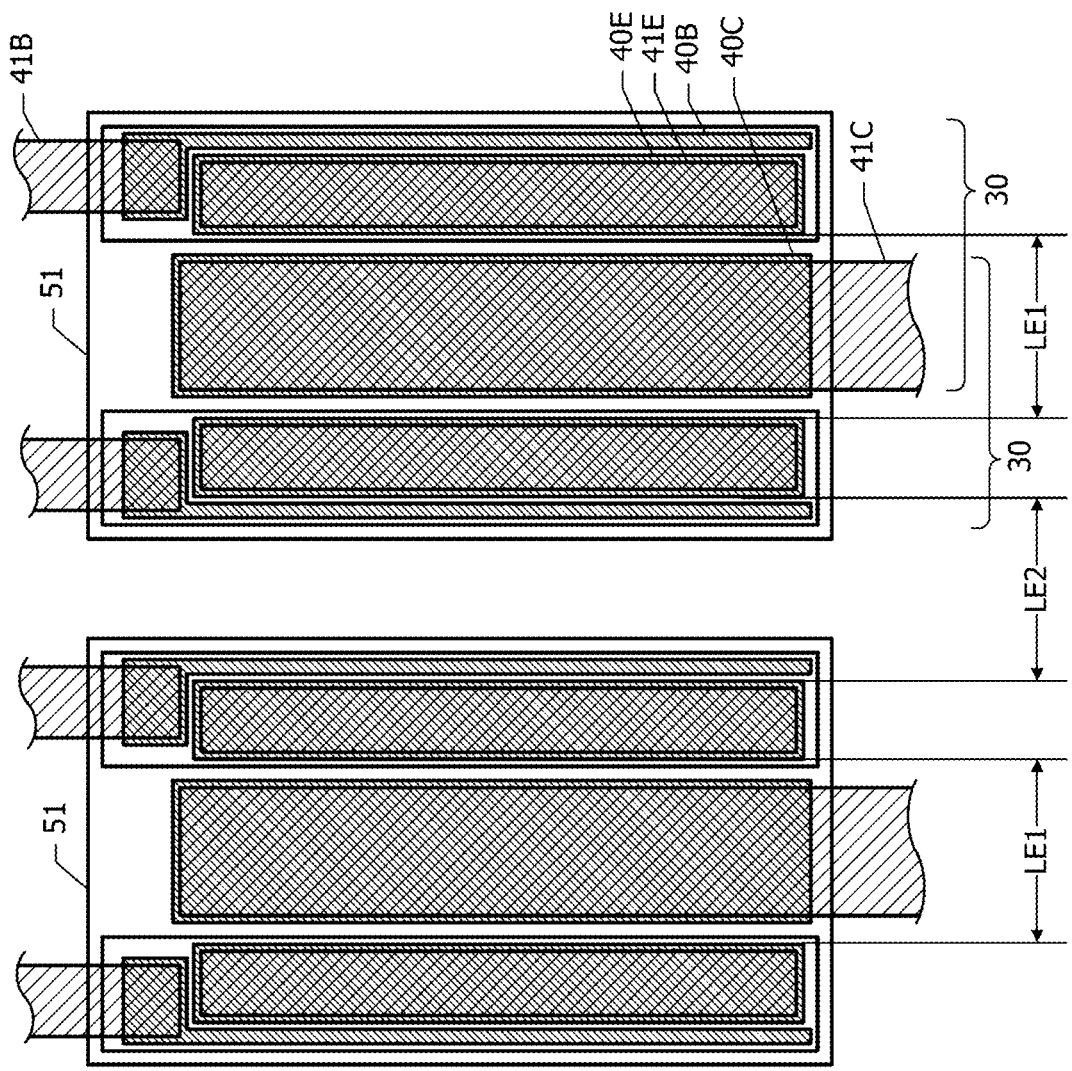
FIG. 33 is a diagram illustrating the disposition in plan view of four transistor cells of a semiconductor device according to a seventeenth embodiment.

FIG. 33 is a diagram illustrating the disposition in plan view of four transistor cells 30 of the semiconductor device according to the seventeenth embodiment. As in the sixteenth embodiment, in each transistor cell 30, the collector electrode 40C, the emitter electrode 40E, and the base electrode 40B are disposed in this order or reversed order in the alignment direction. Two transistor cells 30 are disposed in one sub-collector layer 51. The two transistor cells 30 share the one collector electrode 40C disposed at the center in the alignment direction.

The collector extended wiring line 41C is extended from the collector electrode 40C in the direction orthogonal to the alignment direction. The base extended wiring line 41B is extended from the base electrode 40B in the direction orthogonal to the alignment direction. The emitter wiring line 41E in the first layer is disposed so as to substantially overlap the emitter electrode 40E in plan view. In FIG. 33, the collector electrode 40C, the emitter electrode 40E, and the base electrode 40B are hatched with upward-sloping lines at relatively high density, and the collector extended wiring line 41C, the base extended wiring line 41B, and the emitter wiring line 41E are hatched with downward-sloping lines at relatively low density.

A distance LE1 between the two emitter electrodes 40E disposed in one sub-collector layer 51 is substantially equal to a distance LE2 between the two adjacent emitter electrodes 40E one of which is disposed in one of two sub-collector layers 51 adjacent to each other in the alignment direction and the other of which is disposed in the other sub-collector layer 51. In other words, the emitter electrodes 40E are disposed at equal intervals in the alignment direction. Each of the distance LE1 and the distance LE2 is, for example, about 10 µm or more and about 25 µm or less (i.e., from about 10 µm to about 25 µm).

For example, no collector electrode 40C is disposed between the two adjacent emitter electrodes 40E disposed in the adjacent sub-collector layers 51, and thus it is possible to make the distance LE2 shorter than the distance LE1. In the seventeenth embodiment, the distance LE2 is not made short, and is substantially equal to the distance LE1.

Next, an excellent effect of the seventeenth embodiment will be described.

When the transistor cells 30 operate, heat is generated mainly in regions where the emitter electrodes 40E are disposed in plan view. In the seventeenth embodiment, the emitter electrodes 40E are disposed at equal intervals in the alignment direction. Thus, a difference in temperature among the transistor cells 30 can be reduced compared with a configuration in which a heat generation region locally exists at a specific portion. In addition, compared with a configuration in which the distance LE2 is shorter than the distance LE1, the distribution density of heat generation regions is decreased as a whole, which makes it possible to suppress an increase in the temperature of the transistor cells 30. As a result, it is possible to suppress a decrease in gain resulting from an increase in temperature.

Next, a modification example of the seventeenth embodiment will be described.

In the seventeenth embodiment, the distance LE2 is substantially equal to the distance LE1. If both the distances are different from each other and if the difference is small, an effect substantially equivalent to that in a case where both the distances are substantially equal to each other can be obtained. For example, a shorter one of the distance LE1 and the distance LE2 may be about ½ or more of the longer one.

Eighteenth Embodiment

Next, a semiconductor device according to an eighteenth embodiment will be described with reference to FIGS. 34, 35A, and 35B. Hereinafter, the description of the same components as those of the semiconductor device according to the first embodiment illustrated in FIGS. 1 to 3 will be omitted.

Figure 34:
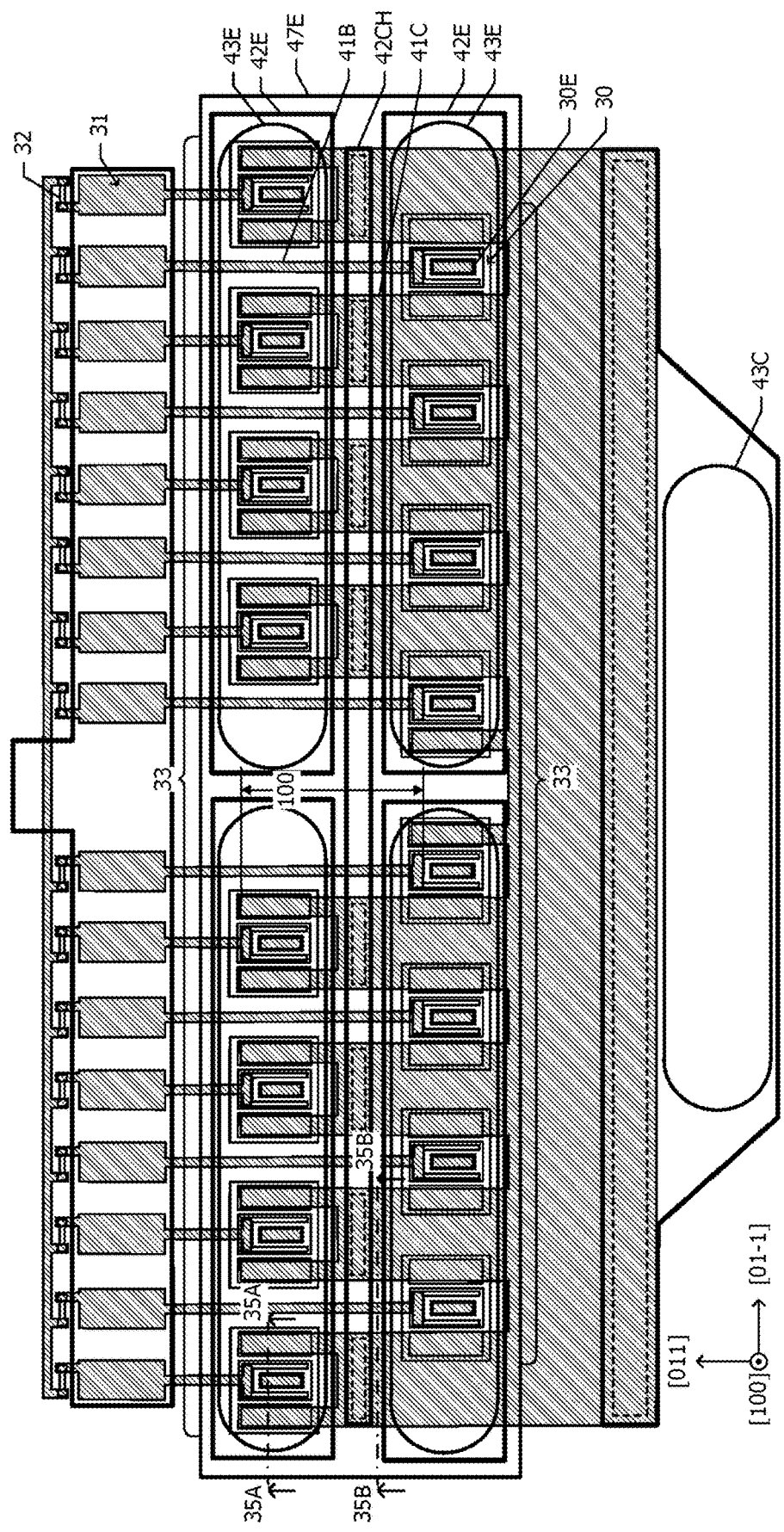
FIG. 34 is a diagram illustrating the disposition in plan view of a plurality of transistor cells, input capacitance elements, base ballast resistance elements, wiring lines, bumps, and so forth that constitute an amplifying circuit of a semiconductor device according to an eighteenth embodiment.
Figure 35A:
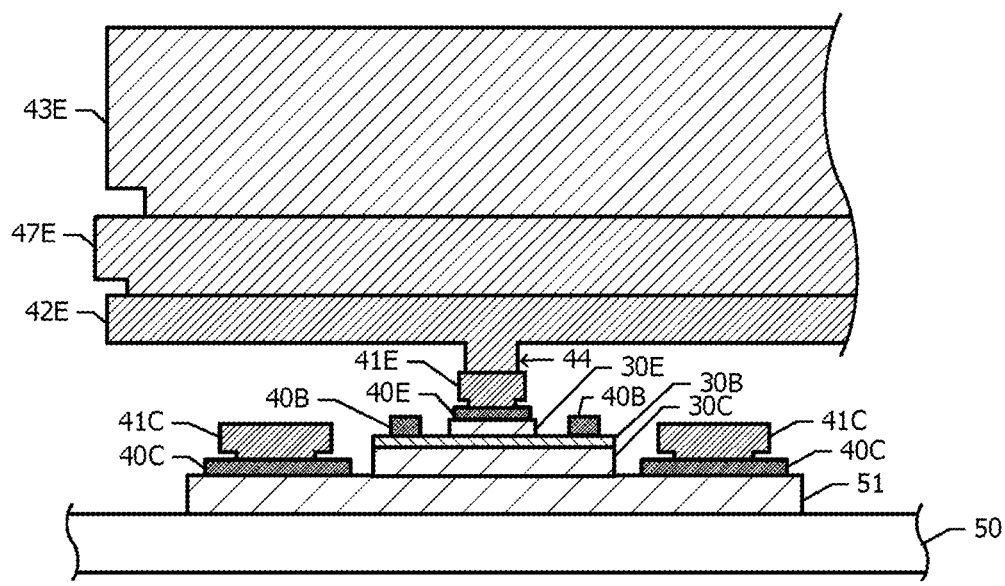
FIG. 35A is a cross-sectional view taken along a chain line 35A-35a in FIG. 34.

FIG. 34 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the eighteenth embodiment. FIG. 35A is a cross-sectional view taken along a chain line 35A-35A in FIG. 34. In the first embodiment (FIG. 2B), the emitter bump 43E is disposed directly on the emitter wiring line 42E in the second layer. In contrast to this, in the eighteenth embodiment, an emitter wiring line 47E in a third layer is disposed between the emitter wiring line 42E in the second layer and the emitter bump 43E, as illustrated in FIG. 35A.

As illustrated in FIG. 34, the emitter wiring line 47E in the third layer is disposed, in the alignment direction of the transistor cells 30 (the right-and-left direction in FIG. 34), over a range from the emitter region 30E of the transistor cell 30 at one end of the cell row 33 to the emitter region 30E of the transistor cell 30 at the other end. Furthermore, the emitter wiring line 47E in the third layer is disposed, in a direction orthogonal to the alignment direction of the transistor cells 30 (the up-and-down direction in FIG. 34), over a range from the emitter regions 30E of the transistor cells 30 in one cell row 33 to the emitter regions 30E of the transistor cells 30 in the other cell row 33.

As in the first embodiment (FIG. 1), two emitter bumps 43E are disposed for each cell row 33. The emitter regions 30E of the plurality of transistor cells 30 are each included in any one of the emitter bumps 43E in plan view.

As in the first embodiment (FIG. 1), the plurality of collector extended wiring lines 41C are extended from the plurality of transistor cells 30 to an outside of one of the two cell rows 33 (the lower cell row 33 in FIG. 34) in the direction orthogonal to the alignment direction (the up-and-down direction in FIG. 34). The plurality of base extended wiring lines 41B are extended from the plurality of transistor cells 30 to an outside of the other cell row 33 (the upper cell row 33 in FIG. 34) in the direction that is orthogonal to the alignment direction and that is opposite to the direction in which the plurality of collector extended wiring line 41C are extended (the upward direction in FIG. 34).

On both sides or one side of each base extended wiring line 41B extended from the one cell row 33 (the lower cell row 33 in FIG. 34) toward the other cell row 33 (the upper cell row 33 in FIG. 34), the collector extended wiring line 41C is disposed. The base extended wiring line 41B and the collector extended wiring line 41C adjacent to each other in the alignment direction of the plurality of transistor cells 30 each have a portion, the portions being disposed at positions corresponding to each other in the direction orthogonal to the alignment direction and being parallel to each other. The portion at which the both portions are parallel to each other is referred to as a parallel portion 100. The parallel portion 100 of the base extended wiring line 41B and the collector extended wiring line 41C is included in the emitter wiring line 47E in the third layer in plan view.

Next, an excellent effect of the eighteenth embodiment will be described. In the eighteenth embodiment, as in the first embodiment, an effect of reducing the parasitic inductance from the collector bump 43C to the transistor cells 30, an effect of reducing the area of a region occupied by the amplifying circuit on the substrate, and an effect of reducing the thermal resistance of a heat radiation path from the transistor cells 30 can be obtained.

Next, another excellent effect of the eighteenth embodiment will be described with reference to FIG. 35B.

Figure 35B:
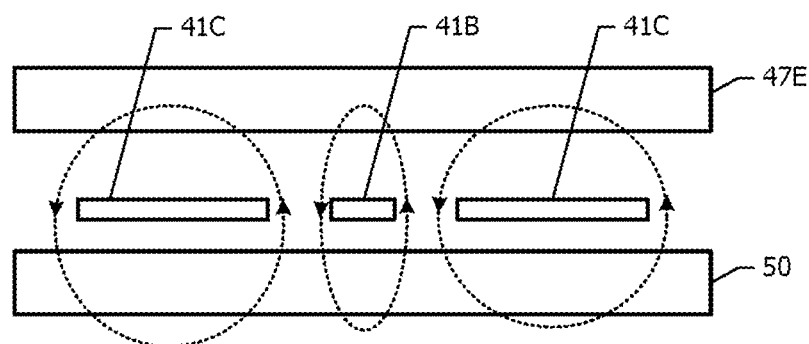
FIG. 35B is a schematic cross-sectional view taken along a chain line 35B-35B in FIG. 34.

FIG. 35B is a schematic cross-sectional view taken along a chain line 35B-35B in FIG. 34. The base extended wiring line 41B and the collector extended wiring lines 41C are disposed between the substrate 50 and the emitter wiring line 47E in the third layer. The emitter wiring line 47E in the third layer is connected to ground.

The emitter wiring line 47E disposed near the base extended wiring line 41B and the collector extended wiring line 41C has a function of blocking a magnetic field generated by a high-frequency current flowing through the base extended wiring line 41B and the collector extended wiring line 41C. Thus, a magnetic interaction that can occur between the base extended wiring line 41B and the collector extended wiring line 41C can be reduced. Furthermore, the effect of blocking a magnetic field enables the parasitic inductance of each of the base extended wiring line 41B and the collector extended wiring line 41C to be reduced.

Next, modification examples of the eighteenth embodiment will be described with reference to FIGS. 36 and 37.

Figure 36:
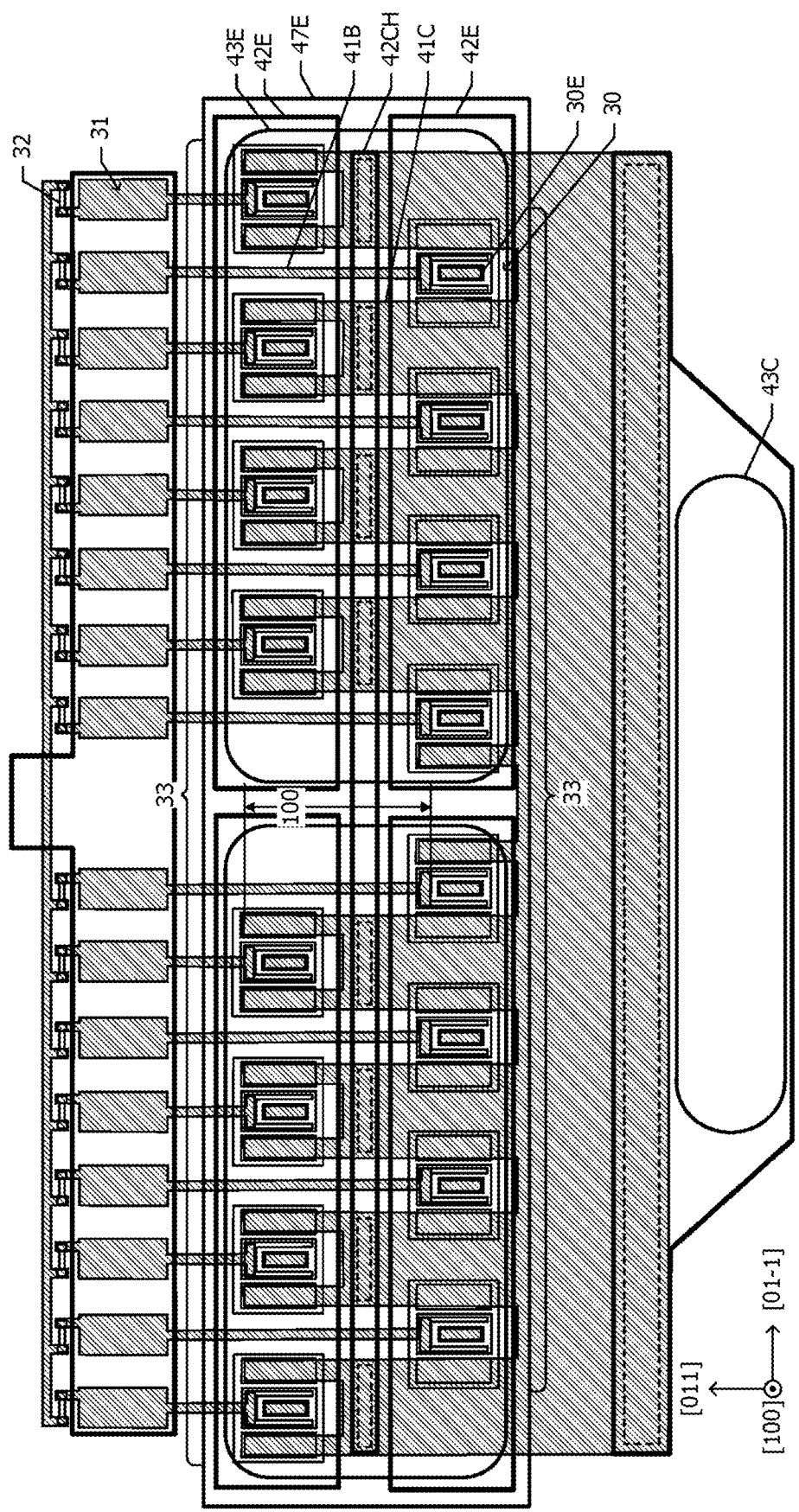
FIG. 36 is a diagram illustrating the disposition in plan view of a plurality of transistor cells, input capacitance elements, base ballast resistance elements, wiring lines, bumps, and so forth that constitute an amplifying circuit of a semiconductor device according to a modification example of the eighteenth embodiment.
Figure 37:
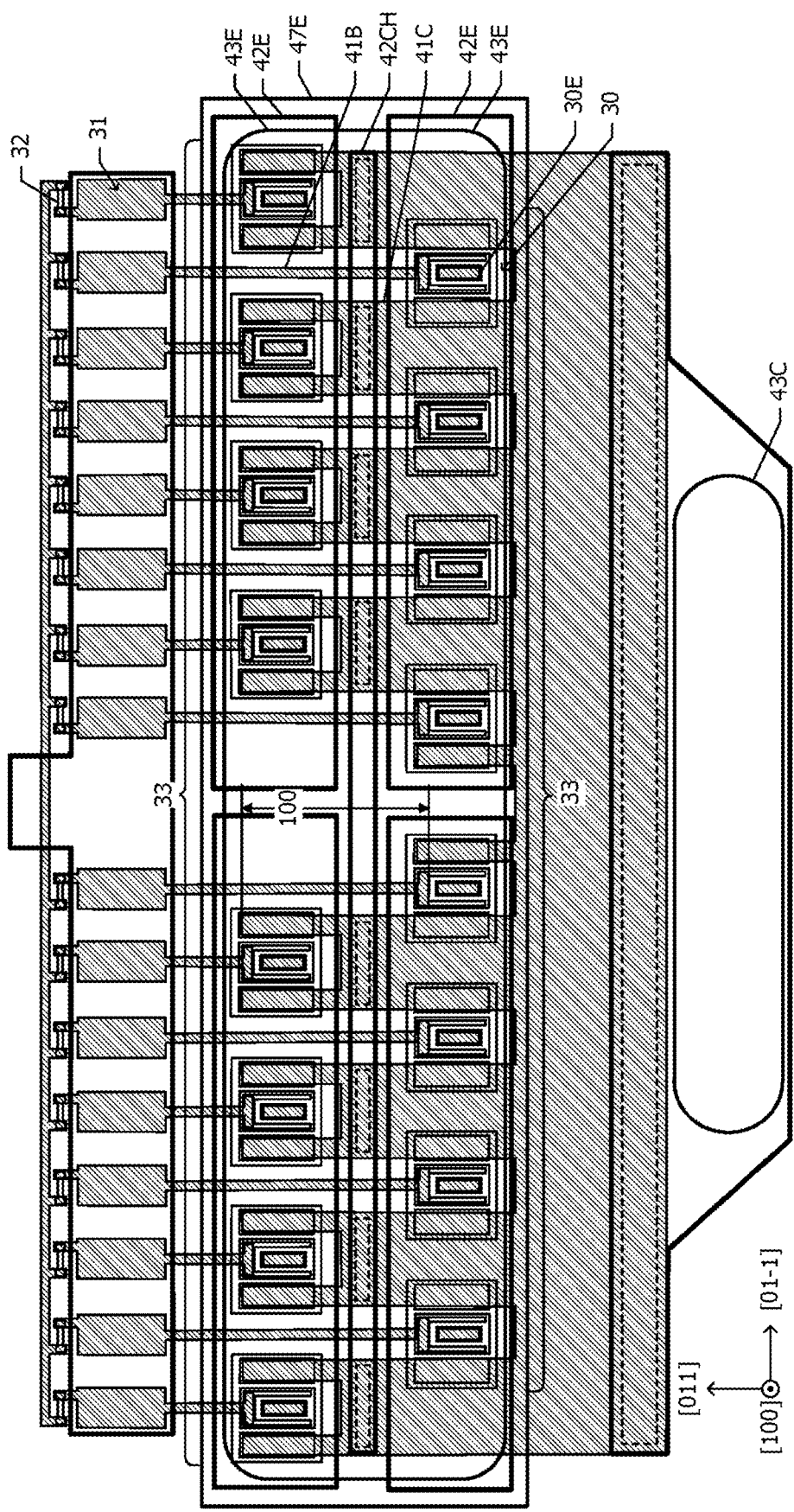
FIG. 37 is a diagram illustrating the disposition in plan view of a plurality of transistor cells, input capacitance elements, base ballast resistance elements, wiring lines, bumps, and so forth that constitute an amplifying circuit of a semiconductor device according to another modification example of the eighteenth embodiment.

FIGS. 36 and 37 are diagrams each illustrating the disposition in plan view of the plurality of transistor cells 30, the input capacitance elements 31, the base ballast resistance elements 32, the wiring lines, the bumps, and so forth that constitute an amplifying circuit of a semiconductor device according to a modification example of the eighteenth embodiment.

In the eighteenth embodiment (FIG. 34), two emitter bumps 43E are disposed for each cell row 33, and four emitter bumps 43E in total are disposed for the two cell rows 33. In contrast to this, in the modification example illustrated in FIG. 36, two emitter bumps 43E are disposed in the alignment direction of the transistor cells 30, and each emitter bump 43E is disposed in a continuous manner over a range from the emitter regions 30E of the plurality of transistor cells 30 of one cell row 33 to the emitter regions 30E of the plurality of transistor cells 30 of the other cell row 33. In the modification example illustrated in FIG. 37, one emitter bump 43E is disposed for the two cell rows 33. In each modification example, the emitter electrodes 40E of the plurality of transistor cells 30 are each included in any one of the emitter bumps 43E in plan view.

As in the modification examples illustrated in FIGS. 36 and 37, the number and disposition of emitter bumps 43E may be changed relative to the eighteenth embodiment (FIG. 34).

Nineteenth Embodiment

Next, a semiconductor device according to a nineteenth embodiment will be described with reference to FIGS. 38 and 39. Hereinafter, the description of the same components as those of the semiconductor device according to the eighteenth embodiment (FIGS. 34 and 35A) will be omitted.

Figure 38:
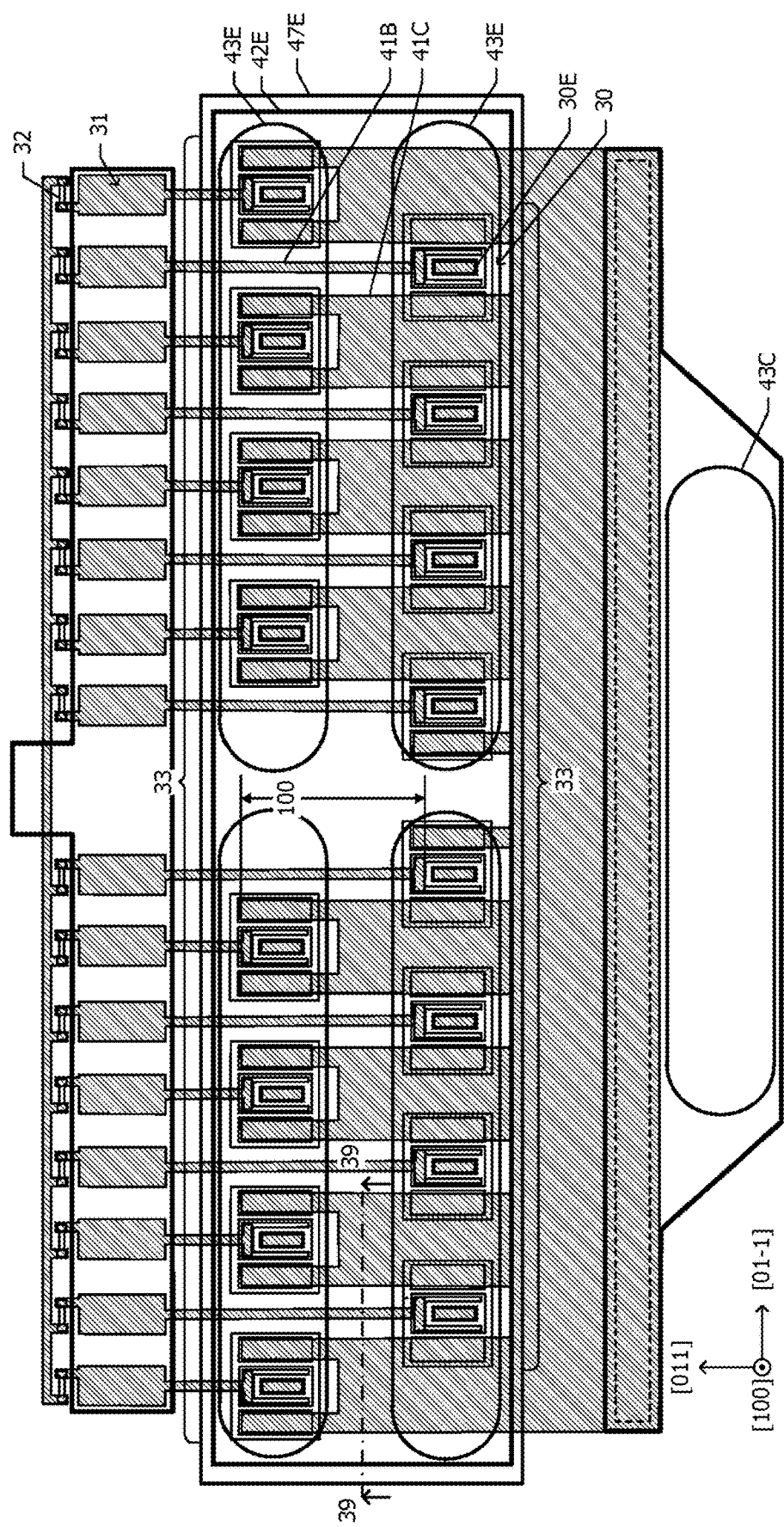
FIG. 38 is a diagram illustrating the disposition in plan view of a plurality of transistor cells, input capacitance elements, base ballast resistance elements, wiring lines, bumps, and so forth that constitute an amplifying circuit of a semiconductor device according to a nineteenth embodiment.

FIG. 38 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the nineteenth embodiment. In the eighteenth embodiment (FIG. 34), the collector intermediate integrated wiring line 42CH is disposed as in the first embodiment (FIG. 1). In the nineteenth embodiment, the collector intermediate integrated wiring line is not disposed.

In the nineteenth embodiment, the emitter wiring line 42E in the second layer is disposed in the region where the collector intermediate integrated wiring line 42CH is disposed in the first embodiment and the eighteenth embodiment. More specifically, the emitter wiring line 42E in the second layer is disposed in a continuous manner over a range from one cell row 33 to the other cell row 33. The emitter wiring line 47E in the third layer is disposed between the emitter bumps 43E and the emitter wiring line 42E in the second layer, as in the eighteenth embodiment (FIG. 35A).

Next, an excellent effect of the nineteenth embodiment will be described.

In the nineteenth embodiment, the collector intermediate integrated wiring line 42CH (FIGS. 1 and 34) is not disposed, and thus an effect obtained by disposing the collector intermediate integrated wiring line 42CH, that is, an effect of reducing the parasitic inductance from the collector bump 43C to the transistor cells 30, is not obtained. However, in the nineteenth embodiment, as in the first embodiment, an effect of reducing the area of a region occupied by the amplifying circuit on the substrate, and an effect of reducing the thermal resistance of a heat radiation path from the transistor cells 30 can be obtained.

Next, another excellent effect of the nineteenth embodiment will be described with reference to FIG. 39.

Figure 39:
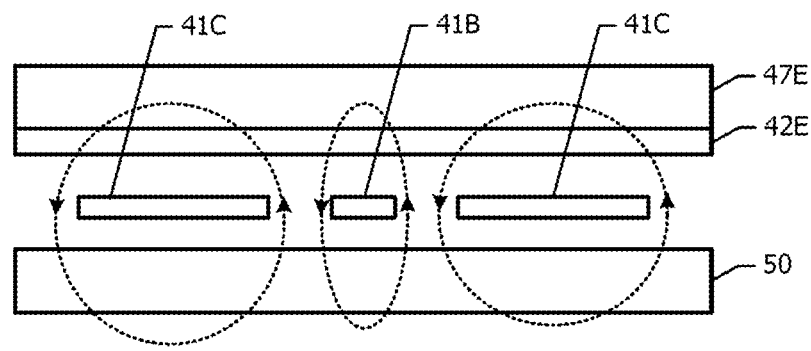
FIG. 39 is a schematic cross-sectional view taken along a chain line 39-39 in FIG. 356

FIG. 39 is a schematic cross-sectional view taken along a chain line 39-39 in FIG. 38. In the eighteenth embodiment (FIG. 35B), the emitter wiring line 47E in the third layer is disposed above the base extended wiring line 41B and the collector extended wiring lines 41C. In contrast to this, in the nineteenth embodiment, as illustrated in FIG. 39, both the emitter wiring line 42E in the second layer and the emitter wiring line 47E in the third layer are disposed above the base extended wiring line 41B and the collector extended wiring lines 41C.

Thus, in the nineteenth embodiment, the distance from the base extended wiring line 41B and the collector extended wiring line 41C to the ground conductor (the emitter wiring line 42E in the second layer) is shorter than in the eighteenth embodiment (FIG. 35B). As a result, a stronger effect of blocking a magnetic field by the ground conductor is obtained. Accordingly, an effect of reducing a magnetic interaction that can occur between the base extended wiring line 41B and the collector extended wiring line 41C, and an effect of reducing the parasitic inductance of the base extended wiring line 41B and the collector extended wiring line 41C are greater than in the eighteenth embodiment.

Next, modification examples of the nineteenth embodiment will be described with reference to FIGS. 40, 41, and 42.

Figure 40:
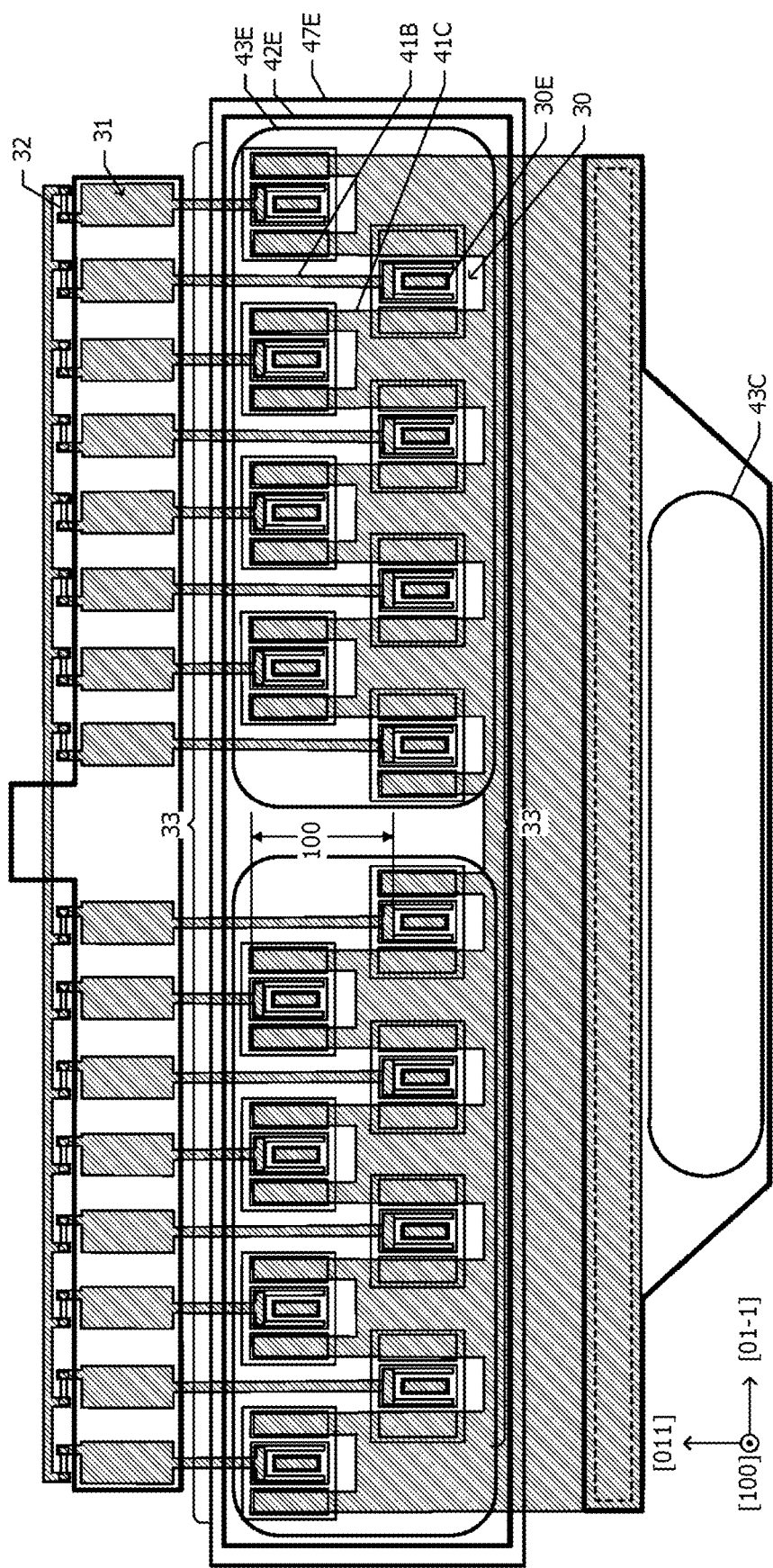
FIG. 40 is a diagram illustrating the disposition in plan view of a plurality of transistor cells, input capacitance elements, base ballast resistance elements, wiring lines, bumps, and so forth that constitute an amplifying circuit of a semiconductor device according to a modification example of the nineteenth embodiment.
Figure 41:
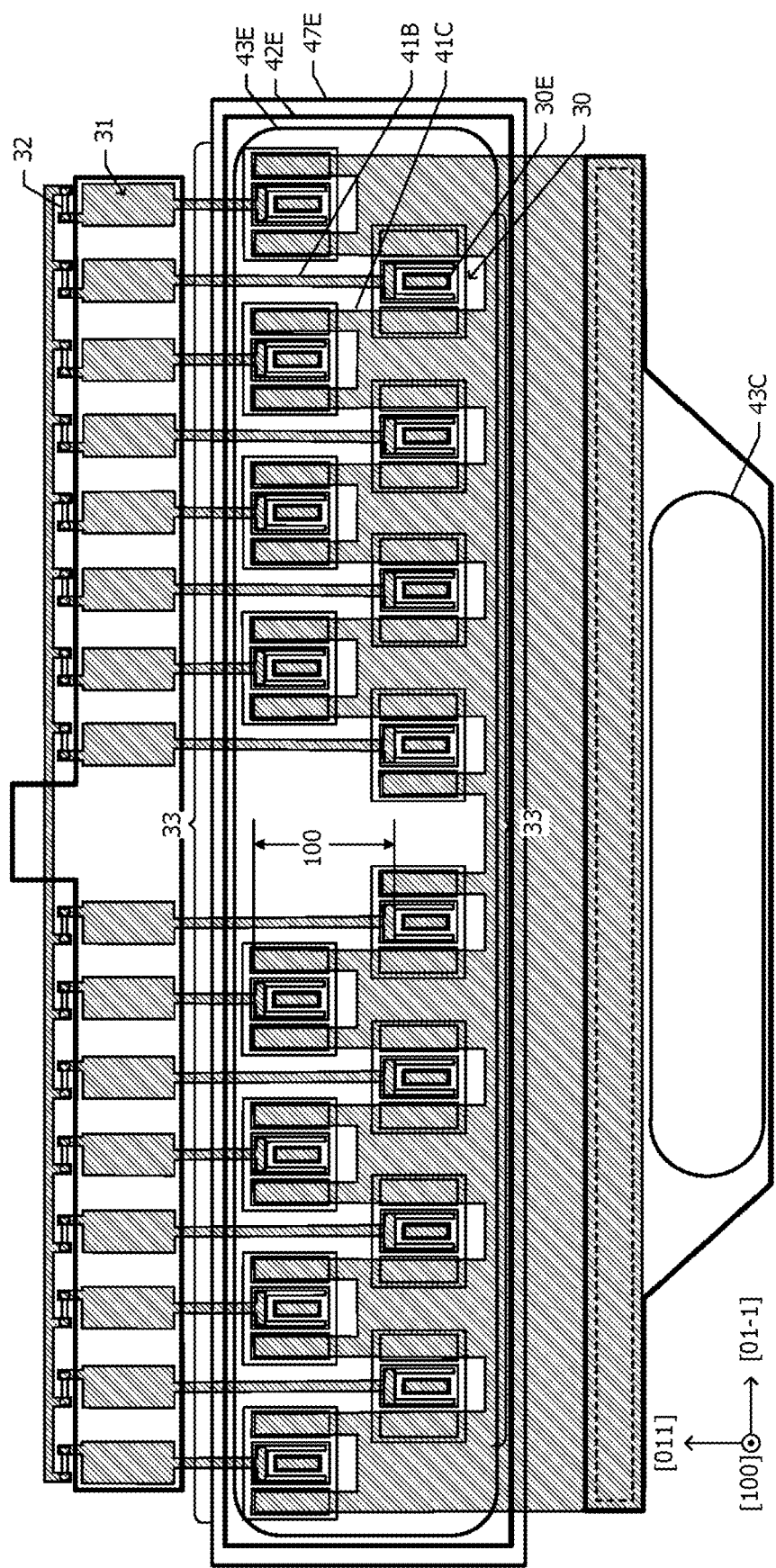
FIG. 41 is a diagram illustrating the disposition in plan view of a plurality of transistor cells, input capacitance elements, base ballast resistance elements, wiring lines, bumps, and so forth that constitute an amplifying circuit of a semiconductor device according to another modification example of the nineteenth embodiment.
Figure 42:
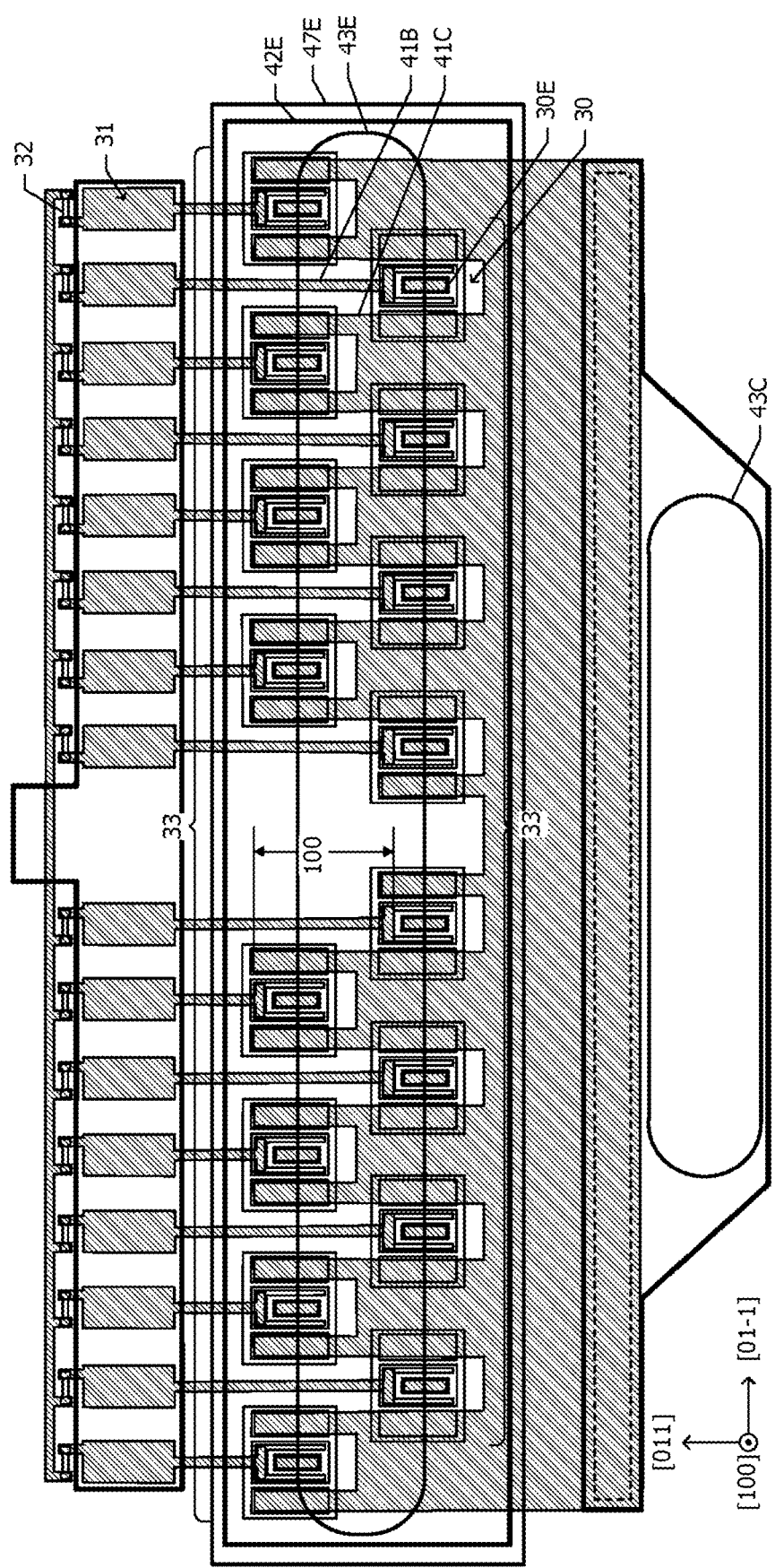
FIG. 42 is a diagram illustrating the disposition in plan view of a plurality of transistor cells, input capacitance elements, base ballast resistance elements, wiring lines, bumps, and so forth that constitute an amplifying circuit of a semiconductor device according to still another modification example of the nineteenth embodiment.

FIGS. 40, 41, and 42 are diagrams each illustrating the disposition in plan view of the plurality of transistor cells 30, the input capacitance elements 31, the base ballast resistance elements 32, the wiring lines, the bumps, and so forth that constitute an amplifying circuit of a semiconductor device according to a modification example of the nineteenth embodiment.

In the nineteenth embodiment (FIG. 38), two emitter bumps 43E are disposed for each cell row 33, and four emitter bumps 43E in total are disposed for the two cell rows 33. In contrast to this, in the modification example illustrated in FIG. 40, two emitter bumps 43E are disposed in the alignment direction of the transistor cells 30, and each emitter bump 43E is disposed in a continuous manner over a range from the emitter regions 30E of the plurality of transistor cells 30 of one cell row 33 to the emitter regions 30E of the plurality of transistor cells 30 of the other cell row 33. In the modification example illustrated in FIG. 41, one emitter bump 43E is disposed for the two cell rows 33. In each modification example, the emitter regions 30E of the plurality of transistor cells 30 are each included in any one of the emitter bumps 43E in plan view.

In the nineteenth embodiment, it is necessary to ensure a minimum distance based on a process rule between two emitter bumps 43E in the direction orthogonal to the alignment direction of the transistor cells 30. The distance between the cell rows 33 is set in accordance with the distance between the emitter bumps 43E. Thus, the minimum distance between the cell rows 33 is restricted by the minimum distance based on the process rule of the step of forming the emitter bumps 43E.

In contrast to this, in the modification examples illustrated in FIGS. 40 and 41, a plurality of emitter bumps 43E are not arranged in the direction orthogonal to the alignment direction of the transistor cells 30, and thus the distance between the two cell rows 33 can be shortened compared to the nineteenth embodiment (FIG. 38). A shorter distance between the two cell rows 33 makes the parallel portion 100 of the base extended wiring line 41B and the collector extended wiring line 41C shorter. Accordingly, an effect of reducing a magnetic interaction that can occur between the base extended wiring line 41B and the collector extended wiring line 41C, and an effect of reducing the parasitic inductance of the base extended wiring line 41B and the collector extended wiring line 41C are greater than in the eighteenth embodiment.

In the modification example illustrated in FIG. 42, partial regions of the emitter regions 30E of the plurality of transistor cells 30 are outside the emitter bump 43E in plan view. This positional relationship makes it possible to obtain an effect that a stress generated in the emitter bump 43E at the time of flip-chip bonding the semiconductor device on a module substrate or the like is less likely to affect the transistor cells 30.

In the modification example illustrated in FIG. 42, the cross-sectional area of a heat radiation path of heat generated by the transistor cells 30 is smaller than in the modification examples illustrated in FIGS. 40 and 41. Thus, the modification examples illustrated in FIGS. 40 and 41 are more advantageous than the modification example illustrated in FIG. 42 from the viewpoint of reducing thermal resistance.

Twentieth Embodiment

Next, a semiconductor device according to a twentieth embodiment will be described with reference to FIGS. 43 and 44. Hereinafter, the description of the same components as those of the semiconductor device according to the nineteenth embodiment (FIG. 38) will be omitted.

Figure 43:
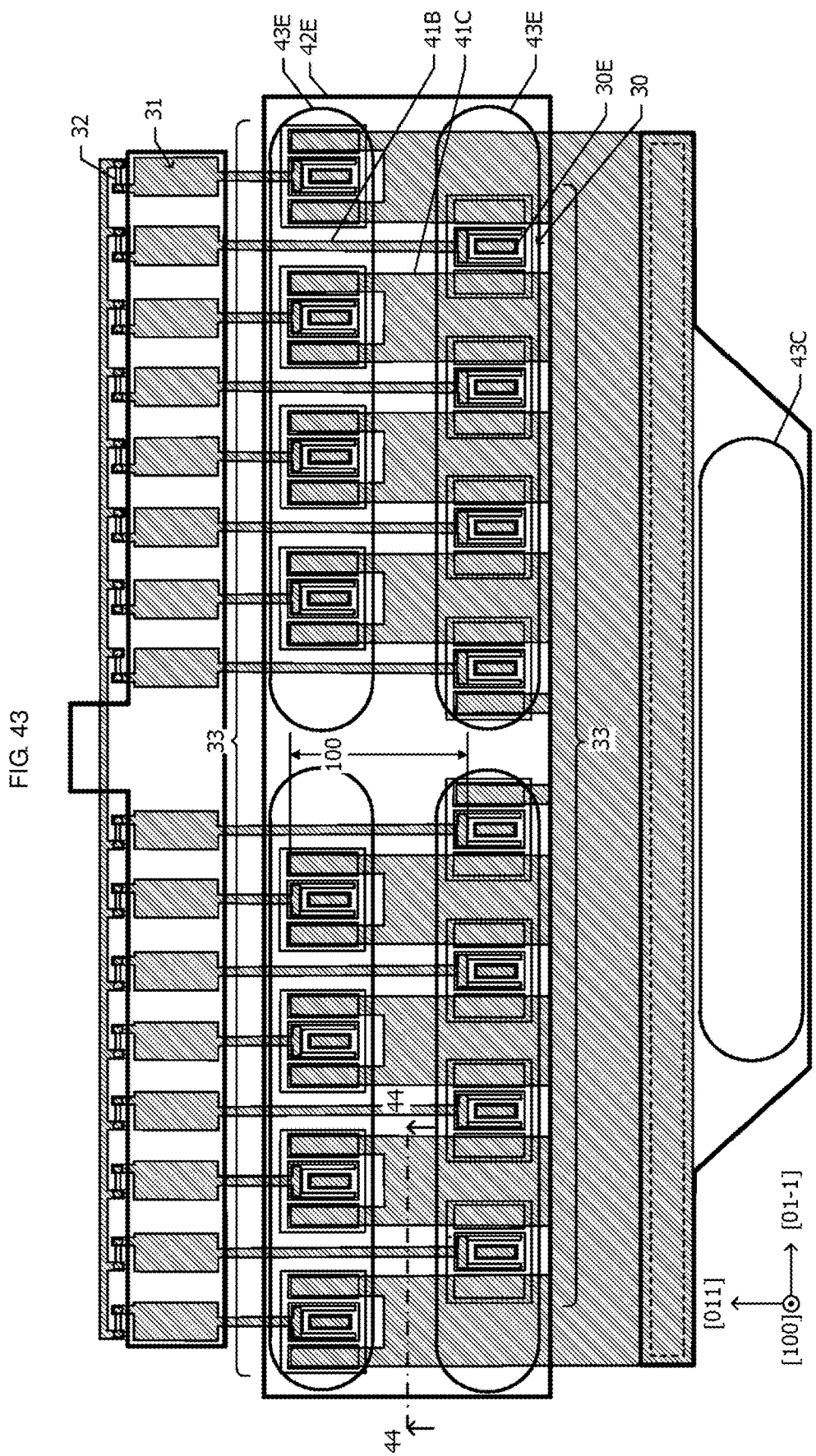
FIG. 43 is a diagram illustrating the disposition in plan view of a plurality of transistor cells, input capacitance elements, base ballast resistance elements, wiring lines, bumps, and so forth that constitute an amplifying circuit of a semiconductor device according to a twentieth embodiment.

FIG. 43 is a diagram illustrating the disposition in plan view of the plurality of transistor cells 30, the input capacitance elements 31, the base ballast resistance elements 32, the wiring lines, the bumps, and so forth that constitute an amplifying circuit of the semiconductor device according to the twentieth embodiment. In the nineteenth embodiment (FIG. 38), as in the eighteenth embodiment (FIG. 35A), the emitter wiring line 47E in the third layer is disposed between the emitter wiring line 42E in the second layer and the emitter bump 43E. In contrast to this, in the twentieth embodiment, the emitter wiring line in the third layer is not disposed, and the emitter bump 43E is in direct contact with the emitter wiring line 42E in the second layer, as in the first embodiment (FIG. 2B).

Figure 44:
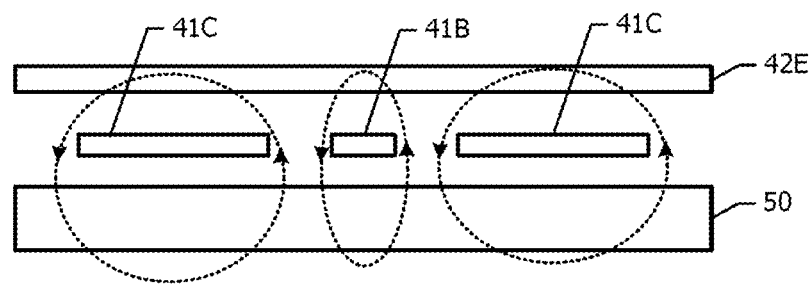
FIG. 44 is a schematic cross-sectional view taken along a chain line 44-44 in FIG. 43.

FIG. 44 is a schematic cross-sectional view taken along a chain line 44-44 in FIG. 43. In the twentieth embodiment, as in the nineteenth embodiment (FIG. 39), the emitter wiring line 42E in the second layer is disposed above the base extended wiring line 41B and the collector extended wiring lines 41C. The emitter wiring line 47E in the third layer (FIG. 39) is not disposed.

Next, an excellent effect of the twentieth embodiment will be described.

In the twentieth embodiment, as in the nineteenth embodiment, an effect of reducing the area of a region occupied by the amplifying circuit on the substrate, and an effect of reducing the thermal resistance of a heat radiation path from the transistor cells 30 can be obtained. Furthermore, because the emitter wiring line 42E in the second layer is disposed above the base extended wiring line 41B and the collector extended wiring lines 41C as illustrated in FIG. 44, an effect of reducing a magnetic interaction that can occur between the base extended wiring line 41B and the collector extended wiring line 41C, and an effect of reducing the parasitic inductance of the base extended wiring line 41B and the collector extended wiring line 41C are greater than in the eighteenth embodiment, as in the nineteenth embodiment (FIG. 39).

Next, modification examples of the twentieth embodiment will be described with reference to FIGS. 45, 46, and 47.

Figure 45:
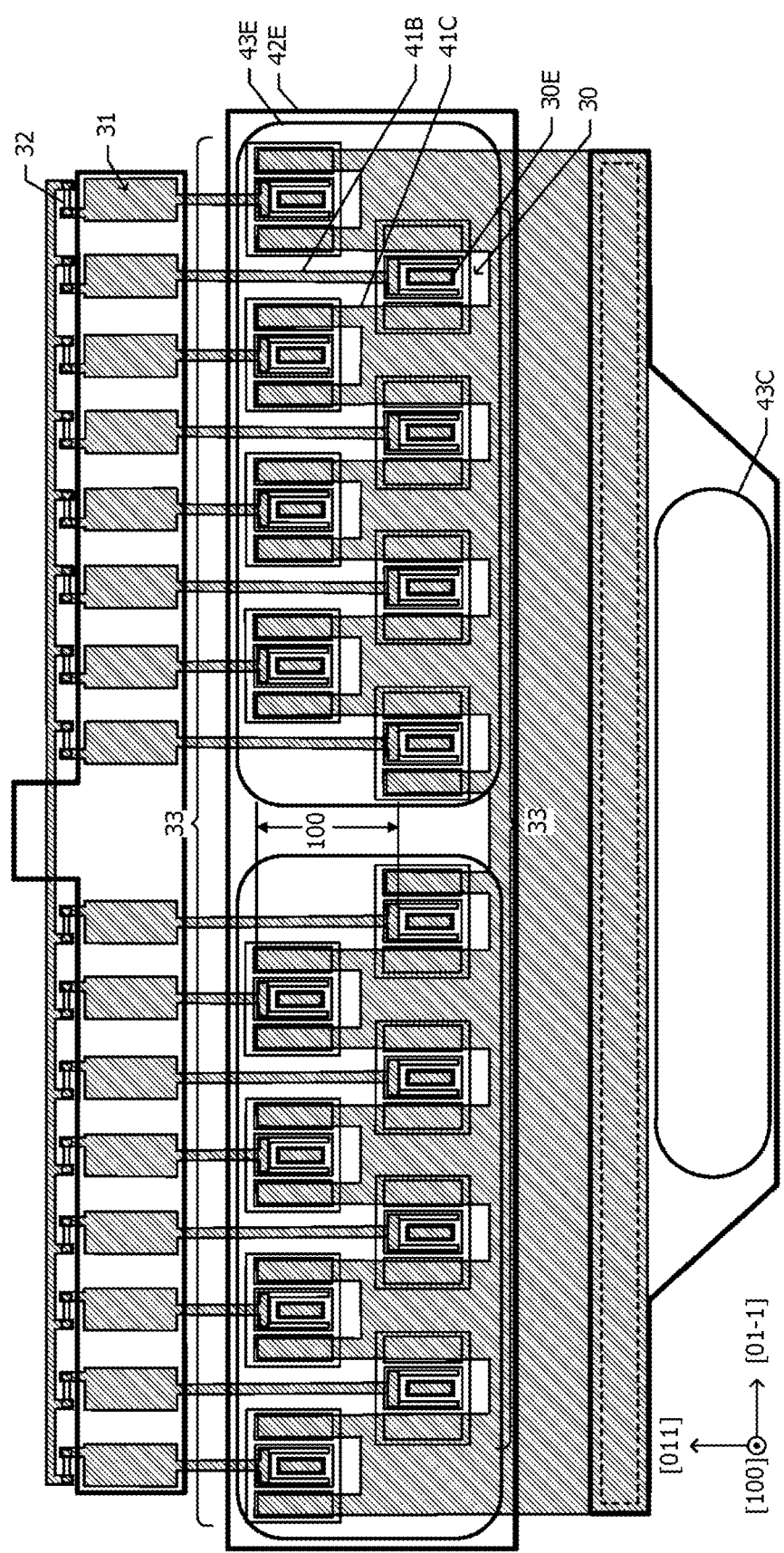
FIG. 45 is a diagram illustrating the disposition in plan view of a plurality of transistor cells, input capacitance elements, base ballast resistance elements, wiring lines, bumps, and so forth that constitute an amplifying circuit of a semiconductor device according to a modification example of the twentieth embodiment.
Figure 46:
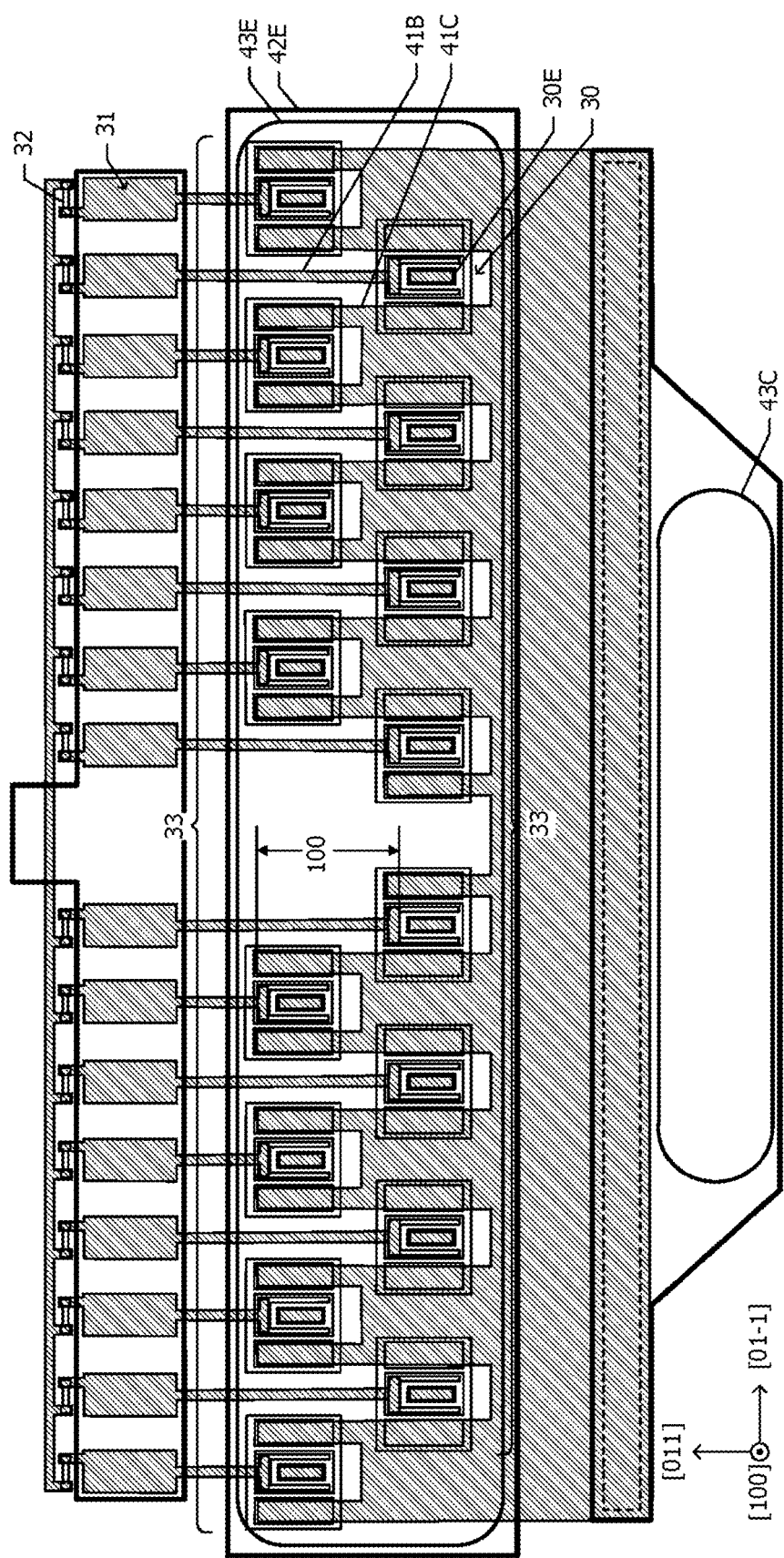
FIG. 46 is a diagram illustrating the disposition in plan view of a plurality of transistor cells, input capacitance elements, base ballast resistance elements, wiring lines, bumps, and so forth that constitute an amplifying circuit of a semiconductor device according to another modification example of the twentieth embodiment.
Figure 47:
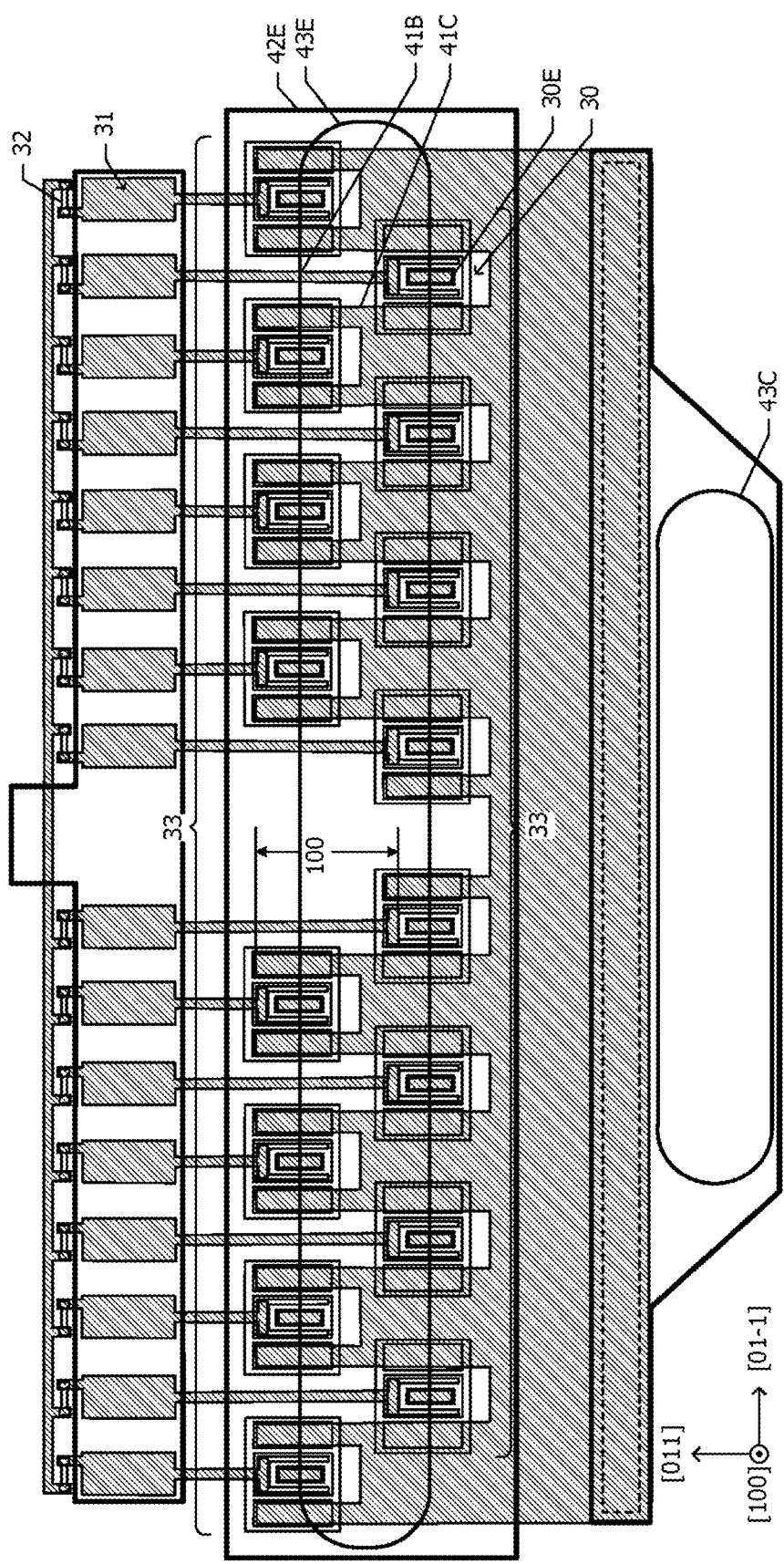
FIG. 47 is a diagram illustrating the disposition in plan view of a plurality of transistor cells, input capacitance elements, base ballast resistance elements, wiring lines, bumps, and so forth that constitute an amplifying circuit of a semiconductor device according to still another modification example of the twentieth embodiment.

FIGS. 45, 46, and 47 are diagrams each illustrating the disposition in plan view of the plurality of transistor cells 30, the input capacitance elements 31, the base ballast resistance elements 32, the wiring lines, the bumps, and so forth that constitute an amplifying circuit of a semiconductor device according to a modification example of the twentieth embodiment.

In the modification examples illustrated in FIGS. 45, 46, and 47, the disposition of the emitter bumps 43E or the emitter bump 43E is identical to the disposition of the emitter bumps 43E or the emitter bump 43E of the semiconductor devices according to the modification examples of the nineteenth embodiment illustrated in FIGS. 40, 41, and 42, respectively. In the modification examples illustrated in FIGS. 45, 46, and 47, the distance between the two cell rows 33 is shorter than in the twentieth embodiment (FIG. 43). Thus, as in the modification examples of the nineteenth embodiment illustrated in FIGS. 40, 41, and 42, an effect of reducing a magnetic interaction that can occur between the base extended wiring line 41B and the collector extended wiring line 41C, and an effect of reducing the parasitic inductance of the base extended wiring line 41B and the collector extended wiring line 41C are greater than in the twentieth embodiment.

The modification example illustrated in FIG. 47 is advantageous from the viewpoint of the stress applied to the transistor cells 30, and the modification examples illustrated in FIGS. 45 and 46 are advantageous from the viewpoint of heat radiation. Thus, according to additional embodiments, the following are provided.

(1) A semiconductor device including a substrate; and two cell rows, each of which is formed of a plurality of transistor cells aligned in parallel to each other. Each of the plurality of transistor cells includes a collector region, a base region, and an emitter region that are disposed on the substrate. The semiconductor device further includes a plurality of collector extended wiring lines, each of which is connected to the collector region of a corresponding one of the plurality of transistor cells, and that are extended in a direction intersecting an alignment direction of the plurality of transistor cells; a collector integrated wiring line that connects the plurality of collector extended wiring lines to each other; and a collector intermediate integrated wiring line that is disposed between the two cell rows in plan view and that connects the plurality of collector extended wring lines extended from the plurality of transistor cells that belong to one of the two cell rows to each other.

(2) The semiconductor device according to (1), further includes an emitter wiring line disposed in a layer in which the collector intermediate integrated wiring line is disposed. The emitter wiring line includes intra-cell-row connection portions each of which is disposed corresponding to one of the two cell rows, and inter-cell-row connection portions that connect the intra-cell-row connection portions to each other. Each of the intra-cell-row connection portions is connected to the emitter regions of the plurality of transistor cells in a corresponding one of the cell rows.

(3) The semiconductor device according to (1) or (2), further includes at least one emitter bump for one of the two cell rows and at least one emitter bump for another one of the two cell rows. Each at least one emitter bump partially overlaps the plurality of transistor cells in a corresponding one of the cell rows in plan view. The at least one emitter bump is connected to the emitter regions of the plurality of transistor cells in the corresponding cell row.

(4) The semiconductor device according to (3), wherein the at least one emitter bump corresponding to at least one of the two cell rows includes a plurality of emitter bumps separated from each other in the alignment direction.

(5) The semiconductor device according to (3) or (4), wherein the number of transistor cells connected to the at least one emitter bump corresponding to one of the two cell rows is equal to the number of transistor cells connected to the at least one emitter bump corresponding to another one of the two cell rows. Also, the emitter bump corresponding to the one cell row and the emitter bump corresponding to the other cell row include an overlapping portion at which both the emitter bumps overlap each other in the alignment direction, and the emitter bump corresponding to the one cell row and the emitter bump corresponding to the other cell row extend in directions opposite to each other from the overlapping portion.

(6) The semiconductor device according to (4), wherein the two cell rows have different lengths, and the plurality of emitter bumps separated from each other in the alignment direction are disposed corresponding to a longer one of the two cell rows. Also, the at least one emitter bump is disposed corresponding to a shorter one of the two cell rows, and the at least one emitter bump is a single emitter bump.

(7) The semiconductor device according to any one of (1) to (6), wherein the collector integrated wiring line is disposed across one of the two cell rows from another one of the two cell rows in plan view, and the plurality of collector extended wiring lines extended from the plurality of transistor cells in a cell row farther from the collector integrated wiring line of the two cell rows cross a region between the two cell rows to be connected to the collector integrated wiring line and connected to each other by the collector intermediate integrated wiring line.

(8) The semiconductor device according to (7), further including at least one input capacitance element that is disposed across the two cell rows from the collector integrated wiring line and that is connected to the base regions of the plurality of transistor cells.

(9) The semiconductor device according to (8), wherein the at least one input capacitance element includes a plurality of input capacitance elements each of which is disposed corresponding to one of the plurality of transistor cells and that are disposed in one row in the alignment direction.

(10) The semiconductor device according to (8), wherein the at least one input capacitance element includes a plurality of input capacitance elements each of which is disposed corresponding to one of inter-row pairs and that are disposed in one row in the alignment direction, each of the inter-row pairs being formed of one of the plurality of transistor cells in one of the two cell rows and one of the plurality of transistor cells in another one of the two cell rows.

(11) The semiconductor device according to (8), wherein the at least one input capacitance element includes one input capacitance element that is disposed corresponding to all the transistor cells in the two cell rows.

(12) The semiconductor device according to (8), wherein at least some of the plurality of transistor cells in one of the two cell rows and at least some of the plurality of transistor cells in another one of the two cell rows are aligned in a staggered manner in the alignment direction in units of basic units. Each of the basic units are formed of two or more adjacent transistor cells among the plurality of transistor cells in an identical cell row. Also, the at least one input capacitance element includes a plurality of input capacitance elements each of which is disposed corresponding to one of the basic units and that are disposed in one row in the alignment direction.

(13) The semiconductor device according to (7) or (8), wherein at least some of the plurality of transistor cells in one of the two cell rows and at least some of the plurality of transistor cells in another one of the two cell rows are aligned in a staggered manner in the alignment direction in units of basic units. Each of the basic units are formed of two or more adjacent transistor cells among the plurality of transistor cells in a single or identical cell row. Also, the plurality of collector extended wiring lines extended from the plurality of transistor cells in the cell row farther from the collector integrated wiring line of the two cell rows pass through regions between the plurality of transistor cells in a cell row nearer to the collector integrated wiring line of the two cell rows or regions outside transistor cells at both ends of the cell row nearer to the collector integrated wiring line and are connected to the collector integrated wiring line.

(14) The semiconductor device according to (7), wherein the plurality of transistor cells in one of the two cell rows are disposed at positions corresponding to positions of the plurality of transistor cells in another one of the two cell rows in the alignment direction, and each of the plurality of collector extended wiring lines is shared between two transistor cells disposed at positions corresponding to each other in the alignment direction.

(15) The semiconductor device according to (14), wherein each of the plurality of collector extended wiring lines is disposed between and shared between two transistor cells adjacent to each other in the alignment direction among the plurality of transistor cells.

(16) The semiconductor device according to (14) or (15), further including a plurality of base extended wiring lines each of which is connected to the base region of a corresponding one of the plurality of transistor cells, is extended from the corresponding transistor cell in a direction away from a corresponding one of the plurality of collector extended wiring lines, and extends in a direction orthogonal to the alignment direction. Each of the plurality of base extended wiring lines has a portion that extends in the direction orthogonal to the alignment direction and that is shared between the two transistor cells disposed at the positions corresponding to each other in the alignment direction.

(17) The semiconductor device according to (16), wherein two transistor cells adjacent to each other in the alignment direction among the plurality of transistor cells have a mirror-symmetry positional relationship among the transistor cells, corresponding collector extended wiring lines among the plurality of collector extended wiring lines, and corresponding base extended wiring lines among the plurality of base extended wiring lines in the alignment direction. Also, the portion that extends in the direction orthogonal to the alignment direction of the base extended wiring line is shared between the two transistor cells.

(18) The semiconductor device according to any one of (1) to (17), further including a collector electrode, a base electrode, and an emitter electrode that are connected to the collector region, the base region, and the emitter region of each of the plurality of transistor cells, respectively. In each of the plurality of transistor cells, the collector electrode, the base electrode, and the emitter electrode are disposed in order of the collector electrode, the base electrode, and the emitter electrode or in order of the collector electrode, the emitter electrode, and the base electrode in the alignment direction. Also, the collector electrodes of the plurality of transistor cells are connected to the plurality of collector extended wiring lines.

(19) The semiconductor device according to (18), wherein in two transistor cells adjacent to each other in the alignment direction among the plurality of transistor cells, arrangement orders of the collector electrode, the base electrode, and the emitter electrode are reverse to each other, the collector electrode is located on an inner side of the emitter electrode and the base electrode, and the collector electrode is shared between the two transistor cells.

(20) The semiconductor device according to (19), wherein in the two transistor cells adjacent to each other in the alignment direction, a distance between two emitter electrodes between which the collector electrode is present is a first distance, and a distance between two emitter electrodes between which the collector electrode is absent is a second distance, a shorter one of the first distance and the second distance being about ½ or more of a longer one of the first distance and the second distance.

(21) The semiconductor device according to (19), wherein the emitter electrodes of the plurality of transistor cells are disposed at equal intervals in the alignment direction.

(22) An amplifier module including a semiconductor device; and a module substrate on which the semiconductor device is mounted. The semiconductor device includes a substrate; and two cell rows, each of which is formed of a plurality of transistor cells aligned in parallel to each other. Each of the plurality of transistor cells includes a collector region, a base region, and an emitter region that are disposed on the substrate. The semiconductor device further includes a plurality of collector extended wiring lines, each of which is connected to the collector region of a corresponding one of the plurality of transistor cells, and that are extended in a direction intersecting an alignment direction of the plurality of transistor cells; a collector integrated wiring line that connects the plurality of collector extended wiring lines to each other; a collector intermediate integrated wiring line that is disposed between the two cell rows in plan view and that connects the plurality of collector extended wring lines extended from the plurality of transistor cells that belong to one of the two cell rows to each other; and at least one emitter bump disposed for one of the two cell rows and at least one emitter bump disposed for another one of the two cell rows. The module substrate includes a ground conductor connected to the emitter bumps of the semiconductor device, and a via conductor that extends from the ground conductor in a thickness direction and reaches a surface opposite to a surface provided with the ground conductor.

(23) A semiconductor device includes a substrate; and two cell rows, each of which is formed of a plurality of transistor cells aligned in parallel to each other, each of the plurality of transistor cells including a collector region, a base region, and an emitter region that are disposed on the substrate. The semiconductor device further includes a plurality of collector extended wiring lines, each of which is connected to the collector region of a corresponding one of the plurality of transistor cells, and that are extended to an outside of one of the two cell rows in a direction orthogonal to an alignment direction of the plurality of transistor cells; a plurality of base extended wiring lines, each of which is connected to the base region of a corresponding one of the plurality of transistor cells, and that are extended to an outside of another one of the two cell rows in a direction that is orthogonal to the alignment direction of the plurality of transistor cells and that is opposite to the direction in which the plurality of collector extended wiring lines are extended; and an emitter wiring line that is disposed in a wiring layer above the plurality of base extended wiring lines and the plurality of collector extended wiring lines and that is connected to the emitter regions. The plurality of base extended wiring lines and the plurality of collector extended wiring lines that are adjacent to each other in the alignment direction of the plurality of transistor cells each have a portion. The portions are disposed at positions corresponding to each other in the direction orthogonal to the alignment direction of the plurality of transistor cells and being included in the emitter wiring line in plan view.

(24) The semiconductor device according to (23), wherein the emitter regions of the plurality of transistor cells are included in the emitter wiring line in plan view.

(25) The semiconductor device according to (23) or (24), further includes at least one emitter bump disposed on the emitter wiring line. The emitter bump is disposed, in the direction orthogonal to the alignment direction of the plurality of transistor cells, over a range from the emitter regions of the plurality of transistor cells in one of the two cell rows to the emitter regions of the plurality of transistor cells in another one of the two cell rows.

(26) The semiconductor device according to any one of (23) to (25), further includes a collector intermediate integrated wiring line that is disposed between the two cell rows in plan view and that connects to each other the plurality of collector extended wring lines extended from the plurality of transistor cells in one of the two cell rows and passing between the two cells rows. The emitter wiring line is disposed in a wiring layer above the collector intermediate integrated wiring line.

The above-described embodiments are examples, and it is obviously possible to partially replace or combine components of different embodiments. Similar functions and effects of similar configurations of a plurality of embodiments are not described for each embodiment. Furthermore, the present disclosure is not limited to the above-described embodiments. For example, it is obvious to those skilled in the art that various changes, improvements, combinations, or the like are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a substrate;
   two cell rows, each of which is formed of a plurality of transistor cells aligned in parallel to each other, each of the plurality of transistor cells including a collector region, a base region, and an emitter region that are disposed above the substrate;
   a plurality of collector extended wiring lines, each of which is connected to the collector region of a corresponding one of the plurality of transistor cells, and that are extended in a direction intersecting an alignment direction of the plurality of transistor cells;
   a collector integrated wiring line that connects the plurality of collector extended wiring lines to each other; and
   a collector intermediate integrated wiring line that is disposed between the two cell rows in plan view and that connects the plurality of collector extended wring lines extended from the plurality of transistor cells that belong to one of the two cell rows to each other.

2. The semiconductor device according to claim 1, further comprising:
an emitter wiring line disposed in a layer in which the collector intermediate integrated wiring line is disposed, wherein
the emitter wiring line includes intra-cell-row connection portions, each of which is disposed corresponding to one of the two cell rows, and inter-cell-row connection portions that connect the intra-cell-row connection portions to each other, each of the intra-cell-row connection portions being connected to the emitter regions of the plurality of transistor cells in a corresponding one of the cell rows.

3. The semiconductor device according to claim 1, further comprising:
at least one emitter bump for one of the two cell rows and at least one emitter bump for another one of the two cell rows, each at least one emitter bump partially overlapping the plurality of transistor cells in a corresponding one of the cell rows in plan view, wherein
the at least one emitter bump is connected to the emitter regions of the plurality of transistor cells in the corresponding cell row.

4. The semiconductor device according to claim 3, wherein
the at least one emitter bump corresponding to at least one of the two cell rows includes a plurality of emitter bumps separated from each other in the alignment direction.

5. The semiconductor device according to claim 1, wherein
the collector integrated wiring line is disposed across one of the two cell rows from another one of the two cell rows in plan view, and
the plurality of collector extended wiring lines extended from the plurality of transistor cells in a cell row farther from the collector integrated wiring line of the two cell rows cross a region between the two cell rows to be connected to the collector integrated wiring line and connected to each other by the collector intermediate integrated wiring line.

6. The semiconductor device according to claim 5, further comprising:
at least one input capacitance element that is disposed across the two cell rows from the collector integrated wiring line and that is connected to the base regions of the plurality of transistor cells.

7. The semiconductor device according to claim 6, wherein
the at least one input capacitance element includes a plurality of input capacitance elements, each of which is disposed corresponding to one of the plurality of transistor cells and that are disposed in one row in the alignment direction.

8. The semiconductor device according to claim 6, wherein
the at least one input capacitance element includes a plurality of input capacitance elements, each of which is disposed corresponding to one of inter-row pairs and that are disposed in one row in the alignment direction, each of the inter-row pairs being formed of one of the plurality of transistor cells in one of the two cell rows and one of the plurality of transistor cells in another one of the two cell rows.

9. The semiconductor device according to claim 6, wherein
the at least one input capacitance element includes one input capacitance element that is disposed corresponding to all the transistor cells in the two cell rows.

10. The semiconductor device according to claim 5, wherein
at least some of the plurality of transistor cells in one of the two cell rows and at least some of the plurality of transistor cells in another one of the two cell rows are aligned in a staggered manner in the alignment direction in units of basic units, each of the basic units being formed of two or more adjacent transistor cells among the plurality of transistor cells in a single or identical cell row, and
the plurality of collector extended wiring lines extended from the plurality of transistor cells in the cell row farther from the collector integrated wiring line of the two cell rows pass through regions between the plurality of transistor cells in a cell row nearer to the collector integrated wiring line of the two cell rows or regions outside transistor cells at both ends of the cell row nearer to the collector integrated wiring line and are connected to the collector integrated wiring line.

11. The semiconductor device according to claim 5, wherein
the plurality of transistor cells in one of the two cell rows are disposed at positions corresponding to positions of the plurality of transistor cells in another one of the two cell rows in the alignment direction, and
each of the plurality of collector extended wiring lines is shared between two transistor cells disposed at positions corresponding to each other in the alignment direction.

12. The semiconductor device according to claim 11, wherein each of the plurality of collector extended wiring lines is disposed between and shared between two transistor cells adjacent to each other in the alignment direction among the plurality of transistor cells.

13. The semiconductor device according to claim 11, further comprising:
a plurality of base extended wiring lines, each of which is connected to the base region of a corresponding one of the plurality of transistor cells, is extended from the corresponding transistor cell in a direction away from a corresponding one of the plurality of collector extended wiring lines, and extends in a direction orthogonal to the alignment direction, wherein
each of the plurality of base extended wiring lines has a portion that extends in the direction orthogonal to the alignment direction and that is shared between the two transistor cells disposed at the positions corresponding to each other in the alignment direction.

14. The semiconductor device according to claim 1, further comprising:
a collector electrode, a base electrode, and an emitter electrode that are connected to the collector region, the base region, and the emitter region of each of the plurality of transistor cells, respectively, wherein
in each of the plurality of transistor cells, the collector electrode, the base electrode, and the emitter electrode are disposed in order of the collector electrode, the base electrode, and the emitter electrode or in order of the collector electrode, the emitter electrode, and the base electrode in the alignment direction, and the collector electrodes of the plurality of transistor cells are connected to the plurality of collector extended wiring lines.

15. The semiconductor device according to claim 14, wherein
in two transistor cells adjacent to each other in the alignment direction among the plurality of transistor cells,
arrangement orders of the collector electrode, the base electrode, and the emitter electrode are reverse to each other,
the collector electrode is located on an inner side of the emitter electrode and the base electrode, and
the collector electrode is shared between the two transistor cells.

16. The semiconductor device according to claim 15, wherein
in the two transistor cells adjacent to each other in the alignment direction, a distance between two emitter electrodes between which the collector electrode is present is a first distance, and a distance between two emitter electrodes between which the collector electrode is absent is a second distance, a shorter one of the first distance and the second distance being about ½ or more of a longer one of the first distance and the second distance.

17. An amplifier module comprising:
a semiconductor device; and
a module substrate on which the semiconductor device is mounted,
the semiconductor device including
a substrate,
two cell rows, each of which is formed of a plurality of transistor cells aligned in parallel to each other, each of the plurality of transistor cells including a collector region, a base region, and an emitter region that are disposed above the substrate,
a plurality of collector extended wiring lines, each of which is connected to the collector region of a corresponding one of the plurality of transistor cells, and that are extended in a direction intersecting an alignment direction of the plurality of transistor cells,
a collector integrated wiring line that connects the plurality of collector extended wiring lines to each other,
a collector intermediate integrated wiring line that is disposed between the two cell rows in plan view and that connects the plurality of collector extended wring lines extended from the plurality of transistor cells that belong to one of the two cell rows to each other, and
at least one emitter bump disposed for one of the two cell rows and at least one emitter bump disposed for another one of the two cell rows,
the module substrate including
a ground conductor connected to the emitter bumps of the semiconductor device, and
a via conductor that extends from the ground conductor in a thickness direction and reaches a surface opposite to a surface provided with the ground conductor.

18. A semiconductor device comprising:
a substrate;
two cell rows, each of which is formed of a plurality of transistor cells aligned in parallel to each other, each of the plurality of transistor cells including a collector region, a base region, and an emitter region that are disposed on the substrate;
a plurality of collector extended wiring lines, each of which is connected to the collector region of a corresponding one of the plurality of transistor cells, and that are extended to an outside of one of the two cell rows in a direction orthogonal to an alignment direction of the plurality of transistor cells;
a plurality of base extended wiring lines, each of which is connected to the base region of a corresponding one of the plurality of transistor cells, and that are extended to an outside of another one of the two cell rows in a direction that is orthogonal to the alignment direction of the plurality of transistor cells and that is opposite to the direction in which the plurality of collector extended wiring lines are extended; and
an emitter wiring line that is disposed in a wiring layer above the plurality of base extended wiring lines and the plurality of collector extended wiring lines and that is connected to the emitter regions, wherein
the plurality of base extended wiring lines and the plurality of collector extended wiring lines that are adjacent to each other in the alignment direction of the plurality of transistor cells each have a portion, the portions being disposed at positions corresponding to each other in the direction orthogonal to the alignment direction of the plurality of transistor cells and being included in the emitter wiring line in plan view.

19. The semiconductor device according to claim 18, wherein
the emitter regions of the plurality of transistor cells are included in the emitter wiring line in plan view.

20. The semiconductor device according to claim 18, further comprising:
at least one emitter bump disposed on the emitter wiring line, wherein
the emitter bump is disposed, in the direction orthogonal to the alignment direction of the plurality of transistor cells, over a range from the emitter regions of the plurality of transistor cells in one of the two cell rows to the emitter regions of the plurality of transistor cells in another one of the two cell rows.

* * * * *